United States Patent
Ishizu et al.

(10) Patent No.: US 9,748,274 B2
(45) Date of Patent: Aug. 29, 2017

(54) MEMORY DEVICE COMPRISING STACKED MEMORY CELLS AND ELECTRONIC DEVICE INCLUDING THE SAME

(71) Applicant: Semiconductor Energy Laboratory Co., Ltd., Atsugi-shi, Kanagawa-ken (JP)

(72) Inventors: Takahiko Ishizu, Kanagawa (JP); Shuhei Nagatsuka, Kanagawa (JP); Tatsuya Onuki, Kanagawa (JP); Yutaka Shionoiri, Kanagawa (JP); Naoaki Tsutsui, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/160,076

(22) Filed: May 20, 2016

(65) Prior Publication Data

US 2016/0351243 A1 Dec. 1, 2016

(30) Foreign Application Priority Data

May 26, 2015 (JP) ................................. 2015-106784

(51) Int. Cl.
*G11C 11/401* (2006.01)
*H01L 27/12* (2006.01)
(Continued)

(52) U.S. Cl.
CPC .......... *H01L 27/1207* (2013.01); *G11C 5/063* (2013.01); *G11C 11/401* (2013.01);
(Continued)

(58) Field of Classification Search
CPC ....... G11C 17/16; G11C 17/18; G11C 7/1006; G11C 29/76; G11C 2211/5646; G11C 2211/5647
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technolgy, 2003, vol. 26, pp. 181-184.
(Continued)

*Primary Examiner* — Khamdan Alrobaie
(74) *Attorney, Agent, or Firm* — Fish & Richardson P.C.

(57) ABSTRACT

A memory device in which the number of films is reduced. The memory device includes a circuit and a wiring. The circuit includes a first memory cell and a second memory cell. The first memory cell includes a first transistor, a second transistor, and a first capacitor. The second memory cell includes a third transistor, a fourth transistor, and a second capacitor. The second memory cell is stacked over the first memory cell. One of a source and a drain of the first transistor is electrically connected to a gate of the second transistor and the first capacitor. One of a source and a drain of the third transistor is electrically connected to a gate of the fourth transistor and the second capacitor. A gate of the first (Continued)

transistor and a gate of the third transistor are electrically connected to the wiring.

15 Claims, 36 Drawing Sheets

(51) Int. Cl.
    *G11C 5/06*               (2006.01)
    *G11C 11/4097*         (2006.01)
    *G11C 29/04*            (2006.01)
    *H01L 27/108*          (2006.01)
    *H01L 27/1156*        (2017.01)

(52) U.S. Cl.
    CPC ...... *H01L 27/1225* (2013.01); *H01L 27/1255* (2013.01); *G11C 11/4097* (2013.01); *G11C 2029/0403* (2013.01); *H01L 27/108* (2013.01); *H01L 27/1156* (2013.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,787,825 B1 | 9/2004 | Gudesen et al. | |
| 6,841,813 B2 | 1/2005 | Walker et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,129,538 B2 | 10/2006 | Lee et al. | |
| 7,190,602 B2 | 3/2007 | Johnson et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,889,538 B2 | 2/2011 | Toda | |
| 7,939,890 B2 | 5/2011 | Yamauchi | |
| 8,008,137 B2 | 8/2011 | Wu et al. | |
| 8,482,974 B2 | 7/2013 | Saito et al. | |
| 8,669,778 B1 | 3/2014 | Or-Bach et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0211535 A1* | 9/2007 | Kim | H01L 27/1052 365/185.21 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0316826 A1 | 12/2008 | Yamauchi | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0200536 A1 | 8/2009 | Van Schaijk et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0314676 A1 | 12/2010 | Akiyama et al. | |
| 2011/0122670 A1* | 5/2011 | Yamazaki | G11C 16/0433 365/72 |
| 2011/0176348 A1* | 7/2011 | Yamazaki | G11C 11/404 365/72 |
| 2011/0176377 A1* | 7/2011 | Koyama | G11C 16/0425 365/200 |
| 2011/0205774 A1* | 8/2011 | Takemura | G11C 16/0408 365/72 |
| 2012/0001243 A1* | 1/2012 | Kato | H01L 27/0688 257/296 |
| 2012/0120715 A1* | 5/2012 | Saito | G11C 5/02 365/149 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-187950 | 9/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: the "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,$YbFe_2O_4$, and $Yb_2Fe_3O_7$ Types of Structures for Compounds in the $In_2O_3$ and $Sc_2O_3$—$A_2O_3$—Bo Systems [A; Fe, Ga, or Al; B: Mg, Mn, Fe, Ni, Cu,or Zn] at Temperatures Over 1000° C.", Journal of Solid State Chemistry, 1995, vol. 60, pp. 382-384.

Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Li.C et al., "Modulated Structures of Homologous Compounds $InMo_3(ZnO)m$ (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350°C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In-Ga-Zn-Oxide TFT", SID Digest '09: SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emmison AM-OLED Display", SID Digest '08: SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09: Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08: SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
H. Tamura et al., "Embedded SRAM and Cortex-M0 Core with Backup Circuits Using a 60-nm Crystalline Oxide Semiconductor for Power Gating,", IEEE COOL Chips XVII Yokohama Joho Bunks Center, Yokohama, Apr. 14-16, 2014.
T. Atsumi et al., "DRAM Using Crystalline Oxide Semiconductor for Access Transistors and not Requiring Refresh for More Than Ten Days,", IMW 2012 (4th IEEE International Memory Workshop).
S. Nagatsuka et al., "A 3bit/cell Nonvolatile Memory with Crystalline In—Ga—Zn—O TFT,", IMW 2013 (5th IEEE International Memory Workshop).
T. Ishizu et al.,"SRAM with C-Axis Aligned Crystalline Oxide Semiconductor: Power Leakage Reduction Technique for Microprocessor Caches,", IMW 2014 (6th IEEE International Memory Workshop).
T. Matsuzaki et al., "A 128kb 4b/cell Nonvolatile Memory with Crystalline In—Ga—Zn Oxide FET Using Vt Cancel Write Method,", ISSCC 2012 (Digest of Technical Papers. IEEE International Solid-State Circuits Conference), pp. 306-308.
T. Ohmaru et al., "Eight-bit CPU with Nonvolatile Registers Capable of Holding Data for 40 Days at 85]C Using Crystalline In—Ga—Zn Oxide Thin Film Transistors,", Extended Abstracts of the 2012 International Conference on Solid State Devices and Materials, Kyoto, 2012, pp. 1144-1145.
Y. Kobayashi et al., "Scaling to 100nm Channel Length of Crystalline In—Ga—Zn—Oxide Thin Film Transistors with Extremely

(56) References Cited

OTHER PUBLICATIONS

Low Off-State Current,", Extended Abstracts of the 2013 International Conference on Solid State Devices and Materials, Fukuoka, 2013,pp. 930-931.

N. Sjokvist, "Zero Area Overhead State Retention Flip Flop Utilizing Crystalline In—Ga—Zn Oxide Thin Film Transistor with Simple Power Control Implemented in a 32-bit CPU,", Extending Abstracts of the 2013 International Conference on Solid State Devices and Materials, Fukuoka, 2013, pp. 1088-1089.

T. Onuki "DRAM with Storage Capacitance of 3.9 fF using CAAC-OS Transistor with L of 60 nm and having More Than 1-h Retention Characteristics,", Extended Abstracts of the 2014 International Conference on Solid State Devices and Materials, Tsukuba, 2014, pp. 430-431.

Y. Yakubo et al., "High-speed and Low-leakage Characteristics of 60-nm C-axis Aligned Crystalline Oxide Semiconductor FET with GHz-ordered Cutoff Frequency,", Extended Abstracts of the 2014 International Conference on Solid State Devices and Materials, Tsukuba, 2014, pp. 648-649.

A. Isobe, "A 32-bit CPU with Zero Standby Power and 1.5-clock Sleep/2.5-clock Wake-up Achieved by Utilizing a 180-nm C-axis Aligned Crystalline In—Ga—Zn Oxide Transistor,", 2014 Symposium on VLSI Circuits Digest of Technical Papers.

H. Kobayashi, "Processor with 4.9-μs. Break-even Time in Power Gating Using Crystalline In—Ga—Zn-Oxide Transistor,", COOL Chips XVI Yokohama Joho Bunka Center, Yokohama, Apr. 17-19, 2013.

Tamura.H et al., "Embedded SRAM and Cortex-M0 Core with Backup Circuits Using a 60-nm Crystalline Oxide Semiconductor for Power Gating", IEEE COOL CHIPS XVII, Apr. 14, 2014, p. 3pages.

Atsumi.T et al., "DRAM Using Crystalline Oxide Semiconductor for Access Transistors and Not Requiring Refresh for More Than Ten Days", IMW 2012 (4th IEEE International Memory Workshop), 2012, pp. 90-102, IEEE.

Nagatsuka.S et al., "A 3bit/cell Nonvolatile Memory with Crystalline In—Ga—Zn—O TFT", IMW 2013 (5th IEEE International Memory Workshop), May 26, 2013, pp. 188-191.

Ishizu.T et al., "SRAM with C-Axis Aligned Crystalline Oxide Semiconductor: Power Leakage Reduction Technique for Microprocessor Caches", IMW 2014 (6th IEEE International Memory Workshop), May 18, 2014, pp. 103-106.

Isobe.A et al., "A 32-bit CPU with Zero Standby Power and 1.5-clock Sleep/2.5-clock Wake-up Achieved by Utilizing a 180-nm C-axis Aligned In—Ga—Zn Oxide Transistor", 2014 Symposium on VLSI Circuits Digest of Technical Papers, Jun. 10, 2014, pp. 49-50.

Kobayashi.H et al., "Processor with 4.9-μs. break-even time in power gating using crystalline In—Ga—Zn-oxide transistor", COOL CHIPS XVI, Apr. 17, 2013, pp. 1-3.

* cited by examiner

FIG. 17A
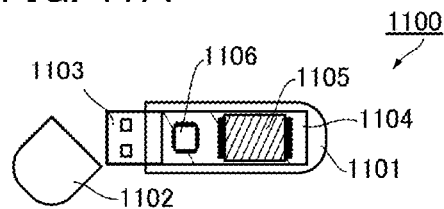
FIG. 17B
FIG. 17C
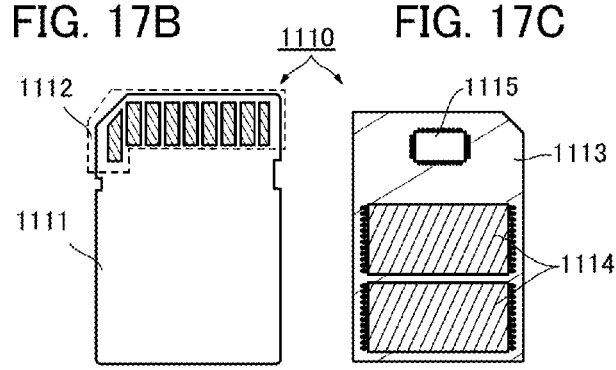
FIG. 17D
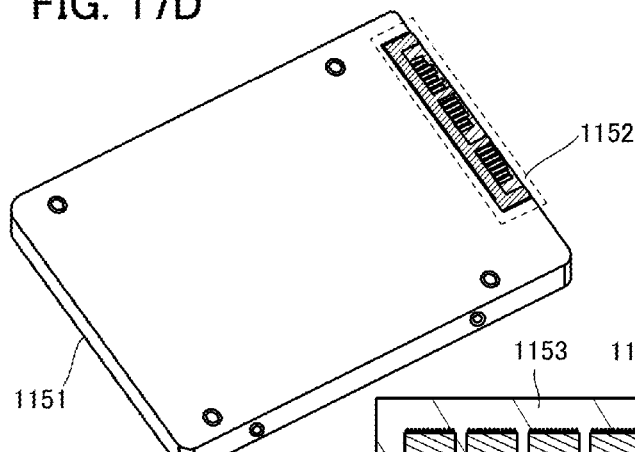
FIG. 17E
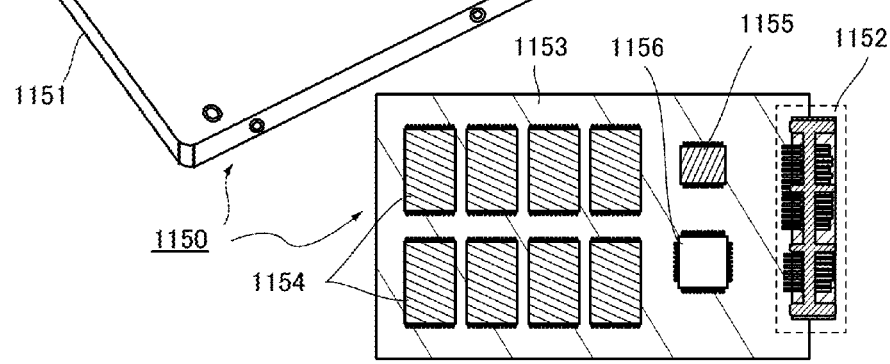

FIG. 30A
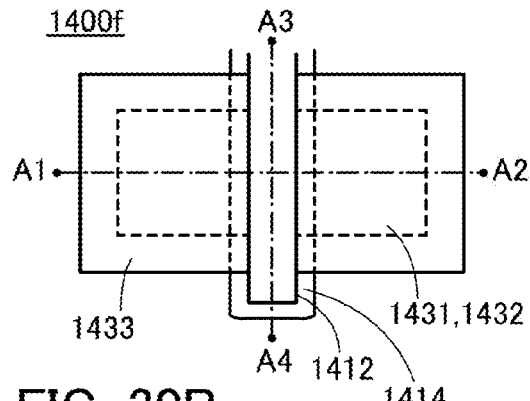
FIG. 30B
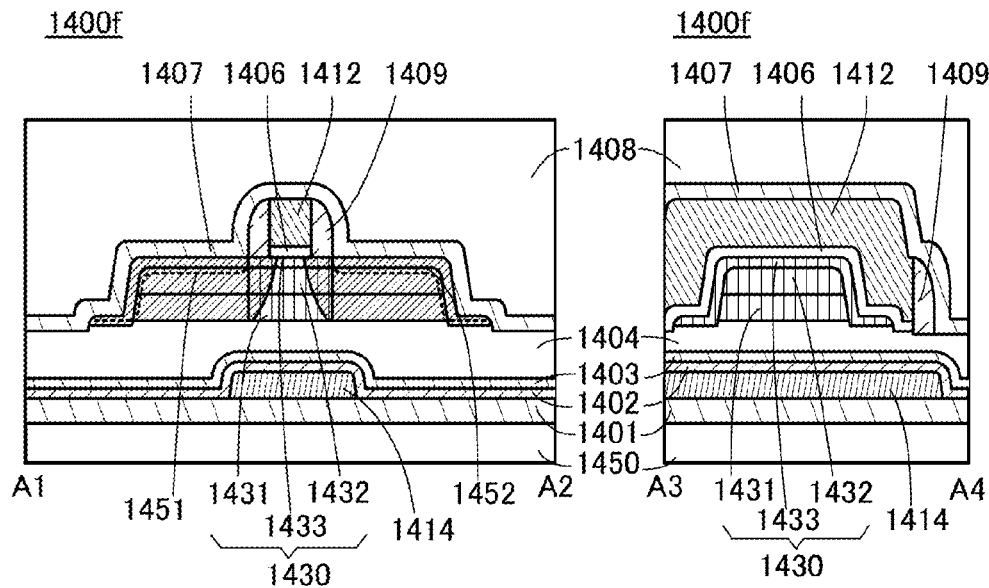
FIG. 30C
FIG. 30D
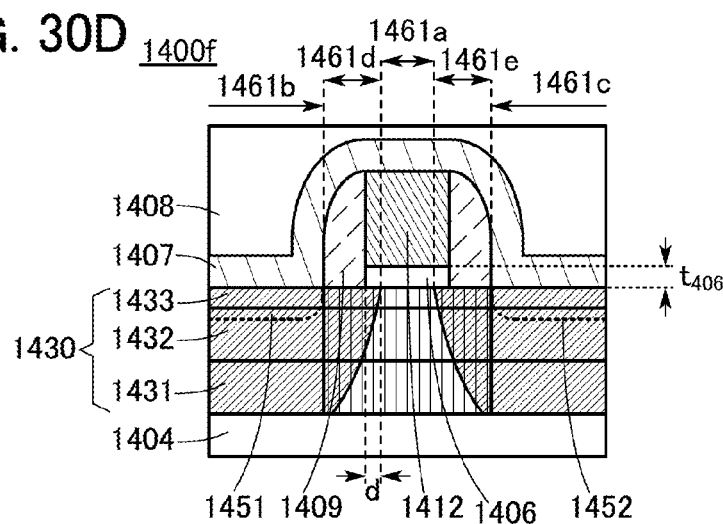

MEMORY DEVICE COMPRISING STACKED MEMORY CELLS AND ELECTRONIC DEVICE INCLUDING THE SAME

BACKGROUND OF THE INVENTION

1. Field of the Invention

One embodiment of the present invention relates to a memory device or an electronic device including the memory device.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In recent years, semiconductor devices such as central processing units (CPUs), memories, and sensors have been used in various electronic devices such as personal computers, smart phones, and digital cameras. The semiconductor devices have been improved to achieve miniaturization, lower power consumption, and other various objectives.

Specifically, electronic devices have been downsized, and as a result, miniaturization of semiconductor devices included in electronic devices has been demanded. In the case of a memory device, for example, a three-dimensional structure (a stacked-layer structure) is employed for a memory cell or a multi-level memory cell is used in the memory device.

It has been proposed that a transistor whose channel formation region is formed using an oxide semiconductor (hereinafter also referred to as an oxide semiconductor transistor or an OS transistor) is employed as a write transistor in such a memory cell. For example, Patent Document 1 discloses a memory cell that can retain data even in the situation in which electric power is not supplied, by including the OS transistor as a write transistor. A memory including an OS transistor can be used as a nonvolatile memory.

REFERENCE

Patent Document

[Patent Document 1] Japanese Published Patent Application No. 2011-187950

Non-Patent Document

[Non-Patent Document 1] T. Ohmaru, et al., "Eight-bit CPU with Nonvolatile Registers Capable of Holding Data for 40 Days at 85° C. Using Crystalline In—Ga—Zn Oxide Thin Film Transistors," Ext. Abstr. Solid-State Devices and Materials, 2012, pp. 1144-1145.

[Non-Patent Document 2] H. Kobayashi et al., "Processor with 4.9-μs break-even time in power gating using crystalline In—Ga—Zn-oxide transistor," Cool Chips XVI, Session VI, 2013.

[Non-Patent Document 3] S. Niclas et al., "Zero Area Overhead State Retention Flip Flop Utilizing Crystalline In—Ga—Zn Oxide Thin Film Transistor with Simple Power Control Implemented in a 32-bit CPU," Ext. Abstr. Solid-State Devices and Materials, 2013, pp. 1088-1089.

[Non-Patent Document 4] H. Tamura et al., "Embedded SRAM and Cortex-M0 Core with Backup Circuits Using a 60-nm Crystalline Oxide Semiconductor for Power Gating," COOL Chips XVII, Session XII, 2014.

[Non-Patent Document 5] A. Isobe et al., "A 32-bit CPU with Zero Standby Power and 1.5-clock Sleep/2.5-clock Wake-up Achieved by Utilizing a 180-nm C-axis Aligned Crystalline In—Ga—Zn Oxide Transistor," IEEE Symp. VLSI circuits, 2014, pp. 49-50.

[Non-Patent Document 6] T. Atsumi et al., "DRAM Using Crystalline Oxide Semiconductor for Access Transistors and not Requiring Refresh for More Than Ten Days," International Memory Workshop, 2012, pp. 99-102.

[Non-Patent Document 7] S. Nagatsuka et al., "A 3bit/cell Nonvolatile Memory with Crystalline In—Ga—Zn—O TFT," International Memory Workshop, 2013, pp. 188-191.

[Non-Patent Document 8] T. Ishizu et al., "SRAM with C-Axis Aligned Crystalline Oxide Semiconductor: Power Leakage Reduction Technique for Microprocessor Caches," International Memory Workshop, 2014, pp. 103-106.

[Non-Patent Document 9] T. Onuki et al., "DRAM with Storage Capacitance of 3.9 fF using CAAC-OS Transistor with L of 60 nm and having More Than 1-h Retention Characteristics," Ext. Abstr. Solid-State Devices and Materials, 2014, pp. 430-431.

[Non-Patent Document 10] T. Matsuzaki et al., "A 128 kb 4 bit/cell nonvolatile memory with crystalline In—Ga—Zn oxide FET using Vt cancel write method," ISSCC Dig. Tech. Papers, pp. 306-307, February, 2015.

[Non-Patent Document 11] Y. Kobayashi et al., "Scaling to 100 nm Channel Length of Crystalline In—Ga—Zn-Oxide Thin Film Transistors with Extremely Low Off-State Current," Ext. Abstr. Solid-State Devices and Materials, 2013, pp. 930-931.

[Non-Patent Document 12] Y. Yakubo et al., "High-speed and Low-leakage Characteristics of 60-nm C-axis Aligned Crystalline Oxide Semiconductor FET with GHz-ordered Cutoff Frequency," Ext. Abstr. Solid-State Devices and Materials, 2014, pp. 648-649.

SUMMARY OF THE INVENTION

Especially when a three-dimensional structure is employed for a memory device, the number of stacked films increases and this leads to an increase in the number of steps of manufacturing the memory device, such as a step of film formation, a step of patterning by a lithography method, an etching step, and a step of performing heat treatment.

An increase in the number of steps leads to extended production time, so that it takes time to complete the memory device. In addition, since an increase in the number of steps causes contamination by foreign matter, a human error, and other troubles in some cases, the manufacturing yield of the memory device might decrease.

An object of one embodiment of the present invention is to provide a novel memory device. Another object of one embodiment of the present invention is to provide a module including the novel memory device. Another object of one embodiment of the present invention is to provide an electronic device using the module including the novel memory device. Another object of one embodiment of the present invention is to provide a novel semiconductor device, a novel module, a novel electronic device, a novel system, and the like.

Another object of one embodiment of the present invention is to provide a memory device in which the number of films is reduced or an electronic device including the memory device. Another object of one embodiment of the present invention is to provide a memory device whose number of manufacturing steps is reduced or an electronic device including the memory device. Another object of one embodiment of the present invention is to provide a novel memory device with a large memory capacity or an electronic device including the memory device.

Note that the objects of one embodiment of the present invention are not limited to the above objects. The above objects do not disturb the existence of other objects. Other objects are the ones that are not described above and will be described below. Other objects will be apparent from and can be derived from the description of the specification, the drawings, and the like by those skilled in the art. One embodiment of the present invention achieves at least one of the above objects and the other objects. One embodiment of the present invention need not achieve all the above objects and the other objects.

(1) One embodiment of the present invention is a memory device that includes a circuit and a wiring. The circuit includes a first memory cell and a second memory cell. The first memory cell includes a first transistor, a second transistor, and a first capacitor. The second memory cell includes a third transistor, a fourth transistor, and a second capacitor. The second memory cell is stacked over the first memory cell. One of a source and a drain of the first transistor is electrically connected to a gate of the second transistor and to the first capacitor. One of a source and a drain of the third transistor is electrically connected to a gate of the fourth transistor and to the second capacitor. A gate of the first transistor and a gate of the third transistor are electrically connected to the wiring.

(2) Another embodiment of the present invention is a memory device that includes a circuit and a wiring. The circuit includes a first memory cell and a second memory cell. The first memory cell includes a first transistor, a second transistor, and a first capacitor. The second memory cell includes a third transistor, a fourth transistor, and a second capacitor. The second memory cell is stacked over the first memory cell. A gate of the first transistor and a gate of the third transistor are electrically connected to the wiring. One of a source and a drain of the first transistor is electrically connected to a gate of the second transistor and to the first capacitor. One of a source and a drain of the third transistor is electrically connected to a gate of the fourth transistor and to the second capacitor. The first transistor, the second transistor, the third transistor, and the fourth transistor each include an oxide semiconductor in a channel formation region.

(3) Another embodiment of the present invention is the memory device described in (2), which further includes a row driver and a column driver. The circuit is stacked over the row driver and the column driver. The row driver and the column driver each include a transistor that includes a material other than an oxide semiconductor in a channel formation region.

(4) Another embodiment of the present invention is the memory device described in any one of (1) to (3), which further includes a first semiconductor; a first insulator over the first semiconductor; a conductor over the first insulator; a second insulator over the conductor; and a second semiconductor over the second insulator. The first semiconductor includes the channel formation region of the first transistor. The first insulator has a function of a gate insulating layer of the first transistor. The conductor has a function of the gate of the first transistor and the gate of the third transistor. The second insulator has a function of a gate insulating layer of the third transistor. The second semiconductor includes the channel formation region of the third transistor.

(5) Another embodiment of the present invention is the memory device described in any one of (1) to (4), which further includes a plurality of the circuits and in which the circuits are stacked.

(6) Another embodiment of the present invention is the memory device described in any one of (1) to (5), which has a memory capacity of one terabyte or more.

(7) Another embodiment of the present invention is an electronic device that includes the memory device described in any one of (1) to (6) and a host device. The host device and the memory device are electrically connected to each other.

According to one embodiment of the present invention, a novel memory device can be provided. According to one embodiment of the present invention, a module including the novel memory device can be provided. According to one embodiment of the present invention, an electronic device using the module including the novel memory device can be provided. According to one embodiment of the present invention, a novel semiconductor device, a novel module, a novel electronic device, a novel system, and the like can be provided.

According to one embodiment of the present invention, a memory device in which the number of films is reduced or an electronic device including the memory device can be provided. According to one embodiment of the present invention, a memory device whose number of manufacturing steps is reduced or an electronic device including the memory device can be provided. According to one embodiment of the present invention, a novel memory device with a large memory capacity or an electronic device including the memory device can be provided.

Note that the effects of one embodiment of the present invention are not limited to the above effects. The effects described above do not disturb the existence of other effects. Other effects are the ones that are not described above and will be described below. Other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIGS. 17A to 17E are schematic views illustrating structure examples of removable memory devices.

FIG. 30A is a top view and FIGS. 30B to 30D are cross-sectional views illustrating a structure example of a transistor.

DETAILED DESCRIPTION OF THE INVENTION

In this specification, an oxide semiconductor is referred to as an OS in some cases. Thus, a transistor including an oxide semiconductor in a channel formation region is referred to as an OS transistor in some cases.

(Embodiment 1)

Described in this embodiment is a memory device of one embodiment of the disclosed invention.

<Circuit Configuration Example of Memory Cell>

Figure 2:
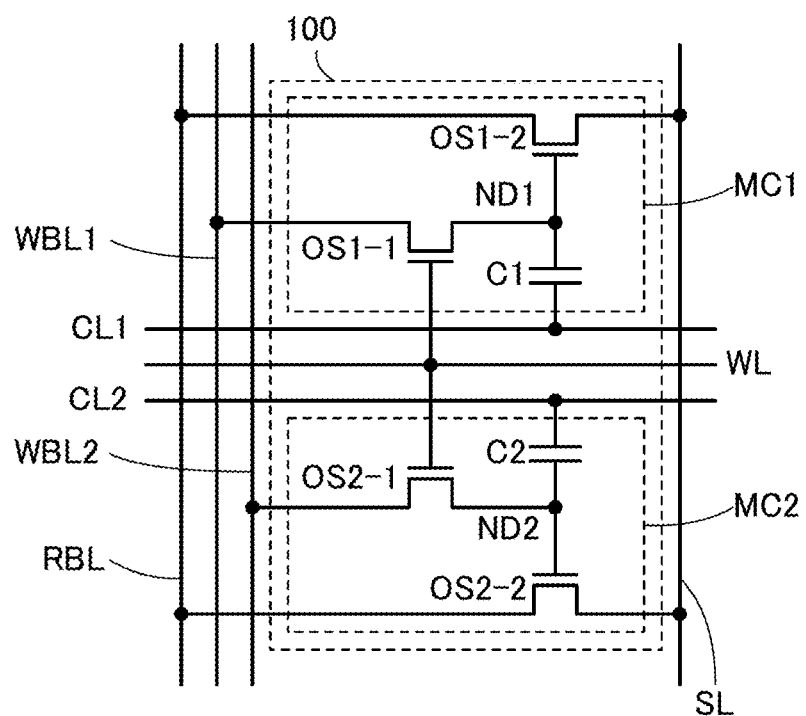
FIG. 2 is a circuit diagram illustrating a configuration example of a memory cell included in a memory device.

FIG. 2 illustrates a configuration example of a memory cell in a memory device of one embodiment of the present invention. FIG. 2 illustrates a memory cell set 100 that includes a memory cell MC1 and a memory cell MC2.

The memory cell set 100 is electrically connected to a wiring WL, a wiring WBL1 a wiring WBL2 a wiring RBL, a wiring SL, a wiring CL1, and a wiring CL2

The memory cell MC1 includes a transistor OS1-1, a transistor OS1-2, and a capacitor C1. One of a source and a drain of the transistor OS1-1 is electrically connected to a gate of the transistor OS1-2 and a first electrode of the capacitor C1. The other of the source and the drain of the transistor OS1-1 is electrically connected to the wiring WBL1. A gate of the transistor OS1-1 is electrically connected to the wiring WL. One of a source and a drain of the transistor OS1-2 is electrically connected to the wiring SL. The other of the source and the drain of the transistor OS1-2 is electrically connected to the wiring RBL. A second electrode of the capacitor C1 is electrically connected to the wiring CL1. Note that a portion where the one of the source and the drain of the transistor OS1-1, the first electrode of the capacitor C1, and the gate of the transistor OS1-2 are connected is referred to as a node ND1.

The memory cell MC2 includes a transistor OS2-1, a transistor OS2-2, and a capacitor C2. One of a source and a drain of the transistor OS2-1 is electrically connected to a gate of the transistor OS2-2 and a first electrode of the capacitor C2. The other of the source and the drain of the transistor OS2-1 is electrically connected to the wiring WBL2. A gate of the transistor OS2-1 is electrically connected to the wiring WL. One of a source and a drain of the transistor OS2-2 is electrically connected to the wiring SL. The other of the source and the drain of the transistor OS2-2 is electrically connected to the wiring RBL. A second electrode of the capacitor C2 is electrically connected to the wiring CL2. Note that a portion where the one of the source and the drain of the transistor OS2-1, the first electrode of the capacitor C2, and the gate of the transistor OS2-2 are connected is referred to as a node ND2.

OS transistors are preferably used as the transistor OS1-1, the transistor OS1-2, the transistor OS2-1, and the transistor OS2-2. The material and structure for an OS transistor will be described in detail in Embodiment 5.

The wiring WL is a word line, the wiring WBL1 and the wiring WBL2 are write bit lines, and the wiring RBL is a read bit line.

The wiring WL controls the on/off state of the transistor OS1-1 and that of the transistor OS2-1.

The wiring CL1 is a wiring for supplying a constant voltage to the second electrode of the capacitor C1 in writing operation or reading operation. The wiring CL2 is a wiring for supplying a constant voltage to the second electrode of the capacitor C2 in writing operation or reading operation.

The wiring SL is a wiring for supplying a constant voltage to the other of the source and the drain of the transistor OS1-2 and the other of the source and the drain of the transistor OS2-2 in reading operation.

In the above structure, word lines connected to two memory cells can be combined into one wiring (wiring WL). Thus, the number of wirings of the memory device that includes the memory cell set 100 can be reduced.

Figure 3:
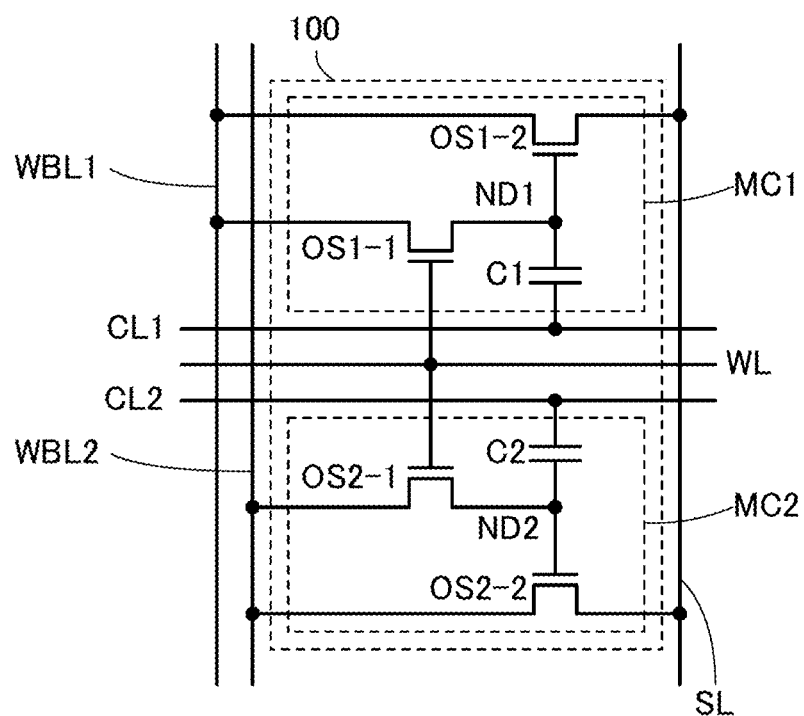
FIG. 3 is a circuit diagram illustrating a configuration example of a memory cell included in a memory device.

Note that one embodiment of the present invention is not limited to the above-described circuit configuration example. Depending on circumstances or conditions, the above-described circuit configuration may be modified as appropriate. For example, when the wiring WBL1 connected to the memory cell MC1 serves as the wiring RBL and the wiring WBL2 connected to the memory cell MC2 serves as the wiring RBL as illustrated in FIG. 3, the wiring RBL illustrated in FIG. 2 can be omitted. In other words, the number of the wirings in the circuit illustrated in FIG. 2 can be reduced.

Figure 4A:
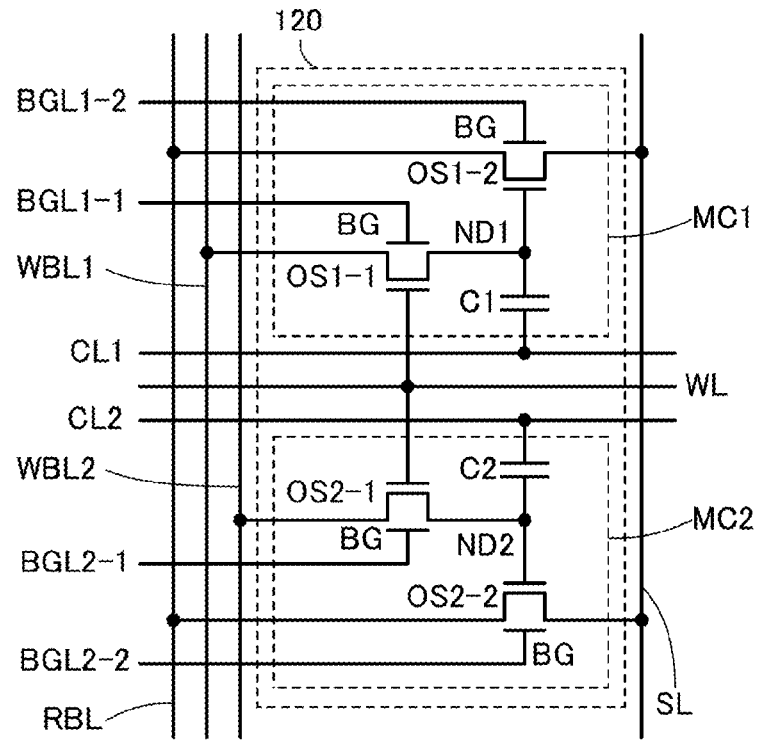
FIGS. 4A and 4B are circuit diagrams each illustrating a configuration example of a memory cell included in a memory device.
Figure 4B:
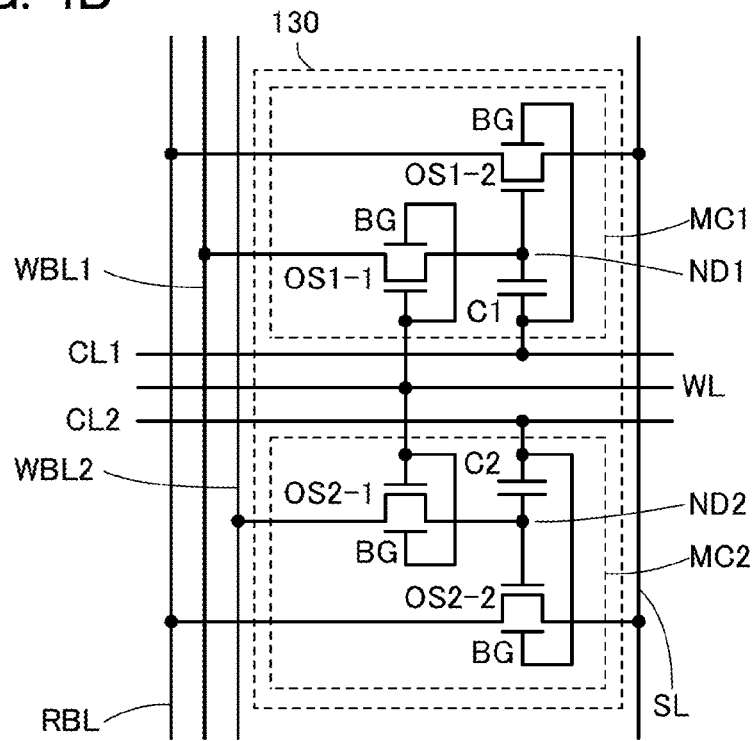

Furthermore, for example, the transistors OS1-1 and OS1-2 and the transistors OS2-1 and OS2-2 may each have a back gate BG as in a memory cell set 120 illustrated in FIG. 4A or a memory cell set 130 illustrated in FIG. 4B. The circuit illustrated in FIG. 4A includes wirings BGL1-1, BGL1-2, BGL2-1, and BGL2-2. The back gates BG of the transistors OS1-1, OS1-2, OS2-1, and OS2-2 are electrically connected to the wirings BGL1-1, BGL1-2, BGL2-1, and BGL2-2, respectively. The threshold voltages of the transistors OS1-1, OS1-2, OS2-1, and OS2-2 can be controlled by supplying potentials to the wirings BGL1-1, BGL1-2, BGL2-1, and BGL2-2, respectively. As in the memory cell set 130 illustrated in FIG. 4B, the following structure may be employed: the back gate BG of the transistor OS1-1 and the gate of the transistor OS1-1 are electrically connected; the back gate BG of the transistor OS1-2 and the second electrode of the capacitor C1 are electrically connected; the back gate BG of the transistor OS2-1 and the gate of the transistor OS2-1 are electrically connected; and the back gate BG of the transistor OS2-2 and the second electrode of the capacitor C2 are electrically connected. With such a structure, the current that flows when the transistors OS1-1, OS1-2, OS2-1, and OS2-2 are in an on state can be increased. The structure in which the transistors have back gates is not limited to the structures illustrated in FIGS. 4A and 4B, and for example, only some of the transistors may have back gates or the back gate BG may be connected to a portion different from the above-described portion.

In accordance with the functions to be added to or omitted from the circuit illustrated in FIG. 2, the number of wirings, elements, processing circuits, and the like can be changed.

<Configuration Example of Memory Cell Array and Peripheral Driver>

Figure 5:
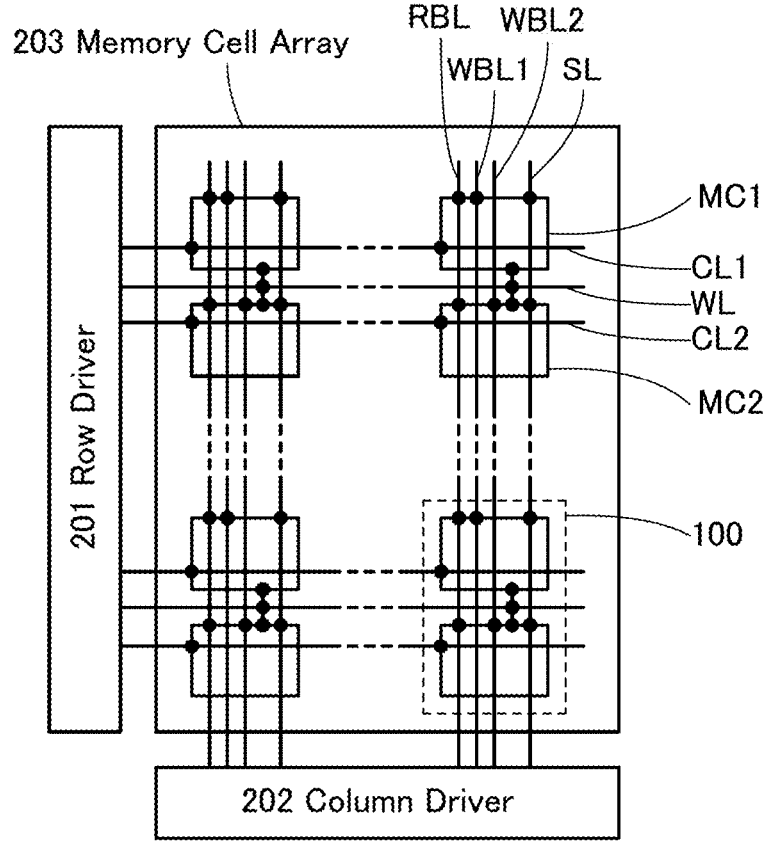
FIG. 5 is a block diagram illustrating a configuration example of a memory device.

FIG. 5 is a block diagram illustrating a configuration example of a memory that includes a memory cell array and a peripheral driver. A semiconductor device 200 includes a memory cell array 203, a row driver 201, and a column driver 202. The memory cell array 203 includes the memory cell set 100, the wiring WL, the wiring WBL1 the wiring WBL2 the wiring RBL, the wiring SL, the wiring CL1, and the wiring CL2 The memory cell set 100 includes the memory cell MC1 and the memory cell MC2 as described above. The m×n memory cell sets 100 are arranged in a matrix, where n (n is an integer of 1 or more) of the memory cell sets 100 are arranged in the row direction and m (m is an integer of 1 or more) of them are arranged in the column direction. The memory cell sets 100 in one row are electrically connected to the wiring WL, the wiring CL1, and the wiring CL2 in the row, the memory cell sets 100 in one column are electrically connected to the wiring WBL1 the wiring WBL2 the wiring RBL, and the wiring SL in the column.

The wiring WL is electrically connected to the row driver 201 and can function as a word line. The row driver 201 has a function of outputting a signal for selecting the memory cell to which access is requested to the wiring WL. The wirings WBL1 and WBL2 are electrically connected to the column driver 202, and function as write bit lines. The wiring RBL is electrically connected to the column driver 202, and functions as a read bit line. The column driver 202, has a function of conditioning (e.g., precharging) the wiring connected thereto, a function of writing data to the selected memory cell, and a function of reading the data from the memory cell.

The wiring CL1 and the wiring CL2 are electrically connected to the row driver 201 and function as wirings supplying a constant voltage to the second electrode of the capacitor C1 in writing operation or reading operation. The wiring SL is electrically connected to the column driver 202 and functions as a wiring for supplying a constant voltage to the other of the source and the drain of the transistor OS1-2 and the other of the source and the drain of the transistor OS2-2 in reading operation.

The semiconductor device 200 in this embodiment is not limited to the structure illustrated in FIG. 5. Depending on circumstances or conditions, the structure of the semiconductor device 200 may be changed. For example, the circuit configuration in FIG. 3 can be applied to the semiconductor device 200. In that case, the wiring WBL1 connected to the memory cell MC1 serves as the wiring RBL and the wiring WBL2 connected to the memory cell MC2 serves as the wiring RBL, so that the wiring RBL illustrated in FIG. 5 can be omitted. Furthermore, for example, as in the memory cell set 120 illustrated in FIG. 4A, the transistors OS1-1, OS1-2, OS2-1, and OS2-2 may each have the back gate BG and the wirings BGL1-1, BGL1-2, BGL2-1, and BGL2-2 may be added. In this manner, in accordance with the circuit configuration or operation method, the configuration of the semiconductor device 200 may be changed as appropriate by adding a circuit element, a wiring, and a function necessary for the configurations of the memory cell, the row driver 201, and the column driver 202, or by omitting a circuit element, a wiring, and a function unnecessary for the configurations.

<Operation Example>

An operation example of the memory cell set 100 will be described.

Figure 6:
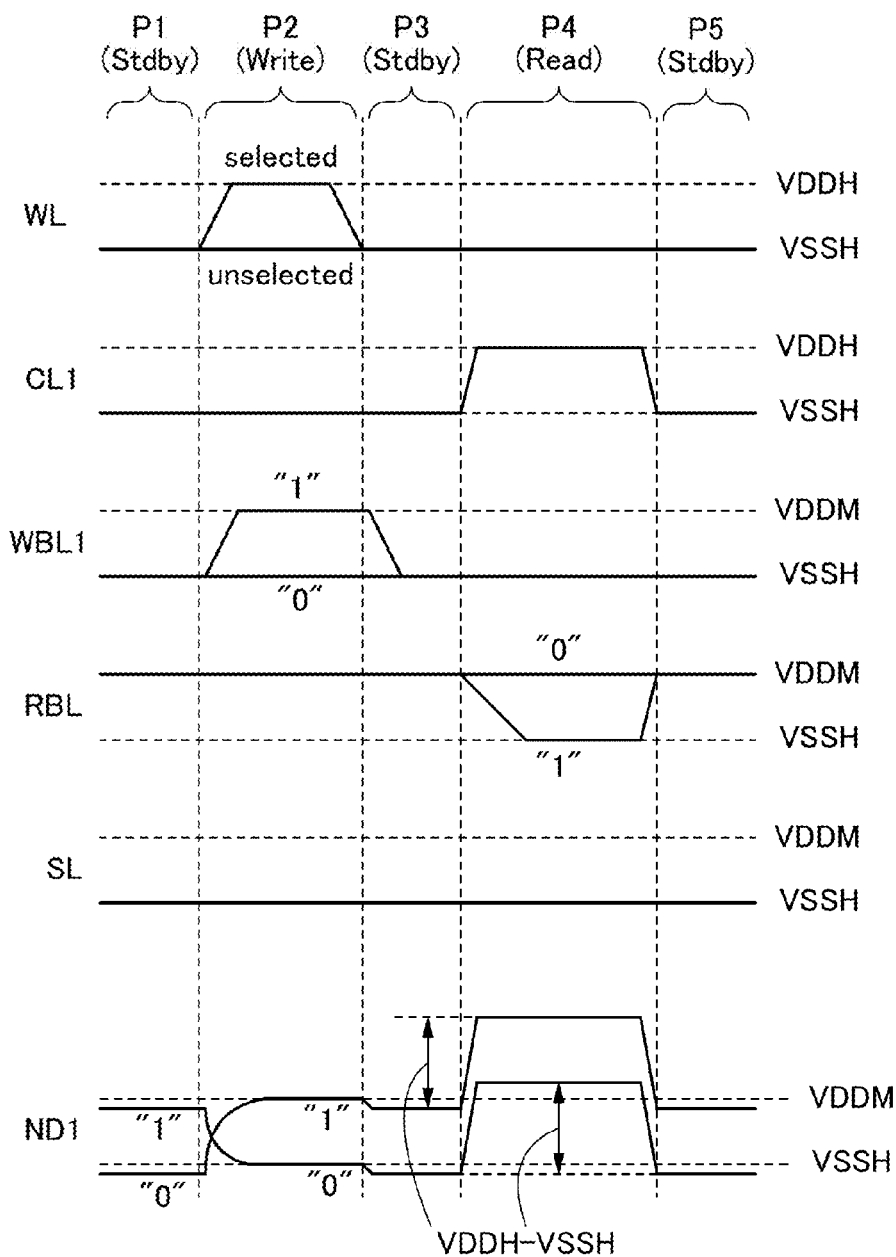
FIG. 6 is a timing chart showing an operation example of a memory device.

FIG. 6 is a timing chart of an operation example of the memory cell MC1 in the memory cell set 100. In FIG. 6, the low (L) potentials of the wirings WL, WBL1 RBL, SL, and CL1 are VSSH. VSSH may be a ground potential (GND) or 0 V. The high (H) potential of the wirings WL and CL1 is VDDH, and the high (H) potentials of the wirings WBL1 RBL, and SL are VDDM. Here, VDDH is higher than VDDM.

Periods P1, P3, and P5 are standby periods (Stdby). In the periods P1, P3, and P5, the potentials of the wirings WL, CL1, and SL are each at an L level. That is, the memory cell MC1 is unselected. Furthermore, in the periods P1, P3, and P5, the wiring RBL is precharged to an H level. Here, the memory capacity of the memory cell MC1 is one bit, for example. In the period P1, the potential of the node ND1 that retains "1" is at an H level, and the node ND1 that retains "0" is at an L level.

<<Writing Operation>>

A period P2 is a write period (Write). The potential of the wiring WL in a selected row is set at an H level, so that the transistor OS1-1 is turned on. In the case where "1" is written to the memory cell MC1, the potential of the wiring WBL1 is set at an H level. In the case where "0" is written to the memory cell MC1, the potential of the wiring WBL1 is set at an L level. In the selected memory cell MC1, the potential of the node ND1 becomes VDDM or VSSM depending on the potential of the wiring WBL1.

Next, the potential of the wiring WL is set at an L level, so that the transistor OS1-1 is turned off. The node ND1 is brought into an electrically floating state, and the memory cell MC1 retains data. Note that the wiring WL and the node ND1 are capacitively coupled; thus, by turning off the transistor OS1-1, the potential of the node ND1 is slightly decreased. By setting the potential of the wiring WBL1 at an L level, the writing operation is terminated. By setting the potential of the wiring WBL1 at an L level after bringing the node ND1 into a floating state, fluctuation in the potential of the node ND1 can be reduced.

<<Reading Operation>>

A period P4 is a read period (Read). First, immediately before the period P4, the potential of the wiring WL in an unselected row is set at an L level and the potential of the wiring RBL is set at an H level. In reading, the potential of the wiring CL1 is set at an H level at the start of the period P4. At that time, the potential of the node ND1 is stepped up by a voltage (VDDH—VSSH) because of capacitive coupling in the capacitor C1. When the node ND1 retains "0," the voltage between the gate and the source of the transistor OS1-2 does not reach the threshold voltage and thus, the transistor OS1-2 is turned off and the potential of the wiring RBL remains at an H level. When the node ND1 retains "1," the voltage between the gate and the source of the transistor OS1-2 reaches the threshold voltage and thus, the transistor OS1-2 is turned on. At that time, the wiring SL is at an L level, so that current flows from the wiring RBL to the wiring SL through the transistor OS1-2. Thus, the potential of the wiring RBL is stepped down to an L level. After that, by returning the potential of the wiring RBL to an H level, the reading operation is terminated. The column driver 202 determines whether or not data read from the memory cell MC1 is "0" or "1" based on the potential of the wiring RBL in the period P4.

In the above description of the operation example, the memory capacity of the memory cell MC1 is one bit; however, one embodiment of the present invention is not limited to the example. For example, the memory cell MC1 of the memory cell set 100 may be a multi-level digital memory of three or more values or an analog memory.

<Structure Example of Memory Cell>

Next, structure examples of the memory cell set 100 are described with reference to FIG. 1 and FIGS. 7 to 10.

<<Cross-Sectional Structure>>

Figure 7:
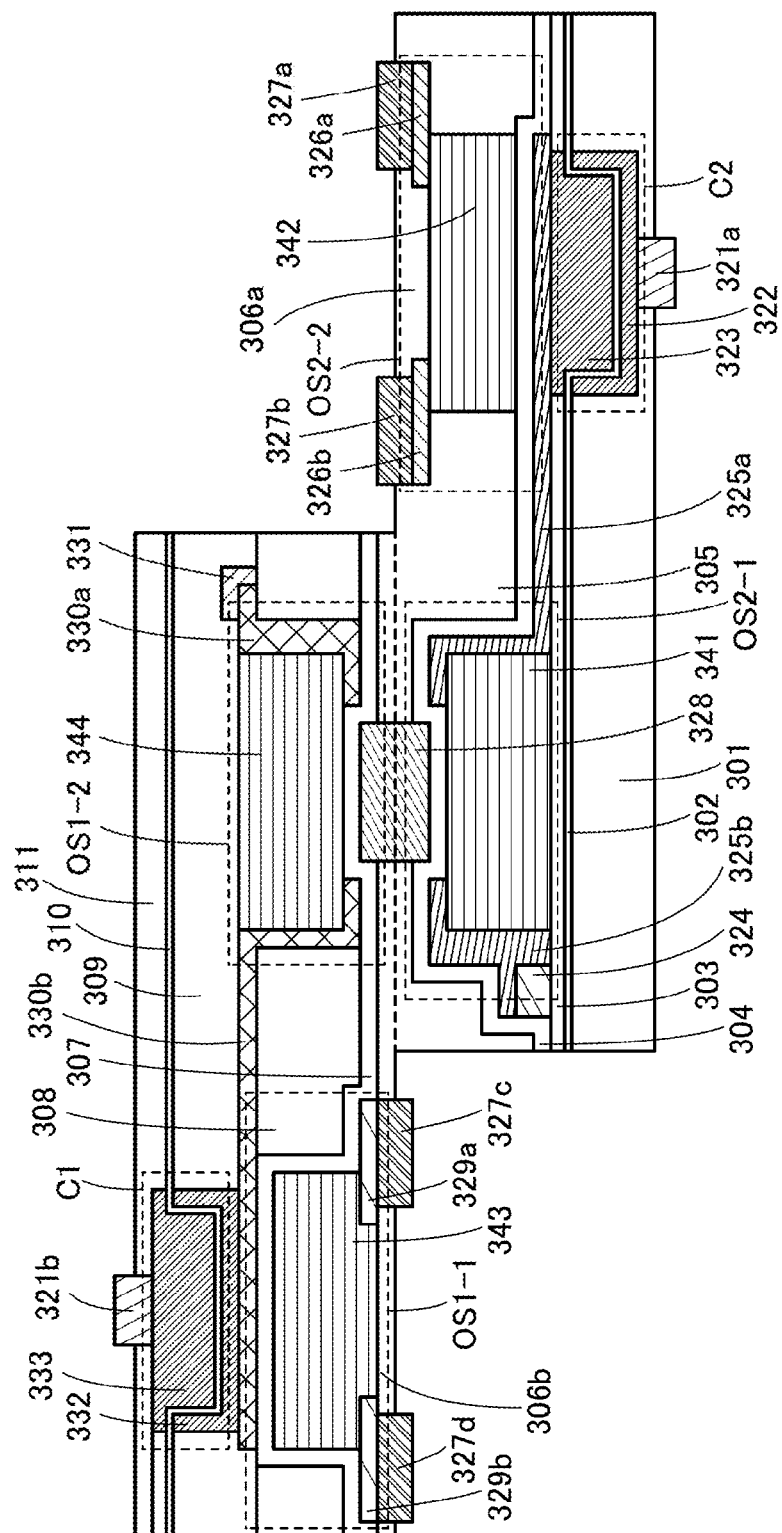
FIG. 7 is a schematic cross-sectional view illustrating a structure example of a memory cell included in a memory device.

FIG. 7 is a schematic cross-sectional view of the memory cell set 100. FIG. 7 illustrates cross sections of the transistors OS1-1, OS1-2, OS2-1, and OS2-2, which are included in the memory cell set 100, in the channel length direction.

The memory cell set 100 includes insulators 301 to 311, conductors 321 to 334, and semiconductors 341 to 344. Note that the conductor 334 is not shown in the cross-sectional view of FIG. 7 but shown in a top view to be referred to. Note that in the present specification, conductors 321a and 321b to be described later are collectively referred to as the conductor 321; conductors 325a and 325b to be described later are collectively referred to as the conductor 325; conductors 327a, 327b, 327c, and 327d to be described later are collectively referred to as the conductor 327; conductors 334a, 334b, 334c, and 334d to be described later are collectively referred to as the conductor 334; and conductors 330a and 330b to be described later are collectively referred to as the conductor 330.

Note that in FIG. 7, the regions where insulators are formed are not hatched.

Note that the structure example of the memory cell set 100 illustrated in FIG. 7 can be electrically connected to the same structure example in the channel length direction. Accordingly, in FIG. 7, the insulator 306a and the insulator 306b can be formed in the same step. In addition, the conductor 327a and the conductor 327c can be formed in the same step as the conductor 327b and the conductor 327d. In other words, in the two memory cell sets 100 that are adjacent to each other in the channel length direction, the conductors 327a and 327b of one memory cell set 100 are the same as the conductors 327c and 327d of the other memory cell set 100, and the insulator 306a of one memory cell set 100 is the same as the insulator 306b of the other memory cell set 100.

Note that the structure example of the memory cell set 100 illustrated in FIG. 7 can be electrically connected to the same structure example in the direction in which the layers are stacked. Specifically, in the two memory cell sets 100 that are stacked in the direction in which the layers are stacked, the conductor 321a of one memory cell set 100 is the same as the conductor 321b of the other memory cell set 100.

The conductor 321a is positioned at the bottom portion of the memory cell set 100. The conductor 322 is formed to be in contact with an upper portion of the conductor 321a. The insulator 301 is formed around the conductor 321a and the conductor 322. The insulator 302 is formed to cover the conductor 322 and the insulator 301. The conductor 323 is formed to overlap with the conductor 322 with the insulator 302 provided therebetween. Among the above components, the conductor 321a forms the wiring CL2, and the conductor 322, the conductor 323, and the insulator 302 form the capacitor C2.

The insulator 303 is formed to cover the insulator 302 and to be in contact with a side wall of the conductor 323. Over the insulator 303, the conductor 324 and the semiconductor 341 are formed not to be in contact with each other. The conductor 325 is formed such that it covers the conductor 323, the conductor 324, and the insulator 303 and that an end portion of the conductor 325 is positioned over the semiconductor 341. The conductor 325a is formed so as to electrically connect the semiconductor 341 and the conductor 323, and the conductor 325b is formed so as to electrically connect the semiconductor 341 and the conductor 324. Furthermore, the conductors 325a and the conductor 325b are formed not to be in contact with each other. The insulator 304 is formed to cover the conductor 325, the semiconductor 341, and the insulator 303. The conductor 328 is formed to have a region that overlaps with the semiconductor 341 with the insulator 304 provided therebetween. Among the above components, the insulator 303, the insulator 304, the conductor 325, the conductor 328, and the semiconductor 341 form the transistor OS2-1. Here, the conductor 325a functions as one of the source electrode and the drain electrode of the transistor OS2-1, the conductor 325b functions as the other of the source electrode and the drain electrode of the transistor OS2-1, the conductor 328 functions as the gate electrode of the transistor OS2-1, and the insulator 304 functions as a gate insulating layer of the transistor OS2-1. Although described later in detail, the conductor 324 is electrically connected to the wiring WBL2.

The semiconductor 342 is formed to have a region that overlaps with the capacitor C2 with the insulator 304 provided therebetween. The insulator 305 is formed to cover the insulator 304 and to be in contact with a side wall of the conductor 328 and a side wall of the semiconductor 342. The conductor 326a and the conductor 326b are formed to cover upper portions of the insulator 305 and upper portions of the semiconductor 342. The insulator 306a is formed to cover the semiconductor 342a and to be in contact with a side wall of the conductor 326a, a side wall of the conductor 326b, a side wall of the conductor 327a, and a side wall of the conductor 327b. The conductor 327a and the conductor 327b partly overlap with and are in contact with the conductor 326a and the conductor 326b, respectively. Among the above components, the conductor 325a, the conductor 326a, the conductor 326b, the insulator 304, the insulator 305, the insulator 306a, and the semiconductor 342 form the transistor OS2-2. Here, the conductor 325a functions as the gate electrode of the transistor OS2-2, the conductor 326a functions as one of the source electrode and the drain electrode of the transistor OS2-2, the conductor 326b functions as the other of the source electrode and the drain electrode of the transistor OS2-2, and the insulator 304 functions as a gate insulating layer of the transistor OS2-2. Although described later in detail, the conductors 327a and 327c are electrically connected to the wiring SL and the conductors 327b and 327d are electrically connected to the wiring RBL.

The conductor 329a is formed over the conductor 327c and the insulator 306b, and the conductor 329b is formed over the conductor 327d and the insulator 306b. The semiconductor 343 is formed to cover the insulator 306b and to be in contact with upper portions of the conductor 329a and the conductor 329b. The insulator 307 is formed to cover the insulator 305, the insulator 306b, the conductor 328, the conductor 329a, and the conductor 329b. The insulator 308 is formed to be in contact with an upper portion and a side wall of the insulator 307. The conductor 330 is formed over the insulator 307 and the insulator 308. Note that the conductor 330 is formed over the insulator 307 and the insulator 308. Specifically, the conductor 330b is formed to have a region that overlaps with the semiconductor 343 with the insulator 307 provided therebetween. The semiconductor 344 is formed to overlap with the semiconductor 341 with the insulator 304, the insulator 305, the conductor 325, the conductor 328, the insulator 307, and the conductor 330 provided therebetween. Over the insulator 308, the conductor 331 is formed to be in contact with the conductor 330a. Among the above components, the insulator 307, the conductor 329a, the conductor 329b, the conductor 330b, the insulator 306b, and the semiconductor 343 form the transistor OS1-1, and the conductor 328, the conductor 330b, the conductor 330a, the insulator 305, the insulator 307, the insulator 308, and the semiconductor 344 form the transistor OS1-2. Here, the conductor 329a functions as one of the source electrode and the drain electrode of the transistor OS1-1, the conductor 329b functions as the other of the source electrode and the drain electrode of the transistor OS1-1, the conductor 330b functions as the gate electrode of the transistor OS1-1, and the insulator 307 functions as a gate insulating layer of the transistor OS1-1. In addition, the conductor 328 functions as the gate electrode of the transistor OS1-2, the conductor 330b functions as one of the source electrode and the drain electrode of the transistor OS1-2, the conductor 330a functions as the other of the source electrode and the drain electrode of the transistor OS1-2, and the insulator 307 functions as a gate insulating layer of the transistor OS1-2. Although described later in detail, the conductor 331 is electrically connected to the wiring WBL1.

The conductor 332 is formed to overlap with the semiconductor 343 with the conductor 330b and the insulator 307 provided therebetween. The insulator 309 is formed to cover the conductor 330, the conductor 331, the insulator 307, the insulator 308, and the semiconductor 344 and to be in contact with a side wall of the conductor 332. The insulator 310 is formed to cover the conductor 332 and the insulator 309. The conductor 333 is formed to overlap with the conductor 332 with the insulator 310 provided therebetween. The conductor 321b is formed over and in contact with the conductor 333. The insulator 311 is formed to cover the conductor 333 and the insulator 310 and to be in contact with a side wall of the conductor 321b. Among the above components, the conductor 332, the conductor 333, and the insulator 310 form the capacitor C1. Although described later in detail, the conductor 321b is electrically connected to the wiring CL1.

<<Top Structure>>

Figure 8:
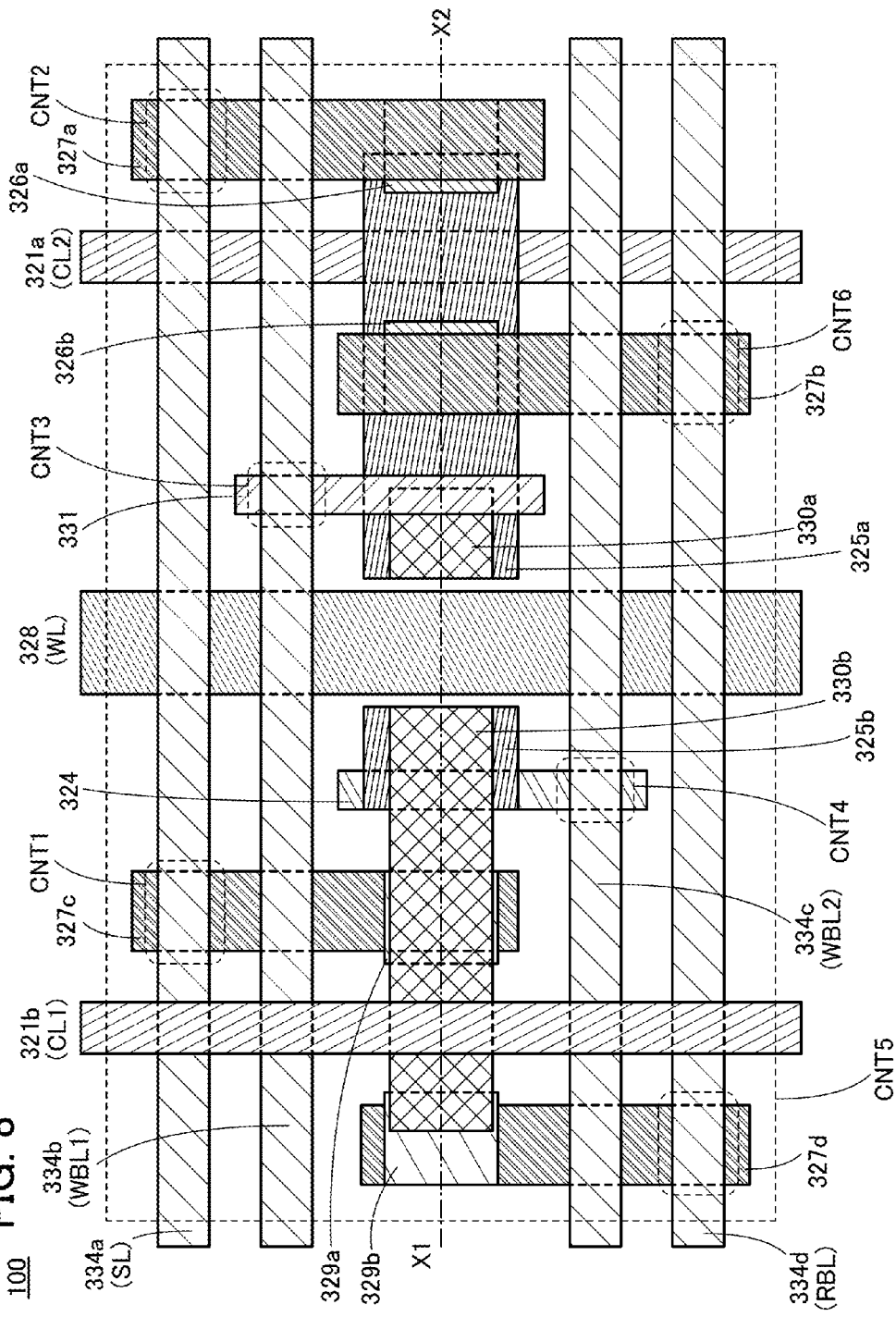
FIG. 8 is a schematic top view of the memory cell illustrated in FIG. 7.

FIG. 8 is a schematic top view of the memory cell set 100. The schematic cross-sectional view in FIG. 7 is taken along a dashed-dotted line X1-X2 in FIG. 8. That is, the direction parallel to the dashed-dotted line X1-X2 corresponds to the channel length direction, and the direction perpendicular to the dashed-dotted line X1-X2 corresponds to the channel width direction. Note that FIG. 8 illustrates only the conductor 321a, the conductor 321b, the conductors 324 to 331, and the conductors 334a to 334d and does not illustrate the conductor 322, the conductor 323, the conductor 332, the conductor 333, the insulators 301 to 311, and the semiconductors 341 to 344.

Among the conductors 321a, 321b, 324 to 331, and 334a to 334d, the regions of the upper conductors are small and the regions of the lower conductors are large in FIG. 8 for easy understanding of the stacking order. Thus, the sizes of the regions of the conductors 324 to 331 and 334a to 334d are not limited to those in FIG. 8, and the lower material may be entirely covered with the upper material. For example, the conductor 330a is smaller than the conductor 325a in FIG. 8 because the conductor 330a is positioned above the conductor 325a; however, the conductor 325a may be entirely covered with the conductor 330a.

The conductors 324, 327a to 327d, and 331 extend in the channel width direction to be connected to the wirings.

The conductor 321b extends in the channel width direction to function as the wiring CL1.

The conductor 321a extends in the channel width direction to function as the wiring CL2.

The conductor 328 extends in the channel width direction to function as the wiring WL.

The conductor 334a extends in the channel length direction to function as the wiring SL. The conductor 334a is electrically connected, in a contact region CNT1 and a contact region CNT2, to the conductor 327c and the conductor 327a that extend in the channel width direction, respectively.

The conductor 334b extends in the channel length direction to function as the wiring WBL1. The conductor 334b is electrically connected, in a contact region CNT3, to the conductor 331 that extends in the channel width direction.

The conductor 334c extends in the channel length direction to function as the wiring WBL2. The conductor 334c is electrically connected, in a contact region CNT4, to the conductor 324 that extends in the channel width direction.

The conductor 334d extends in the channel length direction to function as the wiring RBL. The conductor 334d is electrically connected, in a contact region CNT5 and a contact region CNT6, to the conductor 327d and the conductor 327b that extend in the channel width direction, respectively.

By employing the above-described top structure, the memory cell sets 100 can be arranged in a matrix as in the memory cell array 203 illustrated in FIG. 5. Accordingly, the semiconductor device 200 can be formed using the memory cell sets 100.

<<Example 1 of Stacked-layer Structure>>

Figure 1:
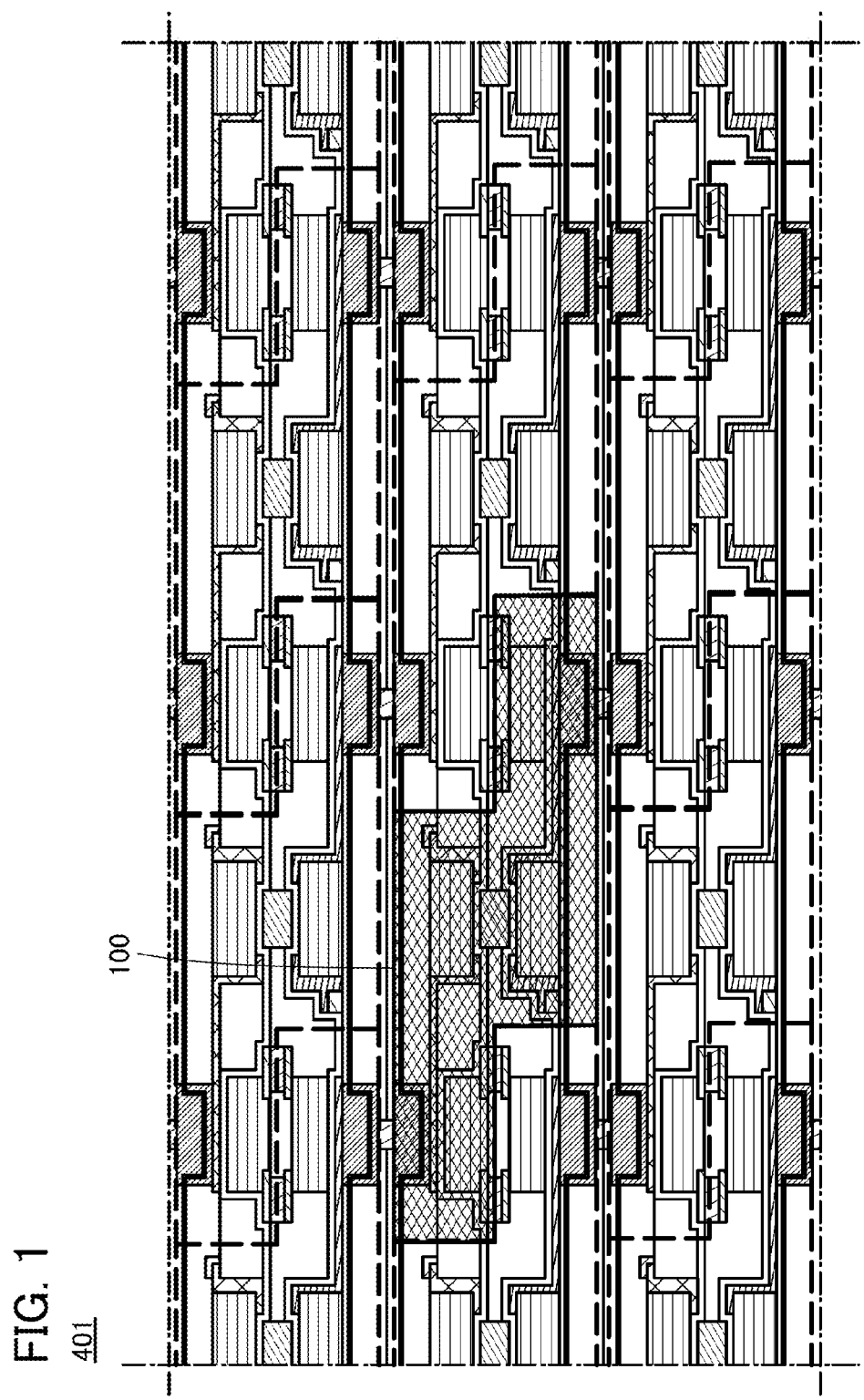
FIG. 1 is a schematic cross-sectional view illustrating a structure example of a memory cell array included in a memory device.

FIG. 1 illustrates a structure in which the memory cell sets 100 each having the cross-sectional structure in FIG. 7 are contiguously formed in the channel length direction and stacked.

A memory cell array structure 401 includes a plurality of the memory cell sets 100. In FIG. 1, one memory cell set 100 is hatched with a net-like pattern, and the other memory cell sets 100 are enclosed by dashed lines.

Figure 9:
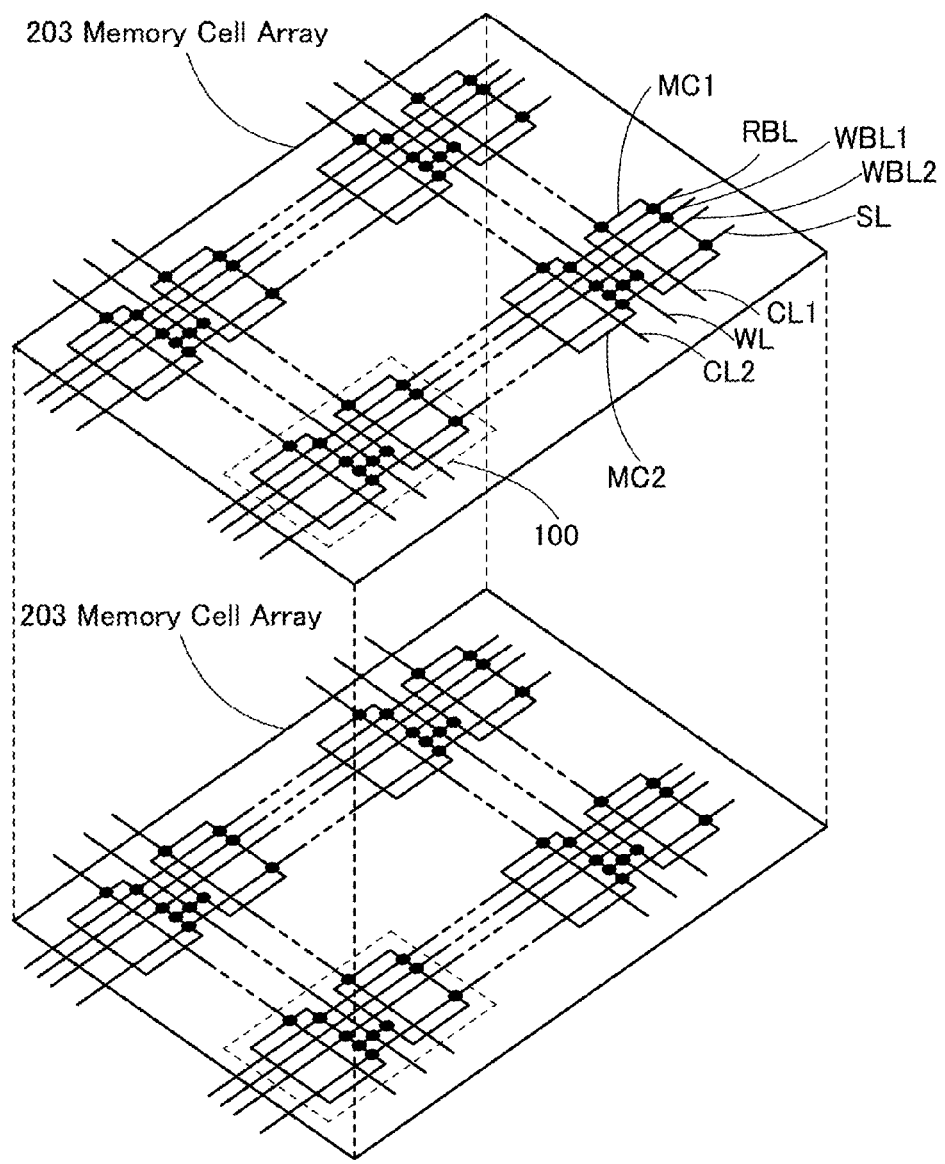
FIG. 9 is a block diagram illustrating a configuration example of a memory cell array included in a memory device.

The memory cell array structure 401 is completed when the conductors 321a, 321b, and 327a to 327d of one memory cell set are shared with other memory cell sets 100. Therefore, as illustrated in FIG. 1, the memory cell sets can be contiguously connected in the channel length direction and the vertical direction. Furthermore, the memory cell sets can be contiguously connected in the channel width direction in the above-described top structure. As a result, a semiconductor device 400 in which the memory cell arrays 203 are stacked as illustrated in FIG. 9 can be manufactured. Although two memory cell arrays are stacked in FIG. 9, three or more memory cell arrays may be stacked. Note that in FIG. 9, the row driver and the column driver are not shown.

<<Example 2 of Stacked-layer Structure>>

Figure 10:
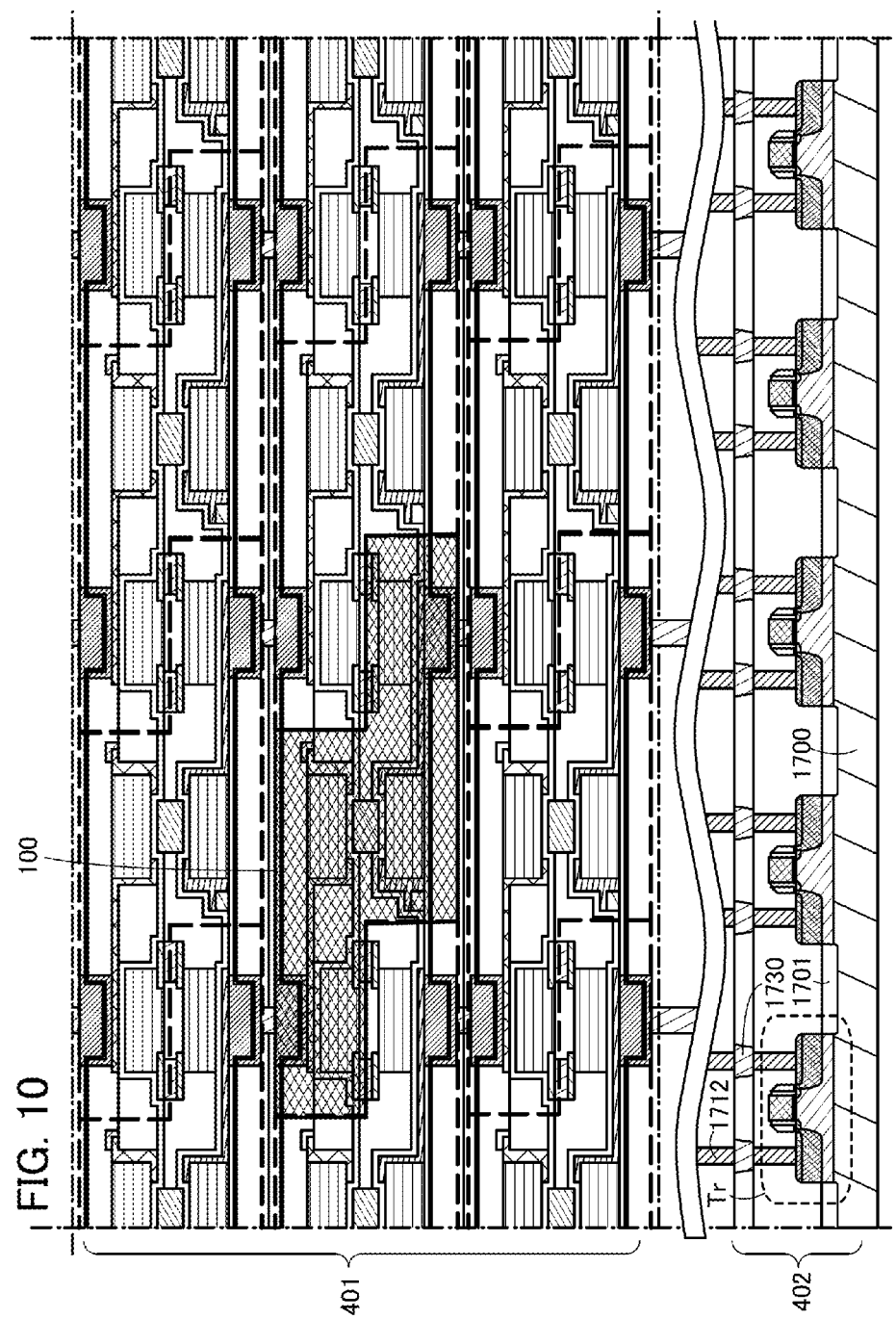
FIG. 10 is a schematic cross-sectional view illustrating a structure example of a memory cell array included in a memory device.

As a modification example of the structure in FIG. 1, a structure may be employed in which a peripheral circuit such as a row driver or a column driver is provided under the memory cell array structure 401 as illustrated in FIG. 10.

A peripheral circuit 402 includes a transistor Tr, a conductor 1712 a conductor 1730, insulators, and an element separation layer 1701. Note that the insulators in FIG. 10 are the regions without hatch patterns.

The transistor Tr is formed over a substrate 1700. The element separation layer 1701 is provided between a plurality of the transistors Tr. The conductors 1712 are formed as a source and a drain of the transistor Tr. The conductor 1730 extends in the channel width direction to be connected to another transistor Tr or the conductor 1712 (not shown).

The transistor Tr is preferably formed using a semiconductor material different from that used in the transistors OS1-1, OS1-2, OS2-1, and OS2-2 included in the memory cell array structure 401. FIG. 10 illustrates an example where the transistor Tr is a transistor whose channel formation region includes silicon (Si).

As the substrate 1700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, or a base film may be used as the substrate 1700. Alternatively, a semiconductor element may be formed using one substrate, and then transferred to another substrate. In FIG. 10, as an example, a single crystal silicon wafer is used as the substrate 1700.

Figure 11A:
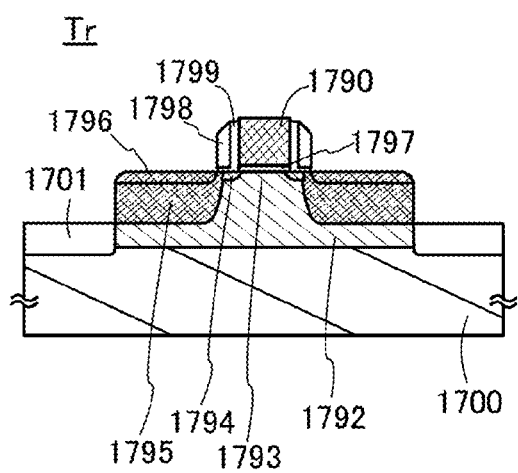
FIGS. 11A and 11B are cross-sectional views illustrating a structure example of a transistor.
Figure 11B:
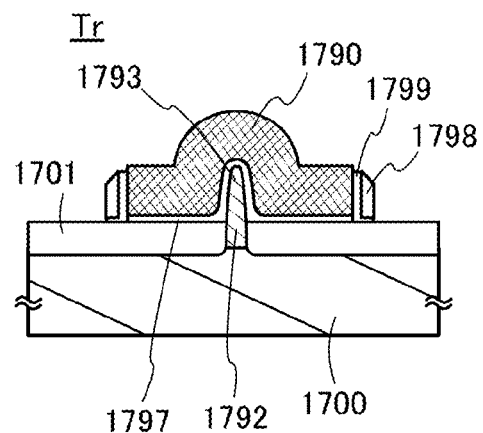

The transistor Tr is described in detail with reference to FIGS. 11A and 11B. FIG. 11A is a cross-sectional view of the transistor Tr in the channel length direction, and FIG. 11B is a cross-sectional view of the transistor Tr in the channel width direction. The transistor Tr includes a channel formation region 1793 formed in a well 1792, low-concentration impurity regions 1794 and high-concentration impurity regions 1795 (also collectively referred to as an impurity region simply), conductive regions 1796 provided in contact with the impurity region, a gate insulating film 1797 provided over the channel formation region 1793, a gate electrode 1790 provided over the gate insulating film 1797, and a sidewall insulating layer 1798 and a sidewall insulating layer 1799 provided on side surfaces of the gate electrode 1790. Note that the conductive regions 1796 can be formed using metal silicide or the like.

In FIG. 11B, the channel formation region 1793 of the transistor Tr has a projecting portion, and the gate insulating film 1797 and the gate electrode 1790 are provided along side and top surfaces of the channel formation region 1793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Figure 12A:
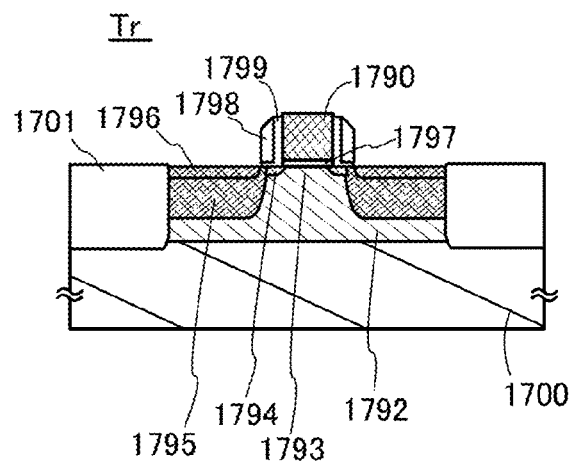
FIGS. 12A and 12B are cross-sectional views illustrating a structure example of a transistor.
Figure 12B:
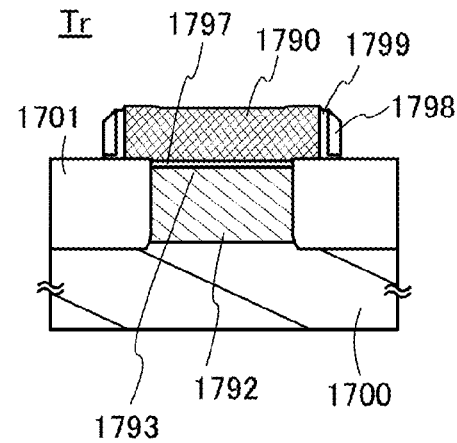

Note that the transistor Tr is not limited to the FIN-type transistor, and may be a planar-type transistor illustrated in FIGS. 12A and 12B. FIG. 12A is a cross-sectional view of the transistor Tr in the channel length direction, and FIG. 12B is a cross-sectional view of the transistor Tr in the channel width direction. The reference numerals in FIGS. 12A and 12B are the same as those shown in FIGS. 11A and 11B.

The insulators 303 to 307 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistors OS1-1, OS1-2, OS2-1, and OS2-2. Examples of insulators having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The conductors 321a, 321b, 324, 331, 327a to 327d, 1712 and 1730 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, a low-resistance conductive material, such as aluminum or copper, is preferable. The use of a Cu—Mn alloy is further preferable because manganese oxide formed at the interface with an insulator containing oxygen has a function of preventing Cu diffusion.

In FIG. 10, regions without reference numerals or hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used. Note that in this specification, an oxynitride refers to a compound in which the oxygen content is higher than the nitrogen content, and a nitride oxide refers to a compound in which the nitrogen content is higher than the oxygen content.

With the structure illustrated in FIG. 10, the area occupied by the circuits included in the memory device can be reduced, leading to a higher level of integration of the memory cells. In addition, when the memory cell set 100 is configured to retain multi-level data (data of three or more values), the memory device can have increased memory capacity.

With the above structure, the memory device in which the number of the films and the number of manufacturing steps are reduced can be provided. Moreover, a memory device having high memory capacity can be provided.

<<Example 3 of Stacked-layer Structure>>

Figure 13B:
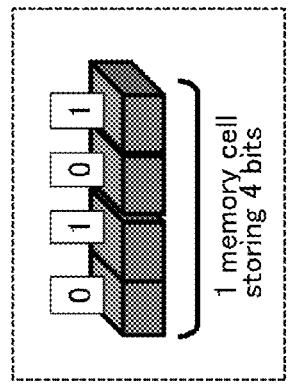
FIGS. 13A to 13D are conceptual diagrams, a schematic view, and a circuit diagram illustrating a configuration example of a memory device.
Figure 13A:
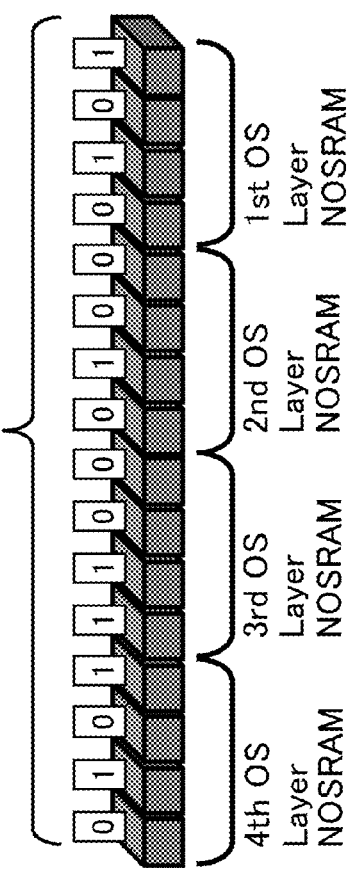
Figure 13D:
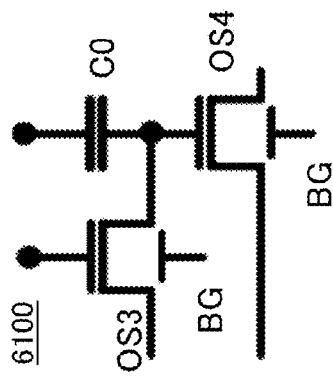
Figure 13C:
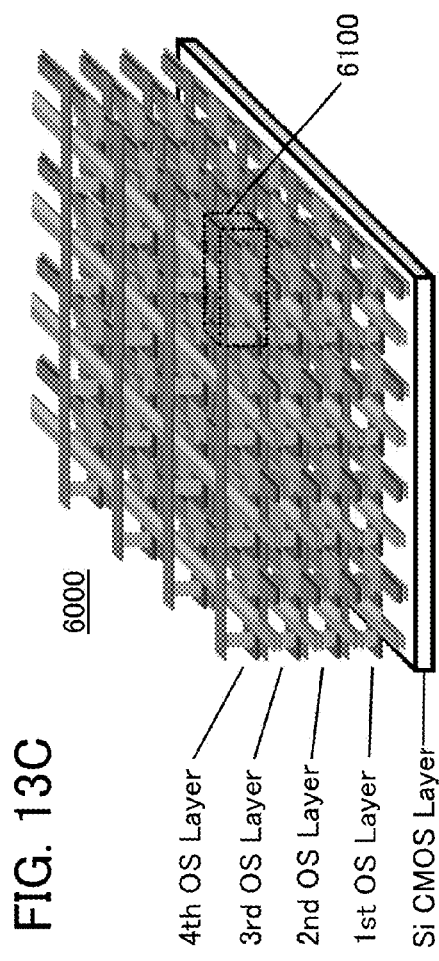

FIG. 13C is a schematic view of a stacked-layer structure of a nonvolatile memory that is manufactured using transistors whose channel formation regions include an oxide semiconductor (hereinafter referred to as OS-FETs). Note that in the present specification, a nonvolatile memory using OS-FETs is sometimes referred to as a nonvolatile oxide semiconductor random access memory (NOSRAM).

FIGS. 13A and 13B are conceptual diagrams illustrating the case where NOSRAMs are stacked to provide a multi-level memory device. When a one-layer NOSRAM is a minimum unit of a memory cell, J-bit ($2^J$ values, where J is an integer of 1 or more) data is stored in one memory cell, and the memory cells are stacked in K layers (K is an integer of 2 or more), the NOSRAMs can retain J×K-bit ($2^{J \times K}$ values) data in total. FIG. 13B is a conceptual diagram illustrating the case where one memory cell stores 4-bit data (J=4). FIG. 13A is a conceptual diagram illustrating the case where the above memory cells are stacked in four layers (K=4) and 4×4=16 bits are assumed as one word.

The circuit diagram in FIG. 13D shows a configuration example of a memory cell 6100 that can retain the above J-bit data. The memory cell 6100 preferably includes a transistor OS3, a transistor OS4, and a capacitor C0. One of a source and a drain of the transistor OS3 is electrically connected to a gate of the transistor OS4. One terminal of the capacitor C0 is electrically connected to the gate of the transistor OS4.

The transistors OS3 and OS4 are preferably OS-FETs. An OS-FET has an extremely low off-state current; thus, data written in the gate of the transistor OS4 can be retained for a long time by turning off the transistor OS3.

Each of the transistors OS3 and OS4 preferably has a first gate and a second gate (BG). The first gate preferably includes a region which overlaps with the second gate with a channel formation region provided therebetween. When the transistors OS3 and OS4 each have a second gate, the threshold voltages of the transistors can be controlled. Moreover, on-state current of the transistors can be increased.

The schematic view in FIG. 13C illustrates a structure example of a memory device 6000. The memory device 6000 includes the memory cells 6100 that are stacked. The memory device 6000 includes a CMOS layer including Si transistors and first to fourth OS layers including OS-FETs. The first to fourth OS layers are formed over the CMOS layer. The first to fourth OS layers each include the memory cell 6100. The CMOS layer has a function of controlling the memory cells.

Figure 14:
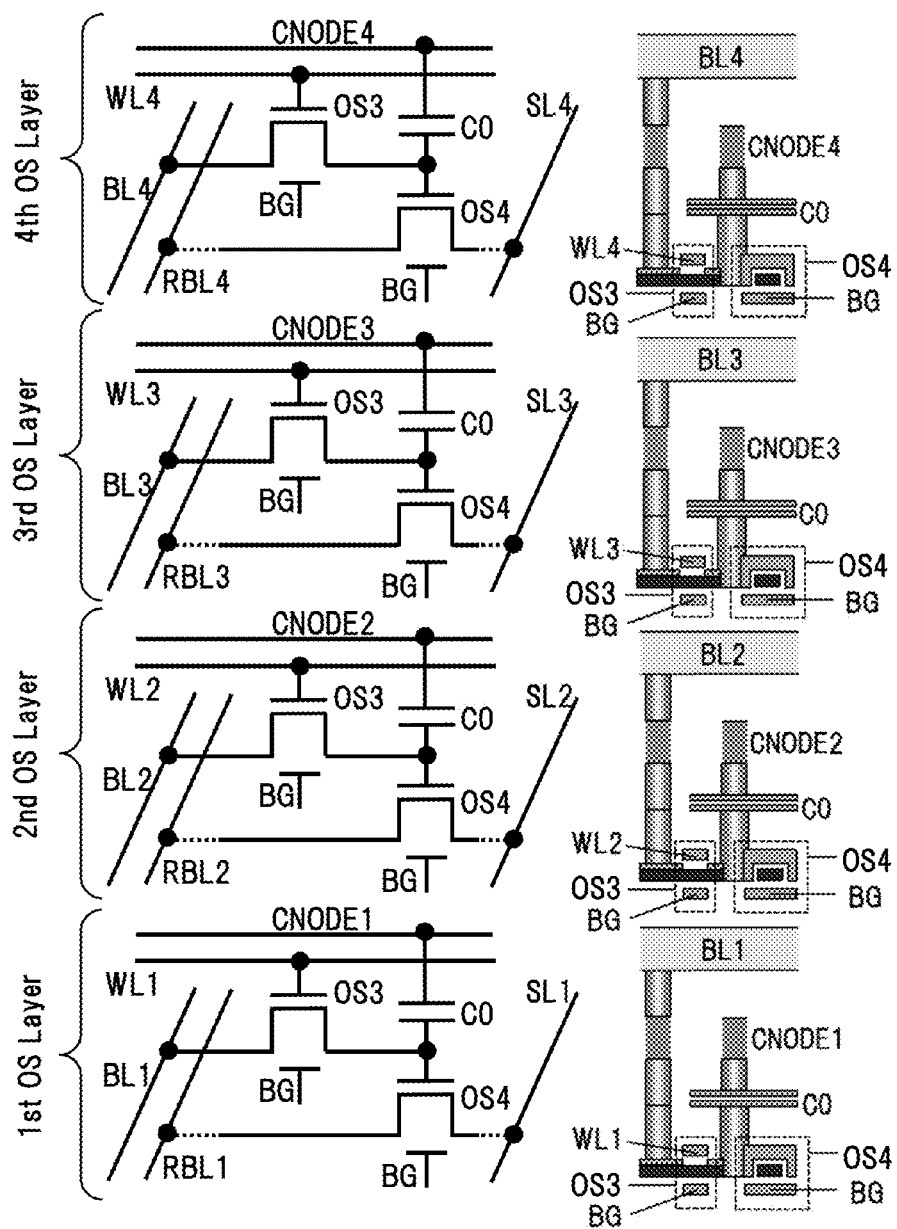
FIG. 14 shows circuit diagrams and cross-sectional views illustrating a configuration example of a memory device.

FIG. 14 illustrates detailed configuration examples of the first OS layer and the second OS layer in the memory device 6000. The left half of FIG. 14 shows circuit diagrams and the right half of FIG. 14 shows cross-sectional views corresponding to the circuit diagrams.

In the first OS layer, the gate of the transistor OS3 is electrically connected to a wiring WL1. The other of the source and the drain of the transistor OS3 is electrically connected to a wiring BL1. One of a source and a drain of the transistor OS4 is electrically connected to a wiring SL1. The other of the source and the drain of the transistor OS4 is electrically connected to a wiring RBL1. The other terminal of the capacitor C0 is electrically connected to a wiring CNODE1.

In the second to fourth OS layers, for wirings WL2, WL3, and WL4, the description of the wiring WL1 is to be referred to; for wirings BL2, BL3, and BL4, the description of the wiring BL1 is to be referred to; for wirings SL2, SL3, and SL4, the description of the wiring SL1 is to be referred to; for wirings RBL2, RBL3, and RBL4, the description of the wiring RBL1 is to be referred to; and for wirings CNODE2, CNODE3, and CNODE4, the description of the wiring CNODE1 is to be referred to.

A flash memory has a limit on the number of times of data rewriting and needs to erase old data when retained data is updated. The memory device 6000 does not have a limit on the number of times of data rewriting, and data can be rewritten $10^{12}$ times or more. In addition, new data can be written in the memory device 6000 without erasing old data. The memory device 6000 can write and read data at a lower voltage than a flash memory. Since OS-FETs can be easily stacked, the memory device 6000 can easily become a multi-level memory device.

Table 1 shows the technology node of the OS-FET included in the NOSRAM, the area occupied by the memory cell 6100 ($F^2$/cell, Cell area), and the area per bit of the memory cell 6100 ($F^2$/bit, Area per bit). Note that as the area per bit (hereinafter referred to as bit area), values obtained when the memory cells 6100 are stacked in four layers as illustrated in FIG. 13C are listed. Note that the technology node of an OS-FET primarily means the channel length of the OS-FET. Table 1 also shows, for comparison, values of a solid state drive (SSD) with 256 GB (gigabytes) fabricated using a three-dimensional NAND flash memory.

TABLE 1

| Technology node (Design rule) | F²/cell | F²/bit (4-layered) | Cell area | Area per bit (4-layered) |
|---|---|---|---|---|
| 10 nm | ≥16.5 | ≥1.03 | 0.0016 μm² (1600 nm²) | 0.00010 μm² (100 nm²) |
| 15 nm | ≥16.5 | ≥1.03 | 0.0037 μm² (3700 nm²) | 0.00023 μm² (230 nm²) |
| 30 nm | ≥16.5 | ≥1.03 | 0.0150 μm² (15000 nm²) | 0.00095 μm² (950 nm²) |
| 3D-NAND | ≥5.2 | ≥2.6 | 0.0179 μm² (17900 nm²) | 0.00028 μm² (280 nm²) |

Figure 15:
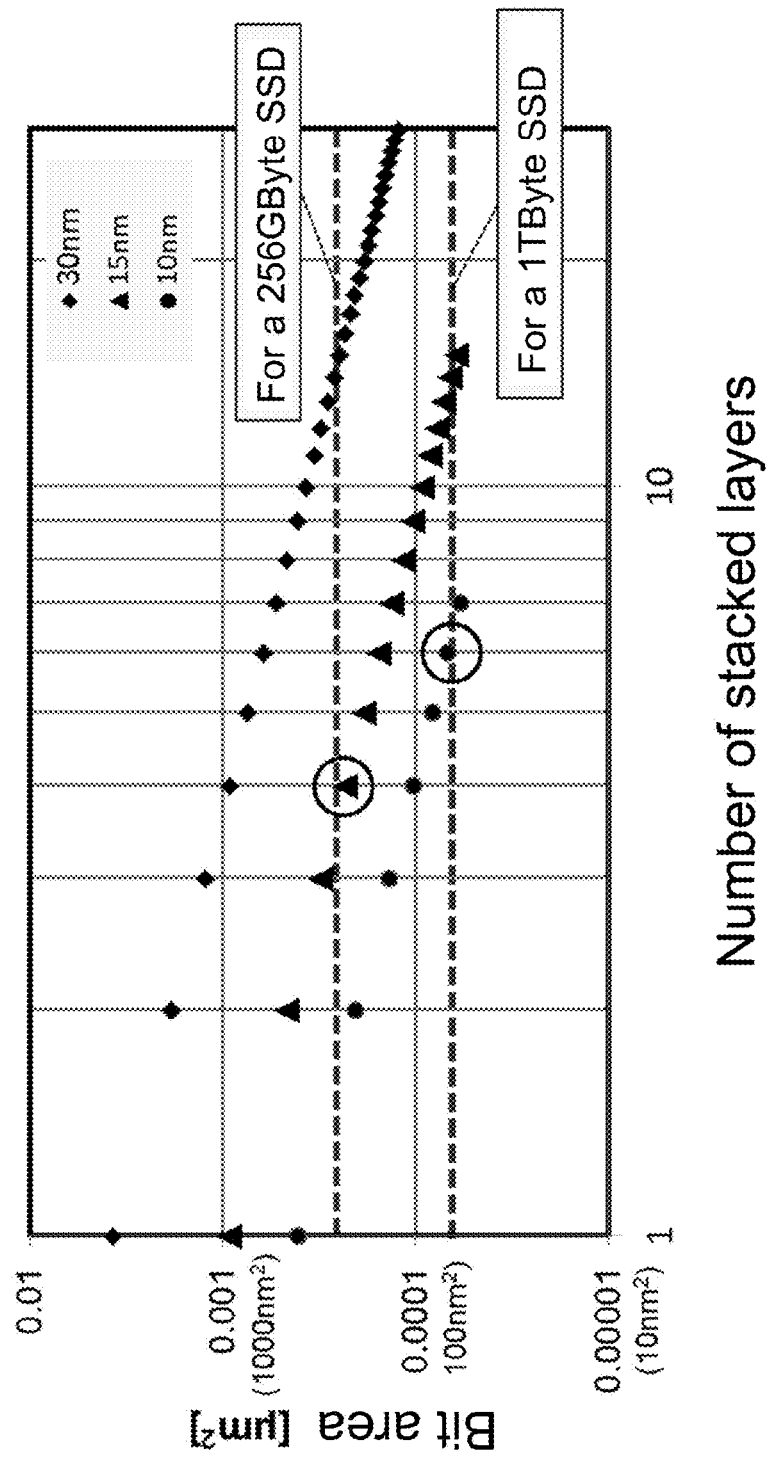
FIG. 15 shows bit area of a memory device as a function of the number of stacked layers of memory cells.

Next, the bit area as a function of the number of stacked layers of the memory cells 6100 is discussed. FIG. 15 is a graph whose vertical axis represents the bit area and whose horizontal axis represents the number of stacked layers of the memory cells 6100. From FIG. 15, the memory cells 6100 each of which is manufactured using an OS-FET with the 15-nm node and which are stacked in four layers have substantially the same bit area as a 256-GB SSD. Furthermore, the memory cells 6100 each of which is manufactured using an OS-FET with the 10-nm node and which are stacked in six layers have substantially the same bit area as a 1-TB (terabyte) SSD. In other words, a memory device in which the memory cells 6100 each manufactured using an OS-FET with the 10-nm node are stacked in six layers can have a memory capacity of 1 TB or more.

Figure 16:
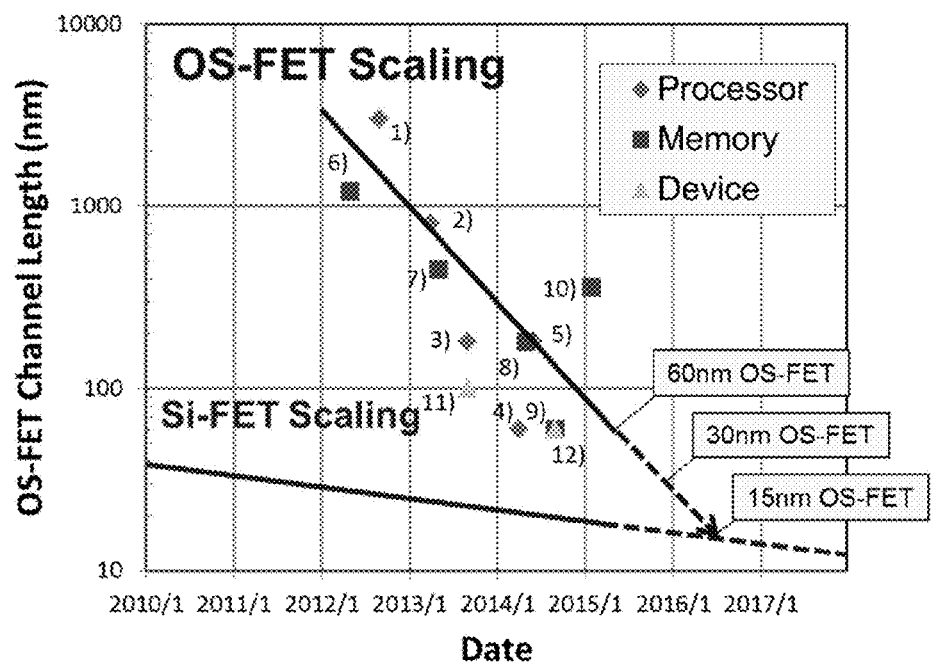
FIG. 16 shows changes in channel length of an OS-FET.

FIG. 16 shows a change in channel length of OS-FETs based on Non-Patent Documents 1 to 12. In FIGS. 16, 1) to 12) respectively denote the channel lengths of OS-FETs disclosed in Non-Patent Documents 1 to 12. From FIG. 16, the scaling of OS-FETs is such that the channel length is reduced by half every six months. For comparison, FIG. 16 also shows an example of Si transistors (hereinafter referred to as Si-FETs). The OS-FETs are miniaturized in a shorter period than the Si-FETs. FIG. 16 also reveals that the channel length of OS-FETs can reach that of Si-FETs in 2016.

In Embodiment 1, one embodiment of the present invention has been described. Other embodiments of the present invention will be described in Embodiments 2 to 6. Note that one embodiment of the present invention is not limited thereto. In other words, various embodiments of the invention are described in this embodiment and the other embodiments, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited thereto. Depending on the circumstances or conditions, a variety of semiconductors may be used for transistors in one embodiment of the present invention, the channel formation regions of the transistors, the source and drain regions of the transistors, and the like. Depending on the circumstances or conditions, transistors in one embodiment of the present invention, the channel formation regions of the transistors, the source and drain regions of the transistors, and the like may include, for example, at least one of silicon, germanium, silicon germanium, silicon carbide, gallium arsenide, aluminum gallium arsenide, indium phosphide, gallium nitride, and an organic semiconductor. Depending on the circumstances or conditions, transistors in one embodiment of the present invention, the channel formation regions of the transistors, the source and drain regions of the transistors, and the like do not necessarily include an oxide semiconductor.

This embodiment can be combined with any of the other embodiments in this specification as appropriate.

(Embodiment 2)

In this embodiment, application examples of the semiconductor device 200 and the semiconductor device 400 are described. The semiconductor device 200 and the semiconductor device 400 can be applied to, for example, storage devices of electronic devices (e.g., information terminals, smartphones, e-book readers, digital cameras (including video cameras), video recording/reproducing devices, and navigation systems). Alternatively, the semiconductor device 200 and the semiconductor device 400 are applied to removable memory devices such as memory cards (e.g., SD cards), universal serial bus (USB) memories, and solid state drives (SSD). FIGS. 17A to 17E schematically illustrate some structure examples of removable memory devices.

FIG. 17A is a schematic view of a USB memory. A USB memory 1100 includes a housing 1101, a cap 1102, a USB connector 1103, and a substrate 1104. The substrate 1104 is held in the housing 1101. The substrate 1104 includes circuits included in the semiconductor device 200 or the semiconductor device 400. For example, a memory chip 1105 and a controller chip 1106 are attached to the substrate 1104. The semiconductor device 200 or the semiconductor device 400 is incorporated in the memory chip 1105. A processor that controls the USB memory 1100, a work memory that temporarily retains data, an error check and correct (ECC) circuit, and the like are incorporated in the controller chip 1106. The USB connector 1103 corresponds to an interface for connection to an external device.

FIG. 17B is a schematic external view of an SD card, and FIG. 17C is a schematic view illustrating the internal structure of the SD card. An SD card 1110 includes a housing 1111, a connector 1112, and a substrate 1113. The connector 1112 corresponds to an interface for connection to an external device. The substrate 1113 is held in the housing 1111. The substrate 1113 includes circuits included in the semiconductor device 200 or the semiconductor device 400. For example, a memory chip 1114 and a controller chip 1115 are attached to the substrate 1113. The semiconductor device 200 or the semiconductor device 400 is incorporated in the memory chip 1114. A processor that controls the SD card 1110, a work memory that temporarily retains data, an ECC circuit, and the like are incorporated in the controller chip 1115.

When the memory chip 1114 is also provided on a back side of the substrate 1113, the capacity of the SD card 1110 can be increased. In addition, a wireless chip with a radio communication function may be provided on the substrate 1113. With such a wireless chip, the memory chip 1114 can read and write data by radio communication between an information processing terminal such as a personal computer and the SD card 1110.

FIG. 17D is a schematic external view of an SSD, and FIG. 17E is a schematic view illustrating the internal structure of the SSD. An SSD 1150 includes a housing 1151, a connector 1152, and a substrate 1153. The connector 1152 corresponds to an interface for connection to an external device. The substrate 1153 is held in the housing 1151. The substrate 1153 includes circuits included in the semiconductor device 200 or the semiconductor device 400. For example, a memory chip 1154, a memory chip 1155, and a controller chip 1156 are attached to the substrate 1153. The semiconductor device 200 or the semiconductor device 400 is incorporated in the memory chip 1154. When the memory chip 1155 is also provided on a back side of the substrate 1153, the capacity of the SSD 1150 can be increased. A work memory that temporarily retains data is incorporated in the memory chip 1155. For example, a DRAM chip may be used as the memory chip 1155. A processor that controls the SSD, an ECC circuit, and the like are incorporated in the controller chip 1156. A memory functioning as the work memory may also be provided in the controller chip 1156.

This embodiment can be combined with any of the other embodiments in this specification as appropriate.

(Embodiment 3)

In this embodiment, an electronic device in which a host device is combined with a memory device including the semiconductor device 200 or the semiconductor device 400 is described.

<Structure Example of Electronic Device>

Figure 18:
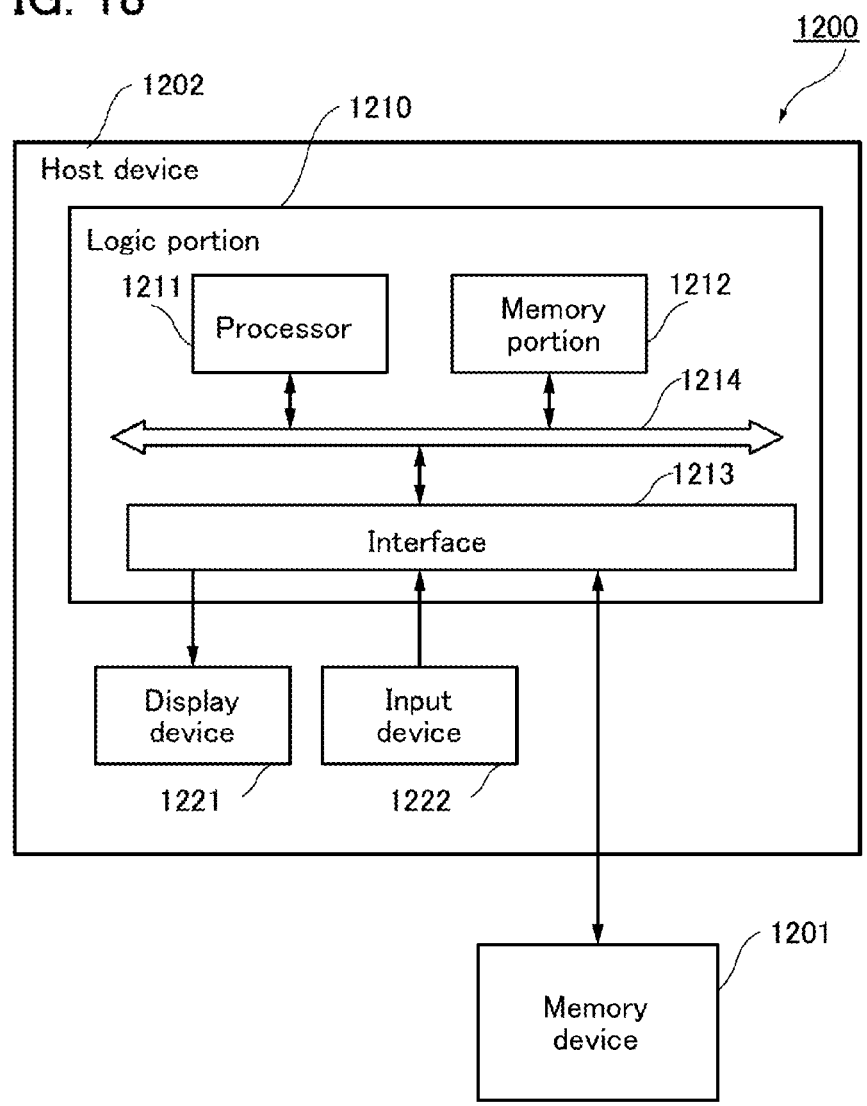
FIG. 18 is a block diagram illustrating a configuration example of an electronic device.

FIG. 18 is a block diagram illustrating a configuration example of an electronic device. An electronic device 1200 includes a memory device 1201 and a host device 1202.

The semiconductor device 200 or the semiconductor device 400 in Embodiment 1 can be applied to the memory device 1201. The memory device 1201 is used as, for example, a storage device of the host device 1202 and stores data such as a program, image data, or audio data.

The host device 1202 includes a logic portion 1210, a display device 1221, and an input device 1222.

The logic portion 1210 has a function of controlling the entire host device 1202. The logic portion 1210 includes a processor 1211, a memory portion 1212, an interface 1213, and a bus 1214. The processor 1211, the memory portion 1212, and the interface 1213 are connected to one another through the bus 1214. The processor 1211 functions as an arithmetic unit and a controller and controls the entire operation of each device in the host device 1202 in accordance with a program such as firmware. A CPU, a microprocessor (MPU), or the like can be used as the processor 1211. The memory portion 1212 stores a program executed by the processor 1211, data processed by the processor 1211, or the like.

The logic portion 1210 communicates with the display device 1221, the input device 1222, and the memory device 1201 through the interface 1213. For example, an input signal from the input device 1222 is transmitted to the logic portion 1210 through the interface 1213 and the bus 1214.

The display device 1221 is provided as an output device and constitutes a display portion of the electronic device 1200. The host device 1202 may include another output device such as a speaker or a printer in addition to the display device 1221. Alternatively, the host device 1202 does not necessarily include the display device 1221.

The input device 1222 is a device for inputting data to the logic portion 1210. A user can operate the electronic device 1200 by operating the input device 1222. Various human interfaces can be used as the input device 1222, and the electronic device 1200 may include a plurality of the input devices 1222.

A touch sensor, a keyboard, a mouse, an operation button, a microphone (an audio input device), a camera (an imaging system), or the like can be used as the input device 1222. The electronic device 1200 may be operated with devices incorporated in the host device 1202 that detects sound, eye movement, gesture, or the like. For example, in the case where a touch sensor is provided as the input device 1222, this touch sensor may be incorporated in the display device 1221.

In the electronic device 1200, the memory device 1201 and the host device 1202 may be put in one housing or may be formed using a plurality of devices connected to each other with or without a wire. For example, examples of the former include a laptop personal computer (PC), a tablet information terminal, an e-book reader, a smartphone, a cellular phone, an audio terminal, and a video recording/reproducing device. Examples of the latter include a set of a desktop PC, a keyboard, a mouse, and a monitor. In addition, for example, there are an audiovisual (AV) system that includes a video recording/reproducing device, an audio device (e.g., a speaker or an amplifier), and a television set, and a monitor system that includes a surveillance camera, a display device, and a video recording storage device.

<Electronic Component>

Figure 19A:
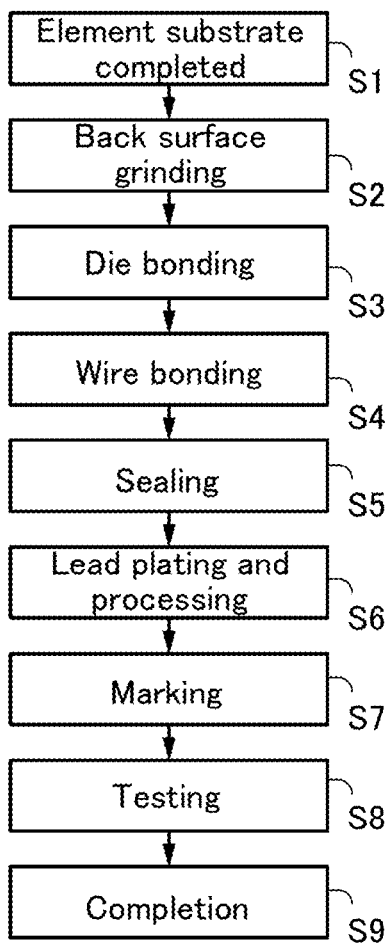
FIG. 19A is a flow chart showing an example of a method for manufacturing an electronic component.

FIG. 19A shows an example where the memory device described in Embodiment 1 is used as an electronic component. Note that the electronic component is also referred to as semiconductor package or IC package. This electronic component has various standards and names corresponding to the direction of terminals or the shape of terminals; hence, one example of the electronic component is described in this embodiment.

A semiconductor device including the transistors described in Embodiment 1 is completed through an assembly process (post-process) of integrating detachable components on a printed circuit board.

The post-process can be completed through the steps in FIG. 19A. Specifically, after an element substrate obtained in the pre-process is completed (Step S1), a back surface of the substrate is ground (Step S2). The substrate is thinned in this step to reduce substrate warpage or the like caused in the pre-process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step S3). In the die bonding step, the chip is bonded to the lead frame by an appropriate method depending on products, for example, bonding with a resin or a tape. Note that in the die bonding step, a chip may be placed on and bonded to an interposer.

Note that in this embodiment, when an element is formed on a surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed circuit board in a later step.

Next, printing (marking) is performed on a surface of the package (Step S7). After a final testing step (Step S8), the electronic component is completed (Step S9).

The above electronic component can include the memory device described in Embodiment 1. Thus, a highly reliable electronic component can be obtained.

Figure 19B:
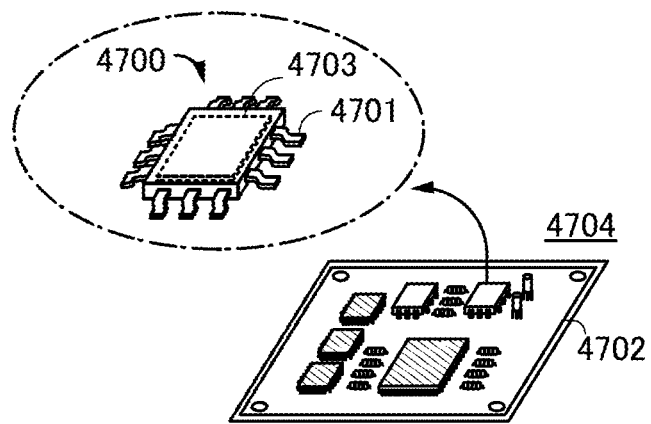
FIG. 19B is a perspective view illustrating an example of an electronic component.

FIG. 19B is a schematic perspective diagram illustrating a quad flat package (QFP) as an example of the completed electronic component. An electronic component 4700 in FIG. 19B includes a lead 4701 and a circuit portion 4703. The electronic component 4700 in FIG. 19B is mounted on a printed circuit board 4702, for example. A plurality of the electronic components 4700 which are combined and electrically connected to each other over the printed circuit board 4702 can be mounted on the above-described electronic device. A completed circuit board 4704 is provided in an electronic device or the like.

<Specific Example of Electronic Device>

Next, specific examples of an electronic device including the aforementioned electronic component will be described.

FIGS. 20A to 20F schematically illustrate some specific examples of the electronic device 1200. The memory device 1201 is mounted on a housing of each of the electronic devices in FIGS. 20A to 20F.

Figure 20A:
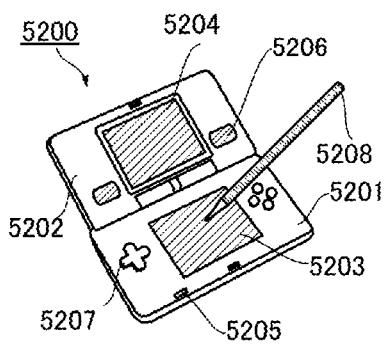
FIGS. 20A to 20F illustrate electronic devices.

A portable game machine 5200 in FIG. 20A includes a first housing 5201, a second housing 5202, a display portion 5203, a display portion 5204, a microphone 5205, speakers 5206, an operation button 5207, a stylus 5208, and the like.

Figure 20B:
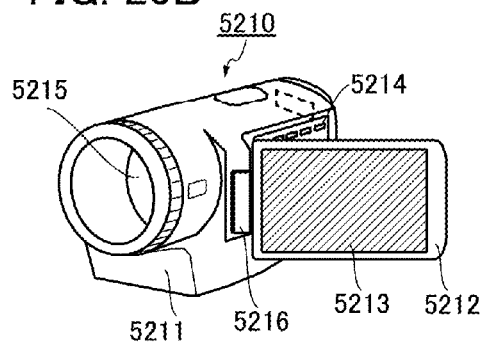

A video camera 5210 in FIG. 20B includes a first housing 5211, a second housing 5212, a display portion 5213, operation buttons 5214, a lens 5215, a joint 5216, and the like. The operation buttons 5214 and the lens 5215 are provided in the first housing 5211, and the display portion 5213 is provided in the second housing 5212. The first and second housings 5211 and 5212 are connected to each other with the joint 5216, and an angle between the first and second housings 5211 and 5212 can be changed with the joint 5216. An image on the display portion 5213 may be switched depending on the angle between the first and second housings 5211 and 5212 at the joint 5216.

Figure 20C:
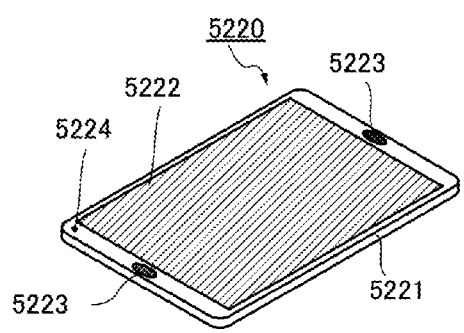

A tablet information terminal 5220 in FIG. 20C includes a display portion 5222 incorporated in a housing 5221, operation buttons 5223, and a speaker 5224.

Figure 20D:
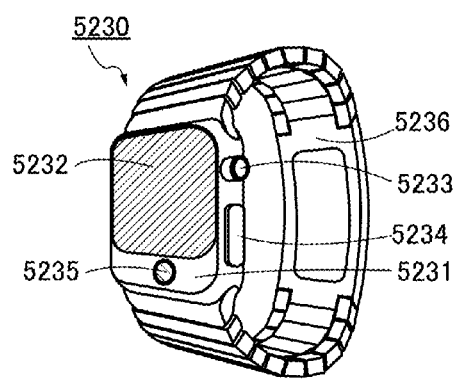

A wrist-watch-type information terminal 5230 in FIG. 20D is a kind of wearable computer and includes a housing 5231, a display portion 5232, a first operation key 5233, a second operation key 5234, a third operation key 5235, and a belt 5236. The display portion 5232, the first operation key 5233, the second operation key 5234, the third operation key 5235, and the belt 5236 are provided for the housing 5231. The wrist-watch-type information terminal is not limited to the structure example in FIG. 20D and any function may be added or omitted to change the structure. For example, the display portion 5232 may have a touch sensor function so that operation can be performed by touching the display portion 5232. Furthermore, the third operation key 5235 may be provided with a fingerprint recognizer to prevent operation by an unauthorized person.

Figure 20E:
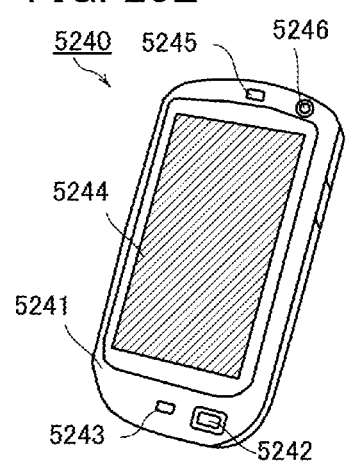

A smartphone 5240 in FIG. 20E includes a housing 5241, an operation button 5242, a microphone 5243, a display portion 5244, a speaker 5245, a camera lens 5246, and the like. An imaging device is incorporated in the housing 5241. Since the camera lens 5246 is provided on the same plane as the display portion 5244, videophone is possible. An LCD with a touch sensor function is used as the display portion 5244.

Figure 20F:
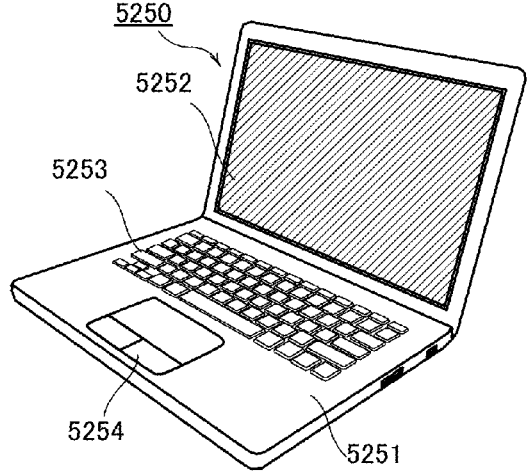

A laptop PC 5250 in FIG. 20F includes a housing 5251, a display portion 5252, a keyboard 5253, a pointing device 5254, and the like.

When a flexible substrate (e.g., a resin film) is used as the substrate of a display panel included in the display device 1221 in the electronic device 1200, the display device 1221 can be bent. Therefore, the electronic device 1200 can be used in a folded state or a bent state. FIGS. 21A to 21G schematically illustrate some information terminals as specific examples of the electronic device 1200 in such a mode.

Figure 21A:
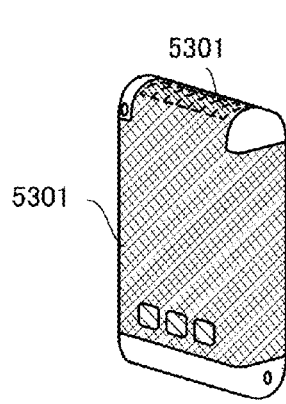
FIGS. 21A to 21G are schematic views illustrating structure examples of information terminals.
Figure 21B:
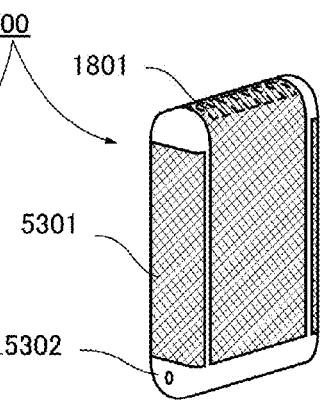
Figure 21C:
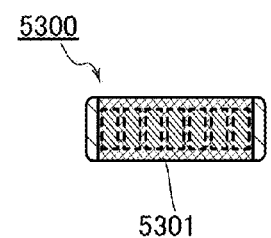

An information terminal 5300 in FIGS. 21A to 21C includes display portions 5301 and a housing 5302 that supports the display portions 5301. The display portion 5301 in a bent state is supported by the housing 5302 so that information can be displayed on a side surface and a top surface of the information terminal 5300. A touch sensor is incorporated in the display portion 5301 and functions as an input/output device. Depending on a region of the display portion 5301 that is touched by a user, operation of the information terminal 5300 can be varied. For example, depending on touch operation of a side surface, a top surface, or a front surface of the information terminal 5300, the information terminal 5300 may execute different processing.

Figure 21D:
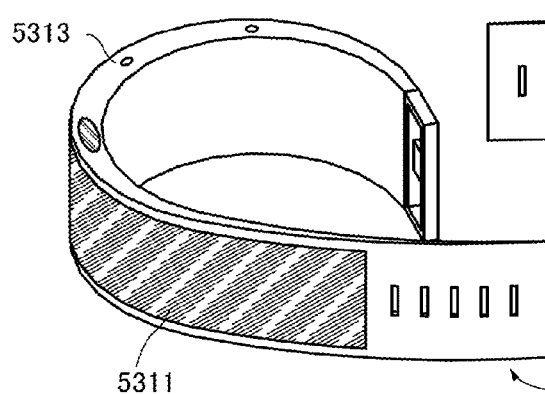
Figure 21E:
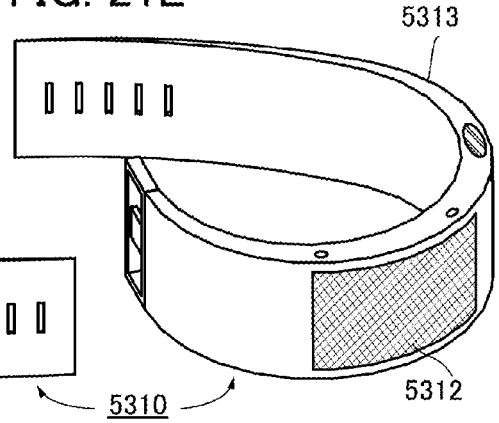

An information terminal 5310 in FIGS. 21D and 21E includes a display portion 5311, a display portion 5312, and a belt-like housing 5313. The housing 5313 supports the display portions 5311 and 5312. Since the housing 5313 is flexible, a user can use the information terminal 5310 while mounting the information terminal 5310 on an arm or the like.

Figure 21F:
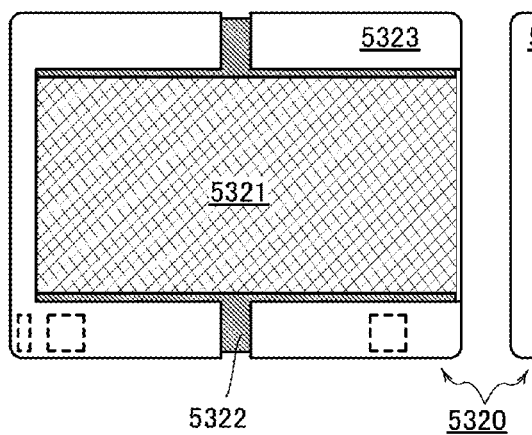
Figure 21G:
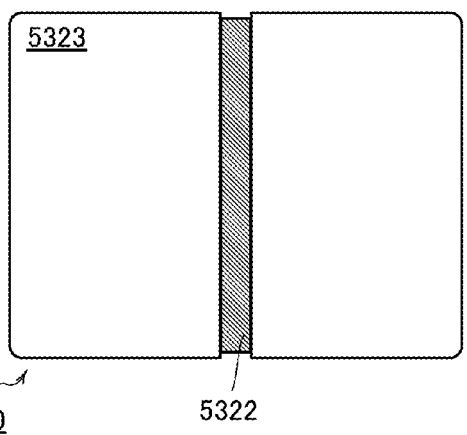

An information terminal 5320 in FIGS. 21F and 21G includes a display portion 5321, a housing 5322, and a housing 5323. The display portion 5301 and the housing 5322 are flexible. Therefore, the information terminal 5320 can be folded in half at the housing 5322.

Next, an application example of a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be employed, for example.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes, for example, at least one of an electroluminescence (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using micro electro mechanical systems (MEMS), such as a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display, quantum dots, and the like. Other than the above, a display medium whose contrast, luminance, reflectance, transmittance, or the like is changed by electrical or magnetic effect may be included in the display element, display device, light-emitting element, or light-emitting device. Examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In a display element including micro electro mechanical systems (MEMS), a drying agent may be provided in a space where a display element is sealed (or between an element substrate over which the display element is placed and a counter substrate opposed to the element substrate, for example). Providing a drying agent can prevent malfunction or degradation of the MEMS and the like due to moisture or the like.

This embodiment can be combined with any of the other embodiments in this specification as appropriate.

(Embodiment 4)

A configuration example of a memory device of one embodiment of the present invention including a peripheral circuit will be described with reference to FIG. 22.

Figure 22:
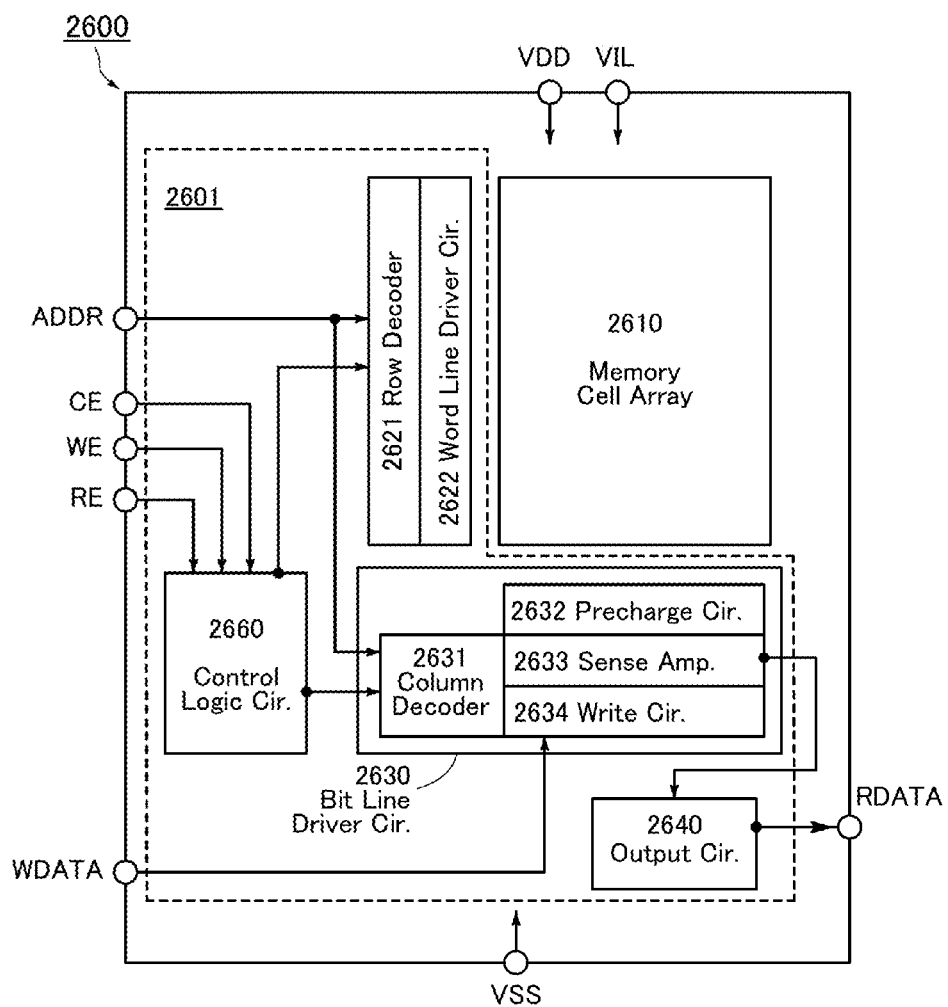
FIG. 22 is a block diagram illustrating an example of a memory device.

FIG. 22 illustrates a configuration example of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The bit line driver circuit 2630 includes a column decoder 2631, a precharge circuit 2632, a sense amplifier 2633, and a write circuit 2634. The precharge circuit 2632 has a function of precharging the wiring RBL, the wiring SL, the wiring CL1, and the wiring CL2 described in Embodiment 1 (these wirings are not illustrated in FIG. 22). The sense amplifier 2633 has a function of amplifying a data signal read from the wiring RBL. The amplified data signal is output as a digital data signal RDATA from the memory device 2600 through the output circuit 2640.

As power source voltages, a low power source voltage (VSS), a high power source voltage (VDD) for the peripheral circuit 2601, and a high power source voltage (VIL) for the memory cell array 2610 are supplied to the memory device 2600 from the outside.

Control signals (CE, WE, and RE), an address signal ADDR, and a data signal WDATA are input to the memory device 2600 from the outside. The address signal ADDR is input to the row decoder 2621 and the column decoder 2631, and the data signal WDATA is input to the write circuit 2634.

The control logic circuit 2660 processes the signals (CE, WE, RE) input from the outside, and generates control signals for the row decoder 2621 and the column decoder 2631. CE, WE, and RE are a chip enable signal, a write enable signal, and a read enable signal, respectively. Signals processed by the control logic circuit 2660 are not limited to those listed above, and other control signals may be input as necessary.

Note that whether each of the aforementioned circuits or signals is provided can be determined as appropriate and as needed.

When a p-channel Si transistor and a transistor including a channel formation region using an oxide semiconductor (preferably an oxide containing In, Ga, and Zn) described in a later embodiment are used in the memory device 2600, the memory device 2600 can be reduced in size. In addition, the memory device 2600 can be reduced in power consumption. Furthermore, the memory device 2600 can be increased in operation speed. In particular, by using only a p-channel transistor as the Si-transistor, manufacturing costs can be reduced.

Note that the configuration of this embodiment is not limited to that illustrated in FIG. 22. Depending on the circumstances or conditions, the structure of the memory device 2600 may be changed. For example, in the case where any of the memory cell set 100, the memory cell set 120, and the memory cell set 130 shown in Embodiment 1 is used for the memory device 2600, the number of wirings and the configuration of the peripheral circuit may be changed as appropriate in accordance with the kind of the memory cell.

This embodiment can be combined with any of the other embodiments in this specification as appropriate.

(Embodiment 5)

Described in this embodiment are transistors of one embodiment of the disclosed invention.

Transistors of one embodiment of the present invention each preferably include an nc-OS or a CAAC-OS, which are described in Embodiment 6.

<Structure Example 1 of Transistor>

Figure 23A:
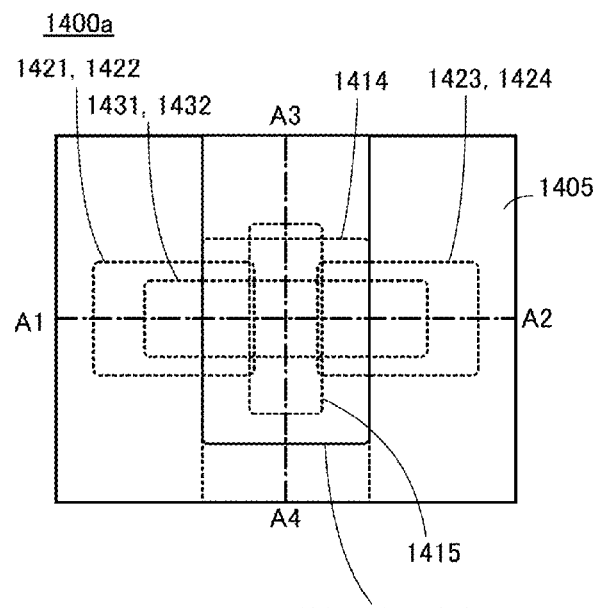
FIG. 23A is a top view and FIGS. 23B and 23C are cross-sectional views illustrating a structure example of a transistor.
Figures 23B, 23C:
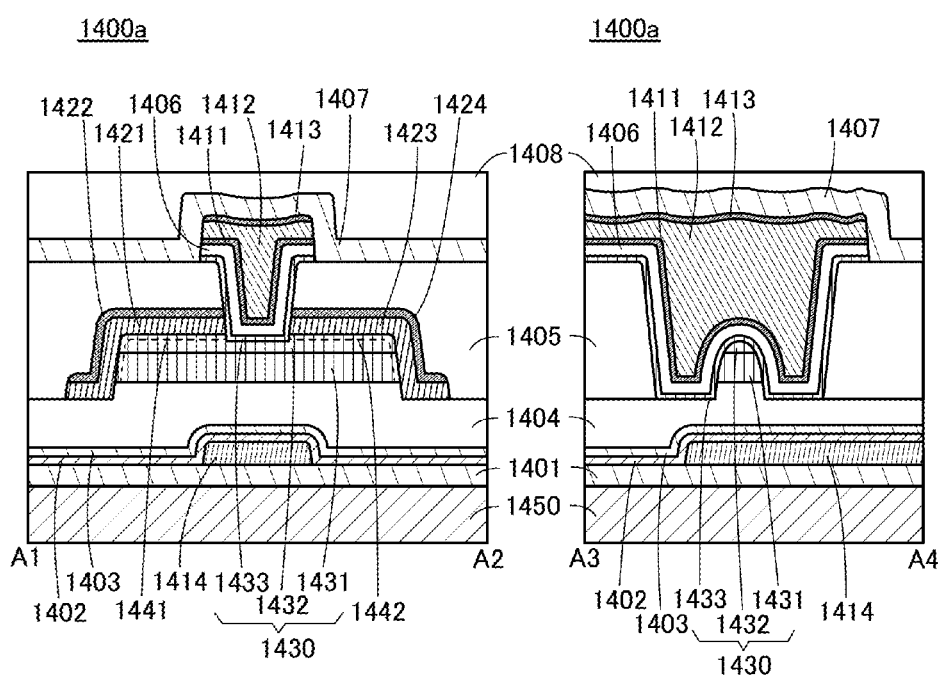

FIGS. 23A to 23C are a top view and cross-sectional views of a transistor 1400a. FIG. 23A is a top view. FIG. 23B is a cross-sectional view taken along dashed-dotted line A1-A2 in FIG. 23A and FIG. 23C is a cross-sectional view taken along dashed-dotted line A3-A4 in FIG. 23A. Note that for simplification of the drawing, some components are not illustrated in the top view in FIG. 23A. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450, an insulating film 1401 over the substrate 1450, a conductive film 1414 over the insulating film 1401, an insulating film 1402 covering the conductive film 1414, an insulating film 1403 over the insulating film 1402, an insulating film 1404 over the insulating film 1403, a metal oxide 1431 and a metal oxide 1432 which are stacked in this order over the insulating film 1404, a conductive film 1421 touching top and side surfaces of the metal oxide 1432, a conductive film 1423 also touching top and side surfaces of the metal oxide 1432, a conductive film 1422 over the conductive film 1421, a conductive film 1424 over the conductive film 1423, an insulating film 1405 over the conductive films 1422 and 1424, a metal oxide 1433 touching the metal oxides 1431 and 1432, the conductive films 1421 to 1424, and the insulating film 1405, an insulating film 1406 over the metal oxide 1433, a conductive film 1411 over the insulating film 1406, a conductive film 1412 over the conductive film 1411, a conductive film 1413 over the conductive film 1412, an insulating film 1407 covering the conductive film 1413, and an insulating film 1408 over the insulating film 1407. Note that the metal oxides 1431 to 1433 are collectively referred to as a metal oxide 1430.

The metal oxide 1432 is a semiconductor and serves as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 serve as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 serve as one of source and drain electrodes of the transistor 1400a. The conductive films 1423 and 1424 serve as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

The conductive film 1424 is configured to allow less oxygen to pass therethrough than the conductive film 1423. It is thus possible to prevent a decrease in the conductivity of the conductive film 1423 due to oxidation.

The conductive films 1411 to 1413 serve as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 serves as a first gate insulating film of the transistor 1400a.

The conductive film 1414 serves as a second gate electrode of the transistor 1400a.

The potential applied to the conductive films 1411 to 1413 may be the same as or different from that applied to the conductive film 1414. The conductive film 1414 may be omitted in some cases.

The insulating films 1401 to 1404 serve as a base insulating film of the transistor 1400a. The insulating films 1402 to 1404 also serve as a second gate insulating film of the transistor 1400a.

The insulating films 1405 to 1408 serve as a protective insulating film or an interlayer insulating film of the transistor 1400a.

As shown in FIG. 23C, the side surface of the metal oxide 1432 is surrounded by the conductive film 1411. With this structure, the metal oxide 1432 can be electrically surrounded by an electric field of the conductive film 1411. Such a structure of a transistor in which a semiconductor is electrically surrounded by an electric field of a gate electrode is referred to as a surrounded channel (s-channel) structure. Since a channel is formed in the entire metal oxide 1432 (bulk) in the s-channel structure, a large amount of current can flow between a source and a drain of a transistor, increasing the on-state current of the transistor.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 1400a, a region serving as a gate electrode is formed so as to fill an opening 1415 formed in the insulating film 1405 or the like, that is, in a self-aligned manner.

As shown in FIG. 23B, the conductive films 1411 and 1422 have a region where they overlap with each other with the insulating film positioned therebetween. The conductive films 1411 and 1424 have a region where they overlap with each other with the insulating film positioned therebetween. These regions serve as the parasitic capacitance caused between the gate electrode and the source or drain electrode and might decrease the operation speed of the transistor 1400a. This parasitic capacitance can be reduced by providing the insulating film 1405 in the transistor 1400a. The insulating film 1405 preferably contains a material with a low relative dielectric constant.

Figure 24A:
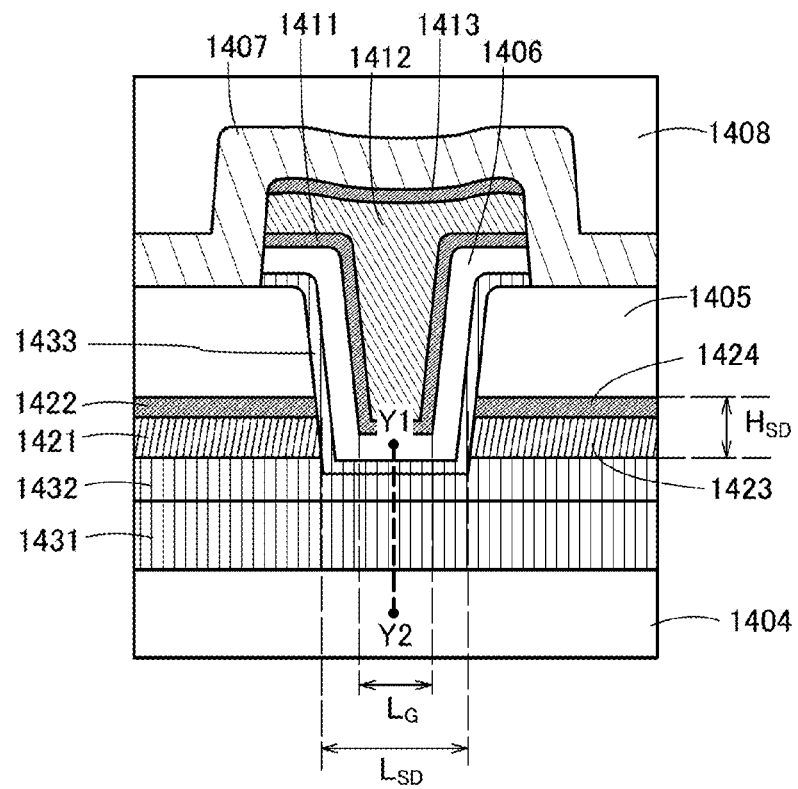
FIG. 24A is a cross-sectional view illustrating a structure example of a transistor and FIG. 24B is an energy band diagram of the transistor.

FIG. 24A is an enlarged view of the center of the transistor 1400a. In FIG. 24A, a width LG denotes the length of the bottom surface of the conductive film 1411, which faces parallel to the top surface of the metal oxide 1432 with the insulating film 1406 and the metal oxide 1433 positioned therebetween. The width LG is the line width of the gate electrode. In FIG. 24A, a width LSD denotes the length between the conductive films 1421 and 1423, i.e., the length between the source electrode and the drain electrode.

The width $L_{sd}$ is generally determined by the minimum feature size. As shown in FIG. 24A, the width $L_G$ is narrower than the width $L_{SD}$. This means that in the transistor 1400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 24A, a height $H_{SD}$ denotes the total thickness of the conductive films 1421 and 1422, or the total thickness of the conductive films 1423 and 1424.

The thickness of the insulating film 1406 is preferably less than or equal to the height $H_{SD}$, in which case the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three times or more, and further preferably five times or more the thickness of the insulating film 1406, in which case the parasitic capacitance is negligibly small. As a result, the transistor 1400*a* can operate at high frequencies.

Components of the transistor 1400*a* will be described below.

<<Metal Oxide Layer>>

First, a metal oxide that can be used as the metal oxides 1431 to 1433 will be described.

The transistor 1400*a* preferably has a low current (off-state current) flowing between a source and a drain when the transistor 1400*a* is in an off state. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of these elements may be used in combination as the element M The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The metal oxide 1432 is preferably a CAAC-OS film which is described later.

The metal oxides 1431 and 1433 include, for example, one or more elements other than oxygen included in the metal oxide 1432. Since the metal oxides 1431 and 1433 include one or more elements other than oxygen included in the metal oxide 1432, an interface state is less likely to be formed at an interface between the metal oxides 1431 and 1432 and an interface between the metal oxides 1432 and 1433.

In the case of using an In—M—Zn oxide as the metal oxide 1431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 1431 is formed by a sputtering method, a sputtering target with the above composition is preferably used. For example, In: M: Zn is preferably 1:3:2 or 1:3:4.

In the case of using an In—M—Zn oxide as the metal oxide 1432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 1432 is formed by a sputtering method, a sputtering target with the above composition is preferably used. For example, In: M: Zn is preferably 1:1:1, 1:1:1.2, 2:1:3, 3:1:2, or 4:2:4.1. In particular, when a sputtering target with an atomic ratio of In to Ga to Zn of 4:2:4.1 is used, the atomic ratio of In to Ga to Zn in the metal oxide 1432 may be 4:2:3 or in the neighborhood of 4:2:3.

In the case of using an In—M—Zn oxide as the metal oxide 1433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In: M: Zn is preferably 1:3:2 or 1:3:4. The metal oxide 1433 may be a metal oxide that is of the same type as the metal oxide 1431.

The metal oxide 1431 or the metal oxide 1433 does not need to contain indium in some cases. For example, the metal oxide 1431 or the metal oxide 1433 may be gallium oxide.

Figure 24B:
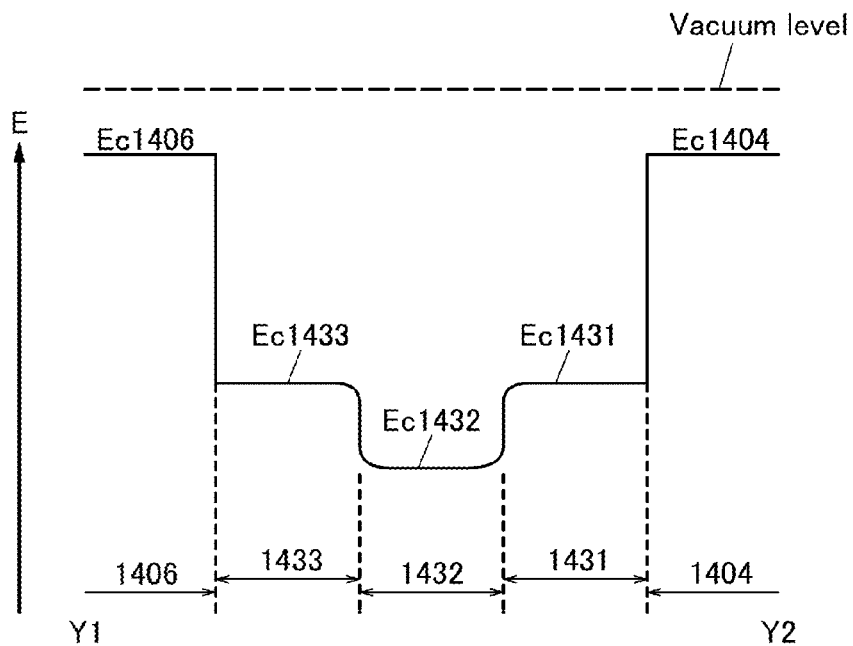

The function and effect of the metal oxide 1430, which includes a stack of the metal oxides 1431 to 1433, are described with reference to the energy band diagram of FIG. 24B. FIG. 24B shows an energy band structure of a portion taken along dashed line Y1-Y2 in FIG. 24A, that is, FIG. 24B shows the energy band structure of a channel formation region of the transistor 1400*a* and the vicinity thereof.

In FIG. 24B, Ec1404, Ec1431, Ec1432, Ec1433, and Ec1406 indicate the energy at the bottom of the conduction band of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having higher electron affinity than those of the metal oxides 1431 and 1433. For example, as the metal oxide 1432, a metal oxide having an electron affinity higher than those of the metal oxides 1431 and 1433 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity is an energy gap between the vacuum level and the bottom of the conduction band.

An indium gallium oxide has a low electron affinity and a high oxygen-blocking property. Therefore, the metal oxide 1433 preferably includes an indium gallium oxide. The gallium atomic ratio [Ga/(In+Ga)] is, for example, higher than or equal to 70%, preferably higher than or equal to 80%, and more preferably higher than or equal to 90%.

At this time, when a gate voltage is applied, a channel is formed in the metal oxide 1432 having the highest electron affinity among the metal oxides 1431 to 1433.

Thus, electrons move mainly in the metal oxide 1432, not in the metal oxides 1431 and 1433. Hence, the on-state current of the transistor hardly varies even when the density of interface states, which inhibit electron movement, is high at the interface between the metal oxide 1431 and the insulating film 1404 or at the interface between the metal oxide 1433 and the insulating film 1406. The metal oxides 1431 and 1433 function as an insulating film.

In some cases, there is a mixed region of the metal oxides 1431 and 1432 between the metal oxides 1431 and 1432. Furthermore, in some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-sate current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 1432 (a formation surface; here, the top surface of the metal oxide 1431) is less than 1 nm, preferably less than 0.6 nm, more preferably less than 0.5 nm, still more preferably less than 0.4 nm. The average surface roughness (Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. The RMS roughness, Ra, and P–V can be measured with, for example, a scanning probe microscope SPA-500 manufactured by SII Nano Technology Inc.

The electron movement is also inhibited in the case where the density of defect states is high in the channel formation region. For example, in the case where the metal oxide 1432 contains oxygen vacancies (Vo), donor levels are formed by entry of hydrogen into sites of oxygen vacancies in some cases. A state in which hydrogen enters sites of oxygen vacancies is denoted by VoH in the following description in some cases. VoH is a factor of decreasing the on-state current of the transistor because VoH scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having an oxygen-transmitting property (a layer through which oxygen passes or is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, more preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm, more preferably greater than or equal to 2 nm. The metal oxide 1433 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 1432 and 1431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxides 1432 and 1433. The concentration of silicon is preferably higher than or equal to $1\times10^{16}$ atoms/cm$^3$ and lower than $5\times10^{18}$ atoms/ cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without the metal oxide 1431 or 1433 may be employed. Alternatively, any one of the semiconductors shown as examples of the metal oxides 1431 to 1433 may be provided over or under the metal oxide 1431 or over or under the metal oxide 1433, i.e., a four-layer structure may be employed. Further alternatively, an n-layer structure (n is an integer of 5 or more) in which any one of the semiconductors shown as examples of the metal oxides 1431 to 1433 is provided at two or more of the following positions may be employed: over the metal oxide 1431, under the metal oxide 1431, over the metal oxide 1433, and under the metal oxide 1433.

<<Substrate>>

As the substrate 1450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 1450. As a method for providing a transistor over a flexible substrate, there is a method in which a transistor is formed over a non-flexible substrate, and then the transistor is separated and transferred to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 1450 has small thickness, the weight of the semiconductor device can be reduced. When the substrate 1450 has small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulating Film>>

The insulating film 1401 has a function of electrically isolating the substrate 1450 from the conductive film 1414.

The insulating film 1401 or 1402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 1402 may be formed using silicon oxide with high step coverage which is formed by reacting tetraethyl orthosilicate (TEOS), silane, or the like with oxygen, nitrous oxide, or the like.

After the insulating film 1402 is formed, the insulating film 1402 may be subjected to planarization treatment using a CMP method or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen more than that in the stoichiometric composition. Part of oxygen is released by heating from an oxide film containing oxygen more than that in the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen in excess of that in the stoichiometric composition is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. These two methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 1404 is formed, the insulating film 1404 may be subjected to planarization treatment using a CMP method or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. Providing the insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

<<Gate Electrode>>

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

<<Source Electrode and Drain Electrode>>

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Low-resistance Region>>

The regions 1441 and 1442 are formed when, for example, the conductive films 1421 and 1423 take oxygen from the metal oxides 1431 and 1432. Oxygen is more likely to be extracted at higher temperatures. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

<<Gate Insulating Film>>

The insulating film 1406 preferably contains an insulator with a high relative dielectric constant. For example, the insulating film 1406 preferably contains gallium oxide, hafnium oxide, an oxide containing aluminum and hafnium, an oxynitride containing aluminum and hafnium, an oxide containing silicon and hafnium, or an oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. Providing the insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 1407 because it is highly effective in preventing transmission of both oxygen and impurities such as hydrogen and moisture.

When the insulating film 1407 is formed by using plasma containing oxygen by a sputtering method, a CVD method, or the like, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused in the insulating films to reach the metal oxide 1430, whereby oxygen vacancies in the metal oxide 1430 can be reduced.

Figure 25A:
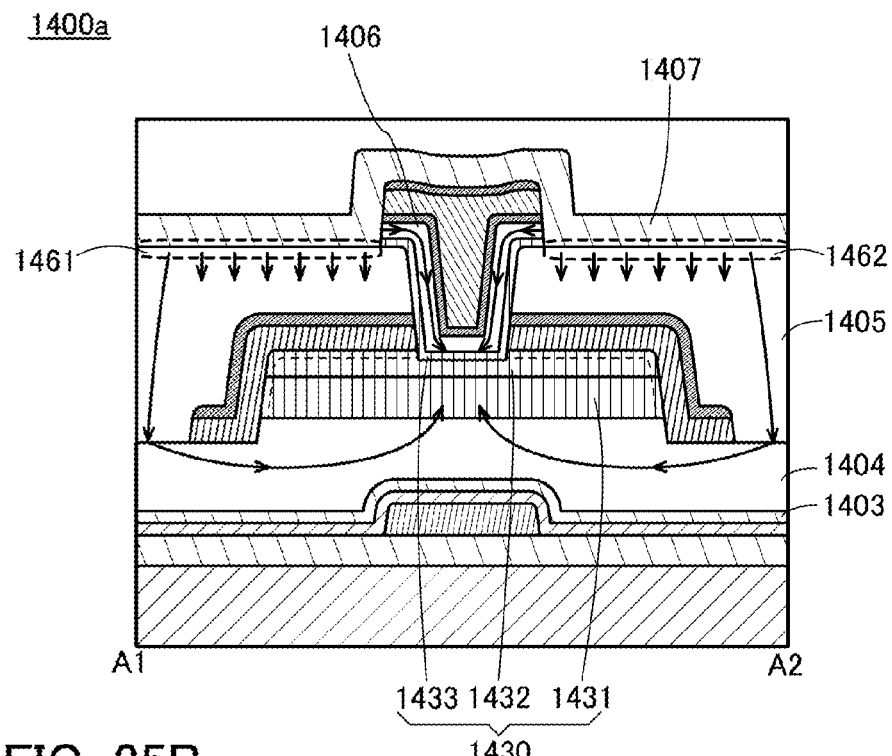
FIGS. 25A and 25B are cross-sectional views illustrating oxygen diffusion paths.
Figure 25B:
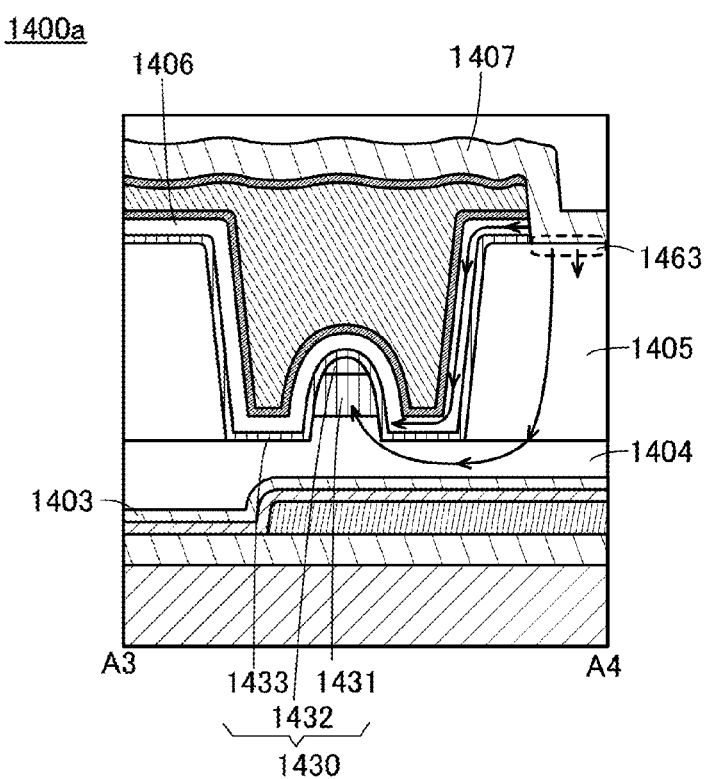

In schematic views of FIGS. 25A and 25B, oxygen added to the insulating films 1405 and 1406 in the formation of the insulating film 1407 is diffused in the insulating films through the second heat treatment and reaches the metal oxide 1430. In FIG. 25A, oxygen diffusion in the cross-sectional view of FIG. 23B is indicated arrows. In FIG. 25B, oxygen diffusion in the cross-sectional view of FIG. 23C is indicated by arrows.

As shown in FIGS. 25A and 25B, oxygen added to the side surface of the insulating film 1406 is diffused in the insulating film 1406 and reaches the metal oxide 1430. In addition, a region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused upward across the insulating film 1407. The insulating film 1403 also has a function of blocking oxygen and prevents oxygen from being diffused downward across the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 1404 can be inhibited. Note that the second heat treatment is not necessarily performed when heating during formation of the films can work as heat treatment comparable to the second heat treatment.

As described above, oxygen can be supplied to the metal oxide 1430 from above and below through the formation of the insulating film 1407 and the second heat treatment.

Alternatively, oxygen can be added to the insulating films 1405 and 1406 by forming a film containing indium oxide, e.g., an In—M—Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

<Structure Example 2 of Transistor>

The conductive film 1414 and the insulating films 1402 and 1403 can be omitted in the transistor 1400a shown in FIGS. 23A to 23C. An example of such a structure is shown in FIGS. 26A to 26C.

Figure 26A:
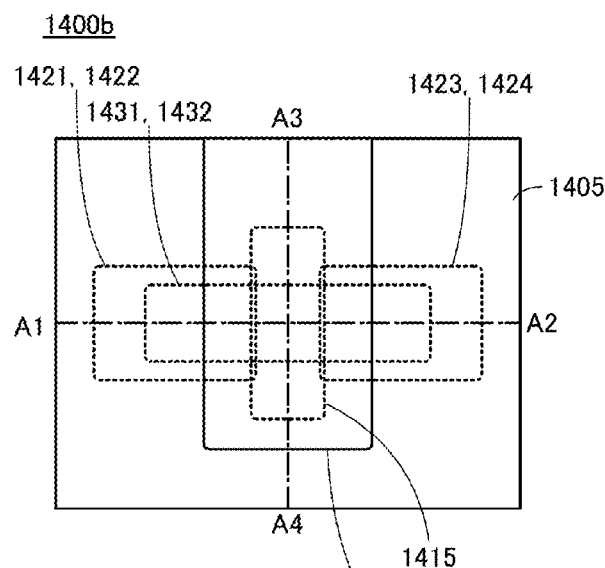
FIGS. 26A is a top view and FIGS. 26B and 26C are cross-sectional views illustrating a structure example of a transistor.
Figures 26B, 26C:
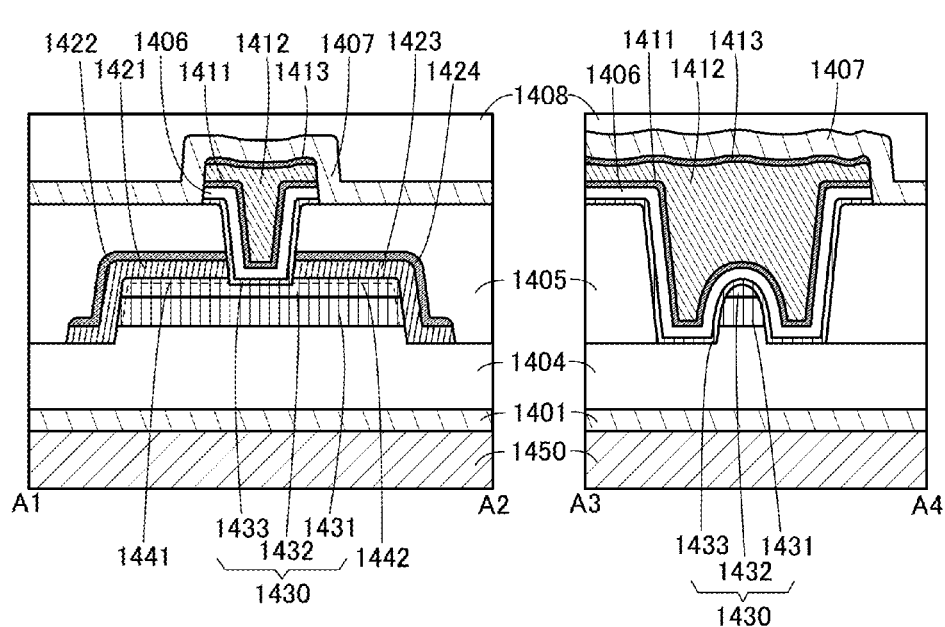

FIGS. 26A to 26C are a top view and cross-sectional views of a transistor 1400b. FIG. 26A is a top view. FIG. 26B is a cross-sectional view taken along dashed-dotted line A1-A2 in FIG. 26A and FIG. 26C is a cross-sectional view taken along dashed-dotted line A3-A4 in FIG. 26A. Note that for simplification of the drawing, some components are not illustrated in the top view in FIG. 26A. Note that the dashed-dotted line A1-A2 and the dashed-dotted line A3-A4 are sometimes referred to as a channel length direction of the transistor 1400b and a channel width direction of the transistor 1400b, respectively.

<Structure Example 3 of Transistor>

In the transistor 1400a shown in FIGS. 23A to 23C, parts of the conductive films 1421 and 1423 that overlap with the gate electrode (the conductive films 1411 to 1413) can be reduced in thickness. An example of such a structure is shown in FIGS. 27A to 27C.

Figure 27A:
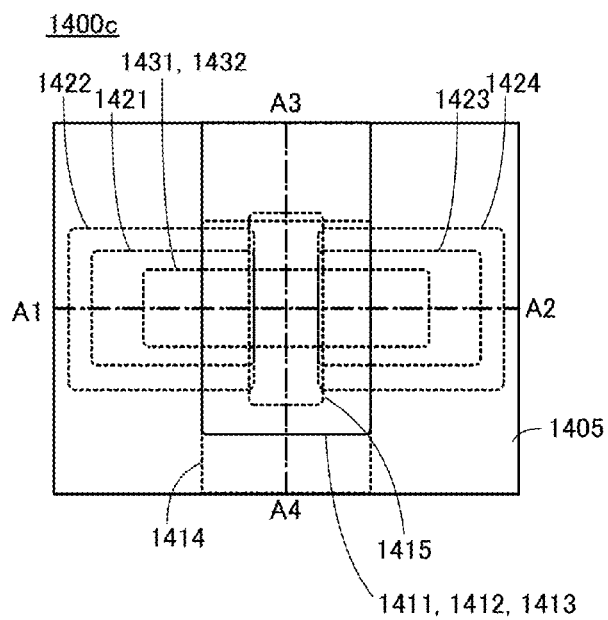
FIG. 27A is a top view and FIGS. 27B and 27C are cross-sectional views illustrating a structure example of a transistor.
Figure 27B:
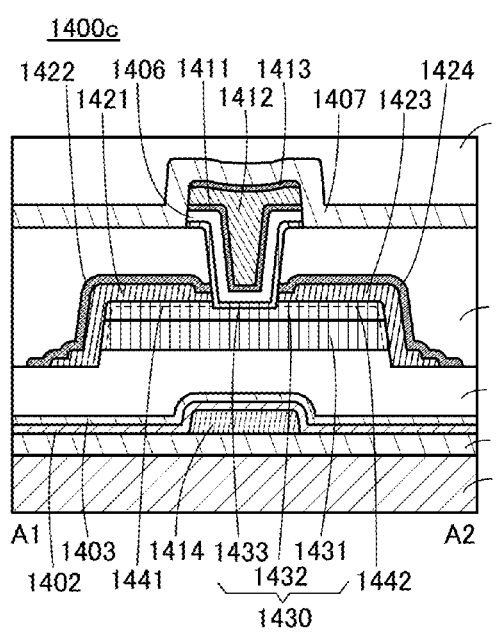
Figure 27C:
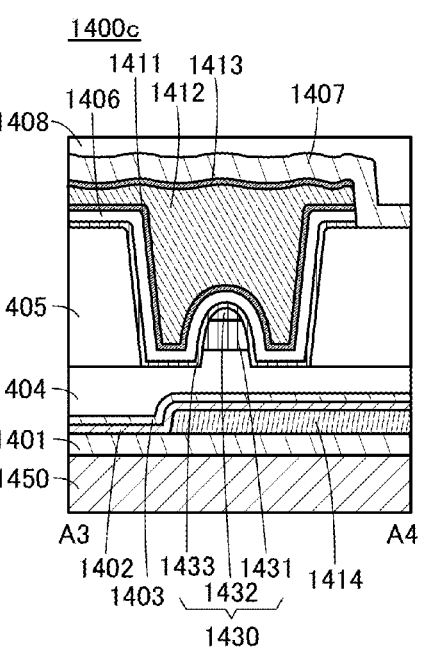

FIGS. 27A to 27C are a top view and cross-sectional views of a transistor 1400c. FIG. 27A is a top view. FIG. 27B is a cross-sectional view taken along dashed-dotted line A1-A2 in FIG. 27A and FIG. 27C is a cross-sectional view taken along dashed-dotted line A3-A4 in FIG. 27A. Note that for simplification of the drawing, some components are not illustrated in the top view in FIG. 27A. Note that the dashed-dotted line A1-A2 and the dashed-dotted line A3-A4 are sometimes referred to as a channel length direction of the transistor 1400c and a channel width direction of the transistor 1400c, respectively.

In the transistor 1400c shown in FIG. 27B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400c, which has the structure shown in FIG. 27B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

<Structure Example 4 of Transistor>

In the transistor 1400c shown in FIGS. 27A to 27C, the width of the metal oxides 1431 and 1432 can be increased in the A3-A4 direction. An example of such a structure is shown in FIGS. 28A to 28C.

Figure 28A:
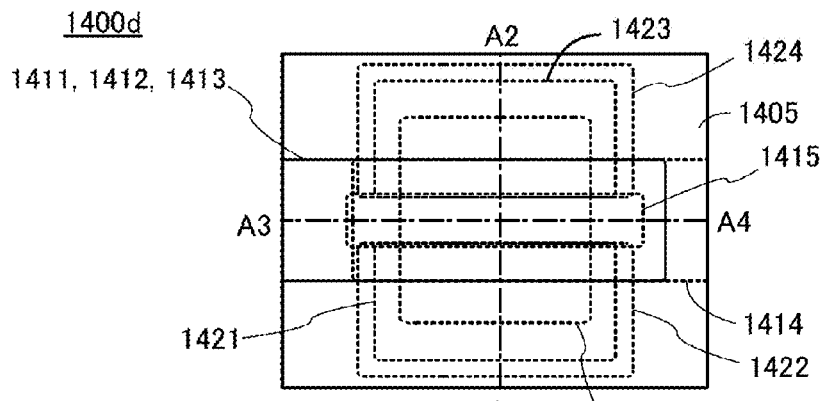
FIG. 28A is a top view and FIGS. 28B and 28C are cross-sectional views illustrating a structure example of a transistor.
Figure 28B:
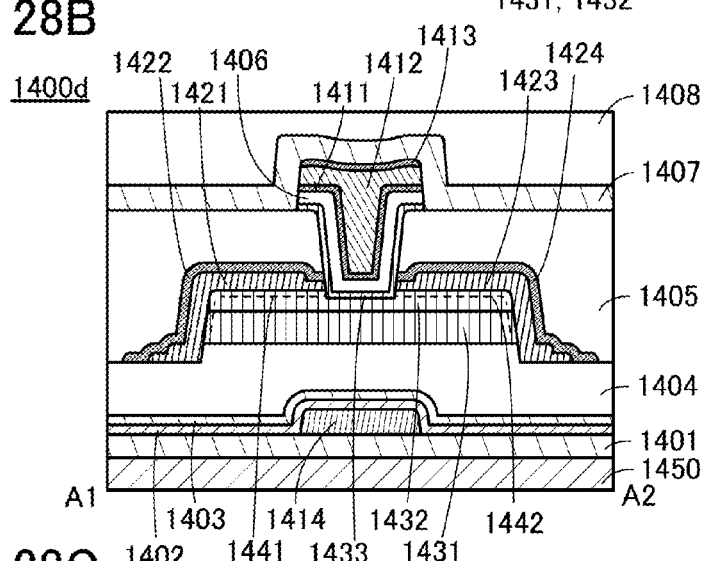
Figure 28C:
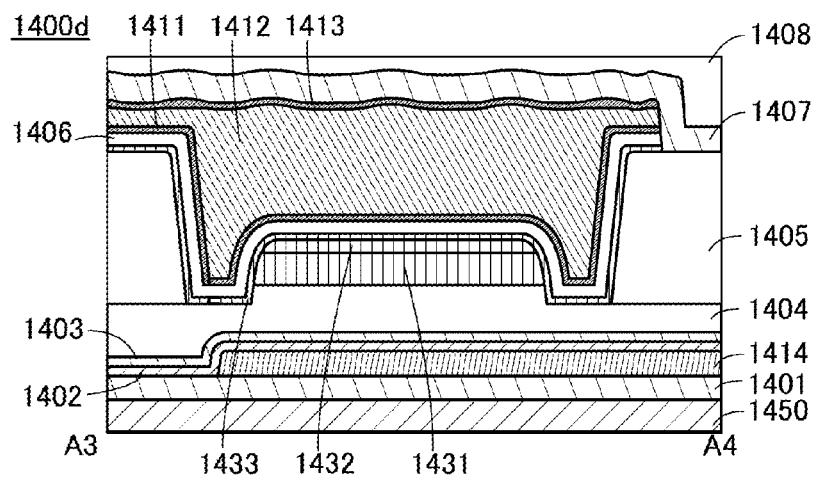

FIGS. 28A to 28C are a top view and cross-sectional views of a transistor 1400d. FIG. 28A is a top view. FIG. 28B is a cross-sectional view taken along dashed-dotted line A1-A2 in FIG. 28A and FIG. 28C is a cross-sectional view taken along dashed-dotted line A3-A4 in FIG. 28A. Note that for simplification of the drawing, some components are not illustrated in the top view in FIG. 28A. Note that the dashed-dotted line A1-A2 and the dashed-dotted line A3-A4 are sometimes referred to as a channel length direction of the transistor 1400d and a channel width direction of the transistor 1400d, respectively.

The transistor 1400d, which has the structure shown in FIGS. 28A to 28C, can have an increased on-state current.

<Structure Example 5 of Transistor>

In the transistor 1400c shown in FIGS. 27A to 27C, a plurality of regions (hereinafter referred to as fins) consisting of the metal oxides 1431 and 1432 may be provided in the A3-A4 direction. An example of such a structure is shown in FIGS. 29A to 29C.

Figure 29A:
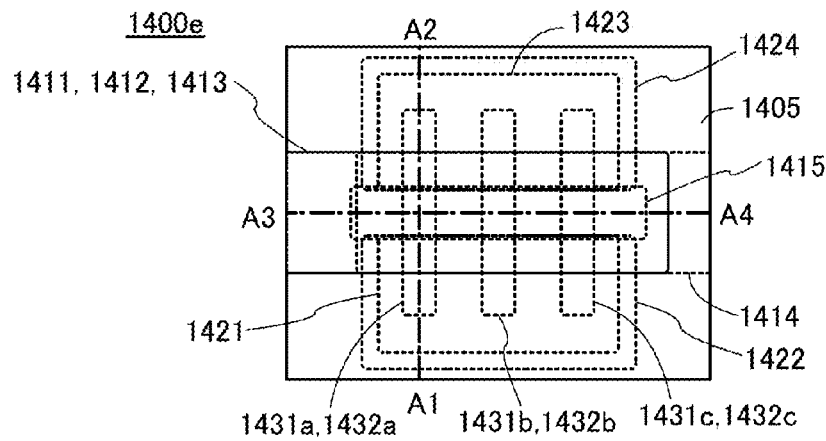
FIG. 29A is a top view and FIGS. 29B and 29C are cross-sectional views illustrating a structure example of a transistor.
Figure 29B:
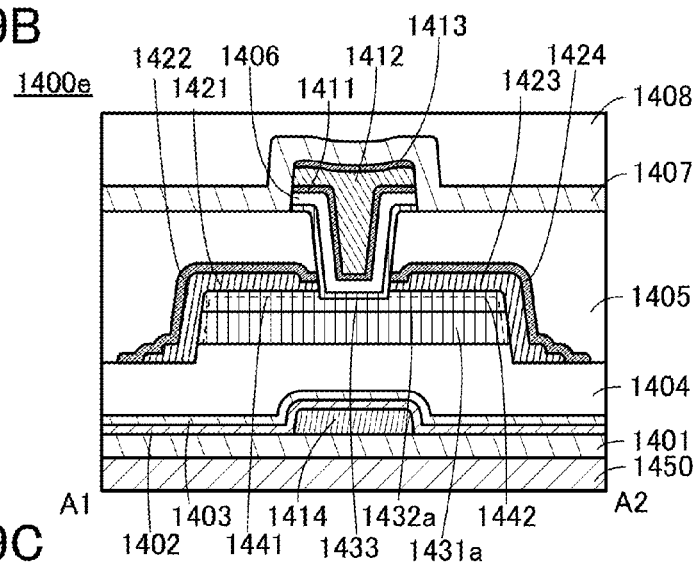
Figure 29C:
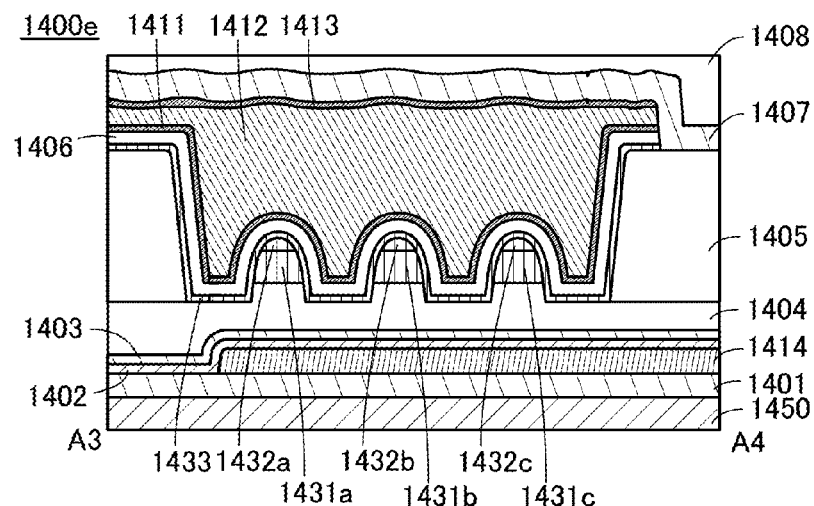

FIGS. 29A to 29C are a top view and cross-sectional views of a transistor 1400e. FIG. 29A is a top view. FIG. 29B is a cross-sectional view taken along dashed-dotted line A1-A2 in FIG. 29A and FIG. 29C is a cross-sectional view taken along dashed-dotted line A3-A4 in FIG. 29A. Note that for simplification of the drawing, some components are not illustrated in the top view in FIG. 29A. Note that the dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, a gate electric field can be applied to the entire channel, so that a transistor with a high on-state current can be obtained.

<Structure Example 6 of Transistor>

FIGS. 30A to 30D are a top view and cross-sectional views of a transistor 1400f. FIG. 30A is a top view of the transistor 1400f. FIG. 30B is a cross-sectional view taken along dashed-dotted line A1-A2 in FIG. 30A and FIG. 30C is a cross-sectional view taken along dashed-dotted line A3-A4 in FIG. 30A. Note that the dashed-dotted line A1-A2 and the dashed-dotted line A3-A4 are sometimes referred to as a channel length direction and a channel width direction, respectively. The transistor 1400f has the s-channel structure like the transistor 1400a and the like. In the transistor 1400f, an insulating film 1409 is provided in contact with the side surface of the conductive film 1412 used as a gate electrode. The insulating film 1409 and the conductive film 1412 are covered with the insulating film 1407 and the insulating film 1408. The insulating film 1409 serves as a sidewall insulating film of the transistor 1400f. As in the transistor 1400a, the gate electrode may be a stack of the conductive films 1411 to 1413.

The insulating film 1406 and the conductive film 1412 overlap with the conductive film 1414 and the metal oxide 1432 at least partly. The side edge of the conductive film 1412 in the channel length direction is preferably approximately aligned with the side edge of the insulating film 1406 in the channel length direction. Here, the insulating film 1406 serves as a gate insulating film of the transistor 1400f, and the conductive film 1412 serves as a gate electrode of the transistor 1400f.

The metal oxide 1432 has a region that overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is positioned outward from the outer edges of the metal oxides 1431 and 1432. However, the shape of the transistor in this embodiment is not limited to that where the outer edge of the metal oxide 1433 is positioned outward from the outer edge of the metal oxide 1431. For example, the outer edge of the metal oxide 1431 may be positioned outward from the outer edge of the metal oxide 1433, or the side edge of the metal oxide 1431 may be approximately aligned with the side edge of the metal oxide 1433.

FIG. 30D is an enlarged view of part of FIG. 30B. As shown in FIG. 30D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Note that the dopant may be rephrased as a donor, an acceptor, an impurity, or an element.

As shown in FIG. 30D, in the metal oxide 1430, the region 1461a substantially overlaps with the conductive film 1412, and the regions 1461b to 1461e are the regions other than the region 1461a. In the regions 1461b and 1461c, the top surface of the metal oxide 1433 is in contact with the insulating film 1407. In the regions 1461d and 1461e, the top surface of the metal oxide 1433 is in contact with the insulating film 1409 or 1406. That is, as shown in FIG. 30D, the border between the regions 1461b and 1461d overlaps with the border between the side edges of the insulating films 1407 and 1409. The same applies to the border between the regions 1461c and 1461e. Here, part of the regions 1461d and 1461e preferably overlaps with part of a region (a channel formation region) where the metal oxide 1432 and the conductive film 1412 overlap with each other. For example, preferably, the side edges of the regions 1461d and 1461e in the channel length direction are positioned inward from the side edge of the conductive film 1412 by a distance d. In that case, the thickness $t_{406}$ of the insulating film 1406 and the distance d preferably satisfy $0.25 t_{406} < d < t_{406}$.

In the above manner, the regions 1461d and 1461e are formed in part of the region where the metal oxide 1430 and the conductive film 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400f can be increased. Furthermore, since the side edges of the regions 1461d and 1461e in the channel length direction are formed so as to satisfy the above range, the regions 1461d and 1461e can be prevented from spreading inward too much in the channel formation region and thus the transistor 1400f can be prevented from being constantly in an on state.

The regions 1461b to 1461e are formed by ion doping treatment such as an ion implantation method. Therefore, as shown in FIG. 30D, the boundary between the regions 1461d and 1461a sometimes gets closer to the boundary between the regions 1461d and 1461b with the depth in the direction from the top surface of the metal oxide 1433 to the bottom surface of the metal oxide 1431. The distance d in that case is the distance between the boundary between the regions 1461d and 1461a which is closest to the inner part of the conductive film 1412 in the direction of the dashed-dotted line A1-A2 and the side edge of the conductive film 1412 at A1 side in the direction of the dashed-dotted line A1-A2. Also, the boundary between the regions 1461e and 1461a sometimes gets closer to the boundary between the regions 1461e and 1461c with the depth in the direction from the top surface of the metal oxide 1433 to the bottom surface of the metal oxide 1431. The distance d in that case is the distance between the boundary between the regions 1461e and 1461a which is closest to the inner part of the conductive film 1412 in the direction of the dashed-dotted line A1-A2 and the side edge of the conductive film 1412 at A2 side in the direction of the dashed-dotted line A1-A2.

In some cases, for example, the regions 1461d and 1461e in the metal oxide 1431 do not overlap with the conductive film 1412. In that case, at least part of the regions 1461d and 1461e in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of elements included in the insulating film 1407. Preferably, part of the low-resistance regions 1451 and 1452 is substantially in contact with or overlaps partly with the region (the channel formation region) where the metal oxide 1432 and the conductive film 1412 overlap with each other.

Since a large part of the metal oxide 1433 is in contact with the insulating film 1407, the low-resistance regions 1451 and 1452 are likely to be formed in the metal oxide 1433. The low-resistance regions 1451 and 1452 in the metal oxide 1433 contain a higher concentration of elements included in the insulating film 1407 than the other regions of the metal oxide 1433 (e.g., the region of the metal oxide 1433 that overlaps with the conductive film 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b and 1461c other than the low-resistance regions 1451 and 1452, and the lowest in the region 1461a. The added elements refer to a dopant for forming the regions 1461b and 1461c and an element added from the insulating film 1407 to the low-resistance regions 1451 and 1452.

Although the low-resistance regions 1451 and 1452 are formed in the transistor 1400f, the semiconductor device shown in this embodiment is not limited to this structure. For example, the low-resistance regions 1451 and 1452 need not be formed in the case where the regions 1461b and 1461c have a sufficiently low resistance.

<Structure Example 7 of Transistor>

Figure 31A:
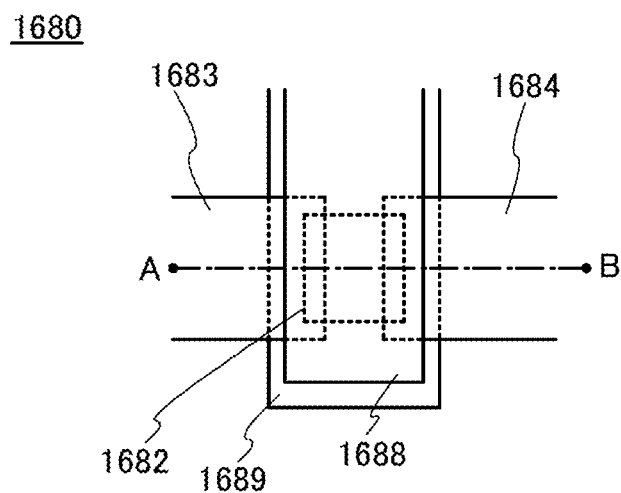
FIG. 31A is a top view and FIG. 31B is a cross-sectional view illustrating a structure example of a transistor.
Figure 31B:
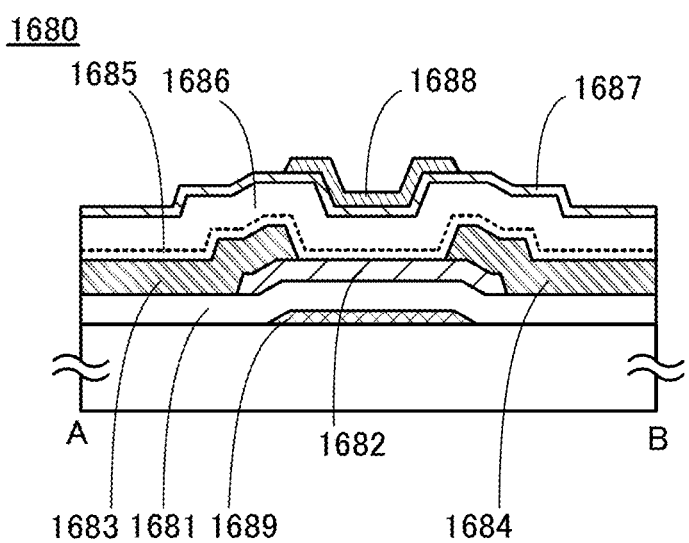

FIGS. 31A and 31B are a top view and a cross-sectional view of a transistor 1680. FIG. 31A is a top view, and FIG. 31B is a cross-sectional view taken along dashed-dotted line A-B in FIG. 31A. Note that for simplification of the drawing, some components are increased or reduced in size, or omitted in FIGS. 31A and 31B. Note that the dashed-dotted line A-B is sometimes referred to as a channel length direction.

The transistor 1680 shown in FIG. 31B includes a conductive film 1689 serving as a first gate, a conductive film 1688 serving as a second gate, a semiconductor 1682, a conductive film 1683 and a conductive film 1684 serving as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 provided therebetween. The conductive film 1688 overlaps with the semiconductor 1682 with the insulating films 685, 1686, and 1687 provided therebetween. The conductive films 1683 and 1684 are connected to the semiconductor 1682.

The description of the conductive films 1411 to 1414 in FIGS. 23A to 23C can be referred to for the details of the conductive films 1689 and 1688.

The conductive films 1689 and 1688 may be supplied with different potentials, or may be supplied with the same potential at the same time. The conductive film 1688 serving as a second gate electrode in the transistor 1680 leads to stabilization of threshold voltage. Note that the conductive film 1688 may be omitted in some cases.

The description of the metal oxide 1432 in FIGS. 23A to 23C can be referred to for the details of the semiconductor 1682. The semiconductor 1682 may be a single layer or a stack including a plurality of semiconductor layers.

The description of the conductive films 1421 to 1424 in FIGS. 23A to 23C can be referred to for the details of the conductive films 1683 and 1684.

The description of the insulating film 1406 in FIGS. 23A to 23C can be referred to for the details of the insulating film 1681.

The insulating films 1685 to 1687 are sequentially stacked over the semiconductor 1682 and the conductive films 1683 and 1684 in FIG. 31B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the semiconductor 1682 is damaged at the time of formation of the insulating film 1686 when the insulating film 1686 is directly formed on the semiconductor 1682, the insulating film 1685 is preferably provided between the semiconductor 1682 and the insulating film 1686, as shown in FIG. 31B. The insulating film 1685 preferably allows oxygen to pass therethrough, and causes little damage to the semiconductor 1682 when the insulating film 1685 is formed compared with the case of the insulating film 1686. If the insulating film 1686 can be formed directly on the semiconductor 1682 while damage to the semiconductor 1682 is reduced, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has an effect of blocking diffusion of oxygen, hydrogen, and water. Alternatively, the insulating film 1687 preferably has an effect of blocking diffusion of hydrogen and water.

As an insulating film has higher density and becomes denser or has a fewer dangling bonds and becomes more chemically stable, the insulating film has a more excellent blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 1687 has an effect of blocking diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulating film 1687 having the blocking effect can prevent a shift in the threshold voltage of the transistor 1680 due to generation of donors.

In addition, in the case where an oxide semiconductor is used as the semiconductor 1682, the insulating film 1687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

This embodiment can be combined with any of the other embodiments in this specification as appropriate.

(Embodiment 6)

Described in this embodiment are structures of an oxide semiconductor film capable of being used for the OS transistors described in the above embodiments.

<Structure Of Oxide Semiconductor>

An oxide semiconductor is classified into a single crystal oxide semiconductor and a non-single-crystal oxide semiconductor. Examples of a non-single-crystal oxide semiconductor include a c-axis aligned and a-b-plane anchored crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 32A:
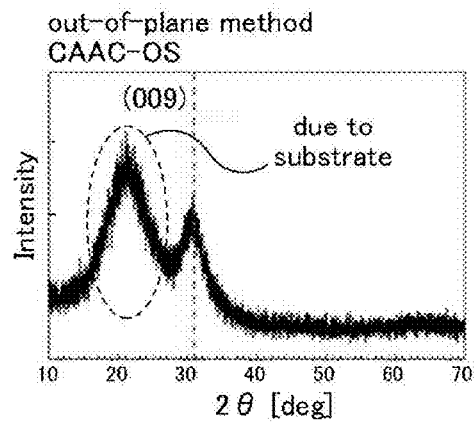
FIGS. 32A to 32E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3 m is analyzed by an out-of-plane method, a peak appears at a diffraction angle (2θ) of around 31° as shown in FIG. 32A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3 m; thus, this peak is preferably not exhibited in a CAAC-OS.

Figure 32B:
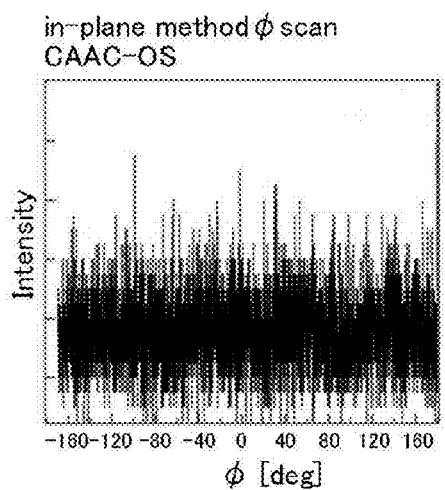
Figure 32C:
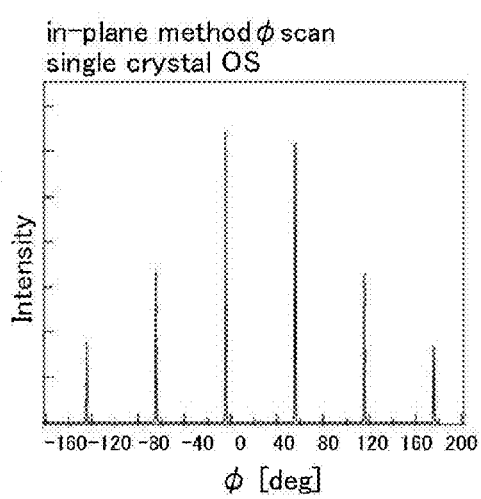

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the $InGaZnO_4$ crystal. When analysis (φ scan) is performed with 2θ fixed at around 56° and with the sample rotated using a normal vector to the sample surface as an axis (φ axis), as shown in FIG. 32B, a peak is not clearly observed. In contrast, in the case where single crystal $InGaZnO_4$ is subjected to φ scan with 2θ fixed at around 56°, as shown in FIG. 32C, six peaks which are derived from crystal planes equivalent to the (110) plane are observed. Accordingly, the structural analysis using XRD shows that the directions of a-axes and b-axes are irregularly oriented in the CAAC-OS.

Figure 32D:
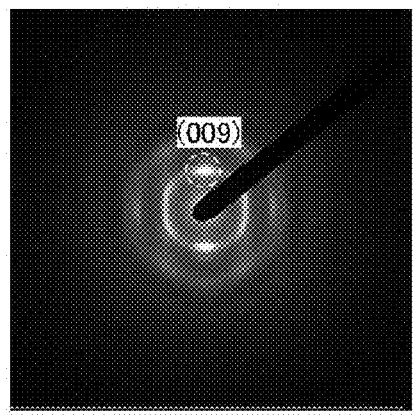
Figure 32E:
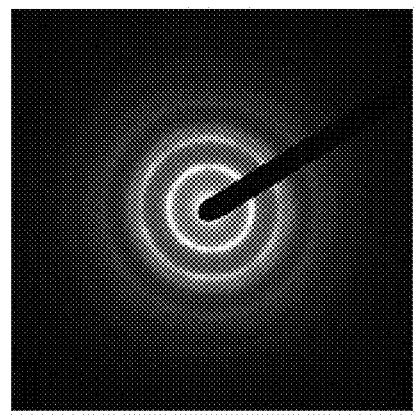

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 32D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 32E shows a diffraction pattern obtained in such a manner that an electron beam with a probe diameter of 300 nm is incident on the same sample in a direction perpendicular to the sample surface. As shown in FIG. 32E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 32E is considered to be derived from the (010) plane, the (100) plane, and the like of the $InGaZnO_4$ crystal. The second ring in FIG. 32E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 33A:
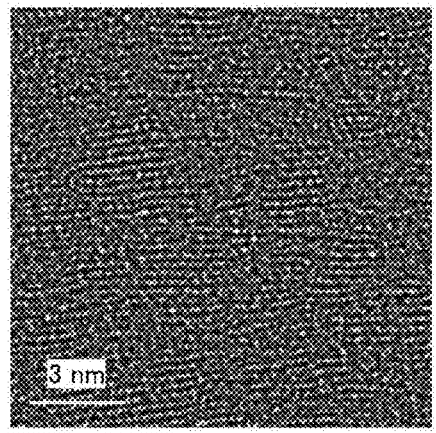
FIGS. 33A to 33E show a cross-sectional TEM image and plan-view TEM images of a CAAC-OS and images obtained through analysis thereof.

FIG. 33A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 33A shows pellets in which metal atoms are arranged in a layered manner. FIG. 33A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 33B:
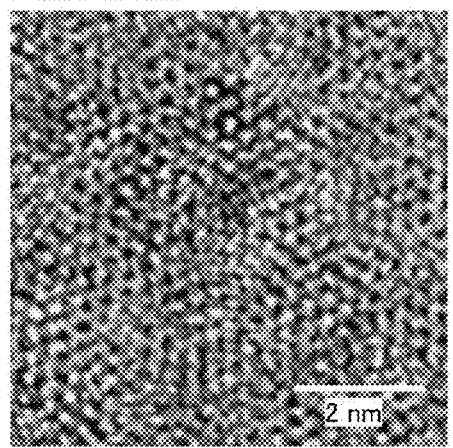
Figure 33C:
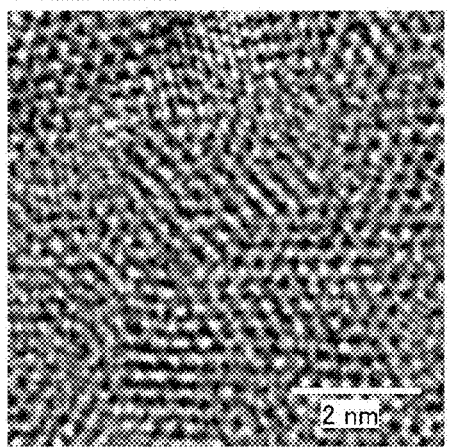
Figure 33D:
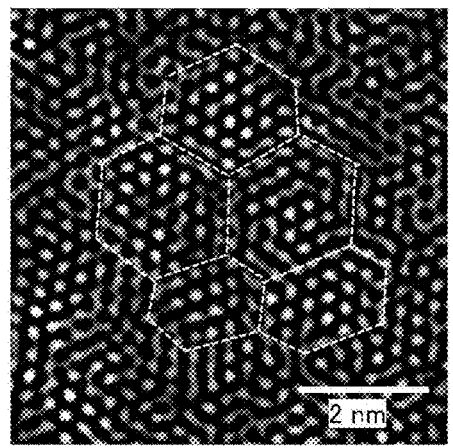
Figure 33E:
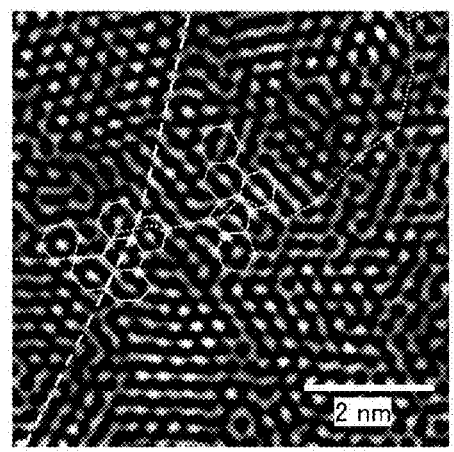

FIGS. 33B and 33C show Cs-corrected high-resolution TEM images of a plane of the CAAC-OS observed from a direction substantially perpendicular to the sample surface. FIGS. 33D and 33E are images obtained through image processing of FIGS. 33B and 33C. The method of image processing is as follows. The image in FIG. 33B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 33D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 33E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC- OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 34A:
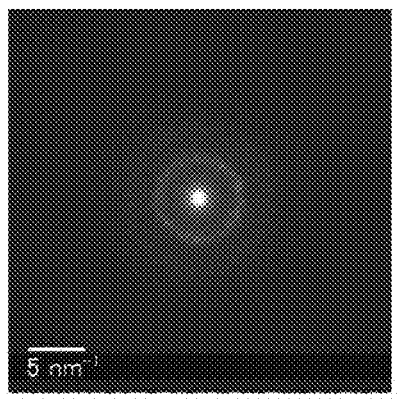
FIGS. 34A to 34D show electron diffraction patterns and a cross-sectional TEM image of an nc-OS.
Figure 34B:
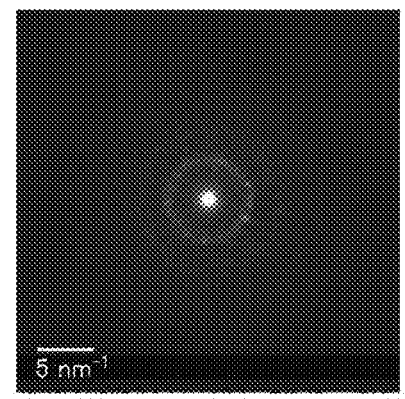

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 34A is observed. FIG. 34B shows a diffraction pattern (a nanobeam electron diffraction pattern) obtained when an electron beam with a probe diameter of 1 nm is incident on the same sample. As shown in FIG. 34B, a plurality of spots are observed in a ring-like region. In other words, ordering in an nc-OS is not observed with an electron beam with a probe diameter of 50 nm but is observed with an electron beam with a probe diameter of 1 nm.

Figure 34C:
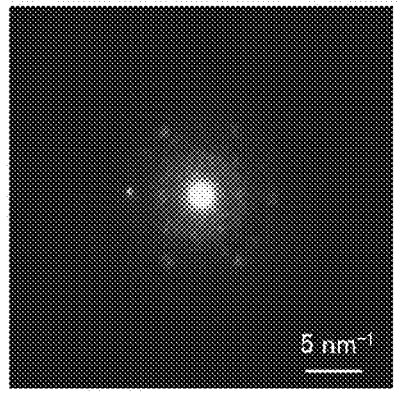

Furthermore, an electron diffraction pattern in which spots are arranged in an approximately hexagonal shape is observed in some cases as shown in FIG. 34C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 34D:
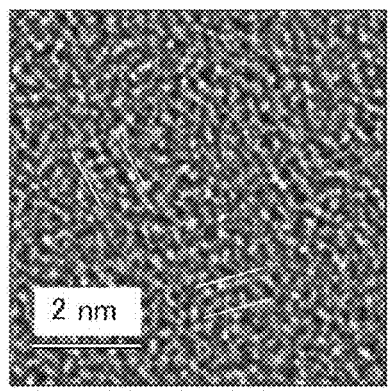

FIG. 34D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 34D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS has a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 35A:
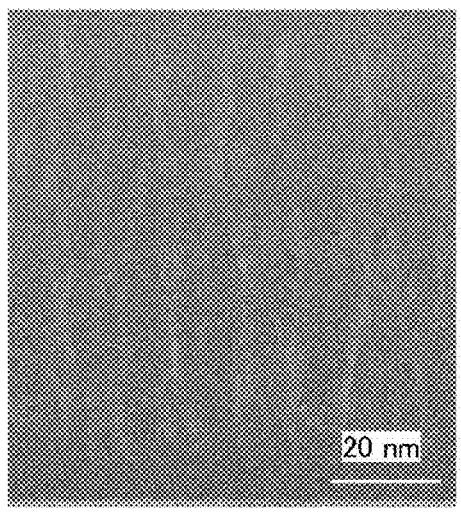
FIGS. 35A and 35B show cross-sectional TEM images of an a-like OS.
Figure 35B:
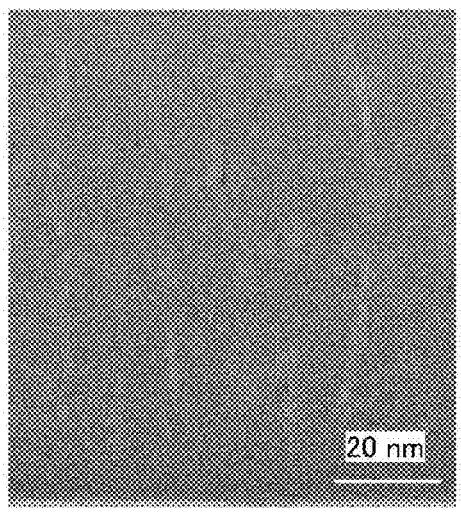

FIGS. 35A and 35B are high-resolution cross-sectional TEM images of an a-like OS. FIG. 35A is the high-resolution cross-sectional TEM image of the a-like OS at the start of the electron irradiation. FIG. 35B is the high-resolution cross-sectional TEM image of the a-like OS after the electron ($e^-$) irradiation at $4.3 \times 10^8$ $e^-/nm^2$. FIGS. 35A and 35B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 36:
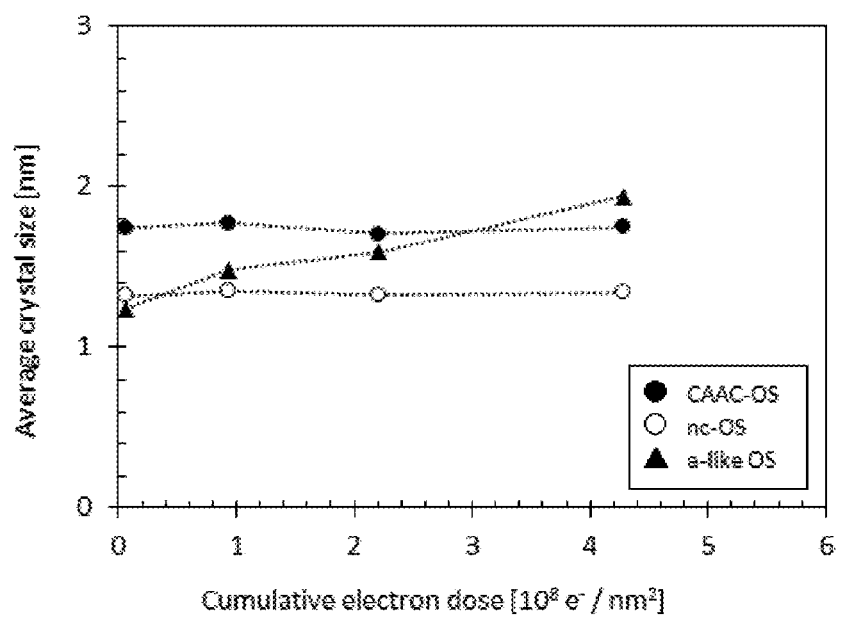
FIG. 36 shows a change of crystal parts of an In—Ga—Zn oxide owing to electron irradiation.

FIG. 36 shows change in the average size of crystal parts (at 22 points to 30 points) in each sample. Note that the crystal part size corresponds to the length of a lattice fringe. FIG. 36 indicates that the crystal part size in the a-like OS increases with an increase in the cumulative electron dose in obtaining TEM images, for example. As shown in FIG. 36, a crystal part of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e/nm$^2$. As shown in FIG. 36, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2 \cdot$s); and the diameter of the irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density lower than 78% of the density of the single crystal oxide semiconductor.

For example, in the case of an oxide semiconductor having an atomic ratio of In: Ga: Zn=1:1:1, the density of single crystal InGaZnO$_4$ with a rhombohedral crystal structure is 6.357 g/cm$^3$. Accordingly, in the case of the oxide semiconductor having an atomic ratio of In: Ga: Zn=1:1:1, the density of the a-like OS is higher than or equal to 5.0 g/cm$^3$ and lower than 5.9 g/cm$^3$. For example, in the case of the oxide semiconductor having an atomic ratio of In: Ga: Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

The carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^{-3}$, and further preferably lower than $1 \times 10^{10}$ cm$^{-3}$ and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the Id-Vg characteristics of the transistor can be regarded as substantially intrinsic. Further, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

This embodiment can be combined with any of the other embodiments in this specification as appropriate.

(Notes on the Description in this Specification and the Like)

The following are notes on the structures in the above embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

<Notes on Ordinal Numbers>

In this specification and the like, ordinal numbers such as "first," "second," and "third" are used in order to avoid confusion among components. Thus, the terms do not limit the number or order of components. In the present specification and the like, a "first" component in one embodiment can be referred to as a "second" component in other embodiments or claims. Alternatively, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the invention described above, the same portions or portions having similar functions are denoted by the same reference numerals in different drawings, and the description of such portions is not repeated.

In this specification and the like, the terms for explaining arrangement, such as "over" and "under," are used for convenience to describe the positional relation between components with reference to drawings. The positional relation between components is changed as appropriate in accordance with a direction in which each component is described. Therefore, the terms for explaining arrangement are not limited to those used in this specification and may be changed to other terms as appropriate depending on the situation.

The term "over" or "under" does not necessarily mean that a component is "directly over and in contact with" or "directly under and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent of each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on situations.

In drawings, the size, the layer thickness, or the region is determined arbitrarily for description convenience. Therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components are not illustrated for clarity of the drawings in some cases.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, voltage and potential can be replaced with each other. The voltage refers to a potential difference from a reference potential. When the reference potential is a ground potential, for example, a voltage can be replaced with a potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer." For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring," "signal line," and "power source line" can be interchanged with each other depending on the case or circumstances. For example, the term "wiring" can be changed into the term such as "signal line" or "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases.

<Notes On Definitions Of Terms>

The following are definitions of the terms mentioned in the above embodiments.

<<Semiconductor>>

In this specification, a "semiconductor" has characteristics of an "insulator" in some cases when the conductivity is sufficiently low, for example. Furthermore, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" has characteristics of a "conductor" in some cases when the conductivity is sufficiently high, for example. Furthermore, it is difficult to strictly distinguish a "semiconductor" and a "conductor" from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. In the case of an oxide semiconductor, oxygen vacancy may be formed by entry of impurities such as hydrogen. Further, in the case where the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, the functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is conducting (on state) or not conducting (off state) to determine whether current flows therethrough or not. Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of the mechanical switch is a switch formed using micro electro mechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the electric field mobility, a current value per channel width, and the like of a transistor are obtained by calculation, a surrounded channel width may be used for the calculation. In that case, a value different from the one obtained by calculation using an effective channel width is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial no. 2015-106784 filed with Japan Patent Office on May 26, 2015, the entire contents of which are hereby incorporated by reference.

What is claimed is:

1. A memory device comprising:
a circuit; and
a wiring,
wherein the circuit comprises a first memory cell and a second memory cell,
wherein the first memory cell comprises a first transistor, a second transistor, and a first capacitor,
wherein one of a source and a drain of the first transistor is electrically connected to a gate of the second transistor and the first capacitor,
wherein a gate insulating layer of the first transistor and a gate insulating layer of the second transistor comprise a first insulating layer,
wherein the second memory cell comprises a third transistor, a fourth transistor, and a second capacitor,
wherein one of a source and a drain of the third transistor is electrically connected to a gate of the fourth transistor and the second capacitor,
wherein the second memory cell is stacked over the first memory cell, and
wherein a gate of the first transistor and a gate of the third transistor comprise a first conductive layer on the first insulating layer, the first conductive layer electrically connected to the wiring.

2. The memory device according to claim 1,
wherein the first transistor further includes a first semiconductor layer in a channel formation region under the first insulating layer,
wherein a gate insulating layer of the third transistor and a gate insulating layer of the fourth transistor comprise a second insulating layer over the first conductive layer, and
wherein the third transistor further includes a second semiconductor layer in a channel formation region over the second insulating layer.

3. The memory device according to claim 1, further comprising a plurality of the circuits, wherein the circuits are stacked.

4. The memory device according to claim 1, wherein a memory capacity is one terabyte or more.

5. An electronic device comprising:
the memory device according to claim 1; and
a host device,
wherein the host device and the memory device are electrically connected to each other.

6. The memory device according to claim 1, wherein the gate of the second transistor is provided under the first insulating layer.

7. The memory device according to claim 2, wherein the second insulating layer is provided under the gate of the fourth transistor and over the gate of the third transistor.

8. A memory device comprising:
a circuit; and
a wiring,
wherein the circuit comprises a first memory cell and a second memory cell,
wherein the first memory cell comprises a first transistor, a second transistor, and a first capacitor,
wherein one of a source and a drain of the first transistor is electrically connected to a gate of the second transistor and the first capacitor,
wherein a gate insulating layer of the first transistor and a gate insulating layer of the second transistor comprise a first insulating layer,
wherein the second memory cell comprises a third transistor, a fourth transistor, and a second capacitor,
wherein one of a source and a drain of the third transistor is electrically connected to a gate of the fourth transistor and the second capacitor,
wherein the second memory cell is stacked over the first memory cell,
wherein a gate of the first transistor and a gate of the third transistor comprise a first conductive layer on the first insulating layer, the first conductive layer electrically connected to the wiring, and
wherein the first transistor, the second transistor, the third transistor, and the fourth transistor each comprise an oxide semiconductor in a channel formation region.

9. The memory device according to claim 8, further comprising:
a row driver; and
a column driver,
wherein the circuit is stacked over the row driver and the column driver, and
wherein the row driver and the column driver each comprise a transistor comprising a material other than the oxide semiconductor in a channel formation region.

10. The memory device according to claim 3, further comprising:
wherein the channel formation region of the first transistor is provided under the first insulating layer,
wherein a gate insulating layer of the third transistor and a gate insulating layer of the fourth transistor comprise a second insulating layer over the first conductive layer, and
wherein the channel formation region of the third transistor is provided over the second insulating layer.

11. The memory device according to claim 8, further comprising a plurality of the circuits, wherein the circuits are stacked.

12. The memory device according to claim 8, wherein a memory capacity is one terabyte or more.

13. An electronic device comprising:
the memory device according to claim 8; and
a host device,
wherein the host device and the memory device are electrically connected to each other.

14. The memory device according to claim 8, wherein the gate of the second transistor is provided under the first insulating layer.

15. The memory device according to claim 10, wherein the second insulating layer is provided under the gate of the fourth transistor and over the gate of the third transistor.

* * * * *